(12) United States Patent
Sugi et al.

(10) Patent No.: US 7,034,377 B2
(45) Date of Patent: Apr. 25, 2006

(54) SEMICONDUCTOR DEVICE AND METHOD OF MANUFACTURING THE DEVICE

(75) Inventors: Akio Sugi, Nagano (JP); Naoto Fujishima, Nagano (JP); Mutsumi Kitamura, Nagano (JP); Katsuya Tabuchi, Kanagawa (JP)

(73) Assignee: Fuji Electric Device Technology Co., Ltd., (JP)

( * ) Notice: Subject to any disclaimer, the term of this patent is extended or adjusted under 35 U.S.C. 154(b) by 80 days.

(21) Appl. No.: 10/720,738

(22) Filed: Nov. 24, 2003

(65) Prior Publication Data

US 2004/0178445 A1 Sep. 16, 2004

(30) Foreign Application Priority Data

Nov. 22, 2002 (JP) ............................... 2002-340186
Jun. 20, 2003 (JP) ............................... 2003-176327

(51) Int. Cl.
*H01L 29/00* (2006.01)
*H01L 29/76* (2006.01)
*H01L 31/119* (2006.01)

(52) U.S. Cl. ..................... 257/510; 257/335; 257/374; 257/E21.418; 257/E21.419; 257/E29.256

(58) Field of Classification Search ................ 257/510, 257/335, 374, E21.418, E21.419, E29.256, 257/E29.258, E29.28

See application file for complete search history.

(56) References Cited

U.S. PATENT DOCUMENTS

| | | | | |
|---|---|---|---|---|
| 5,539,238 | A | * | 7/1996 | Malhi ......................... 257/510 |
| 5,701,026 | A | * | 12/1997 | Fujishima et al. .......... 257/510 |
| 6,693,338 | B1 | * | 2/2004 | Saitoh et al. ............... 257/492 |
| 2002/0179967 | A1 | | 12/2002 | Fujishima ................... 257/330 |

OTHER PUBLICATIONS

"A 30V Class Extremely Low On-resistance Meshed Trench Lateral Power MOSFET"; A Sugi et al.; IEEE Sep. 2002; pp. 297-300.

* cited by examiner

*Primary Examiner*—Long Pham
*Assistant Examiner*—Shrininvas H. Rao
(74) *Attorney, Agent, or Firm*—Rossi, Kimms & McDowell, LLP

(57) ABSTRACT

To reduce the on-resistance in a semiconductor device, such as a trench lateral power MOSFET, a trench etching region forms a mesh pattern in which a first trench section, formed in an active region, and a second trench section, formed in a gate region for leading out gate polysilicon to a substrate surface, intersect each other. An island-like non-trench region, which is left without being subjected to etching, is divided into a plurality of smaller regions by one or more third trench section that connect with the first and second trench sections that form the mesh pattern. In each non-trench region, a contact section for connecting a drain region (or a source region) and an electrode is formed so as to be spread over all of the smaller regions in the non-trench region.

19 Claims, 74 Drawing Sheets

SEMICONDUCTOR DEVICE AND METHOD OF MANUFACTURING THE DEVICE

BACKGROUND

A CMOS-process-based high performance lateral power MOSFET, in particular, a trench lateral power MOSFET (hereinafter referred to as a TLPM), has been recently developed. The TLPM has reduced on-resistance and higher integration when integrated into a power IC, as compared with a conventional planer lateral power MOSFET. See for example JP-A-2002-184980 and JP-A-2002-270831.

In this regard, a Japanese patent application, JP-A-2002-353447, by the present inventors, discloses a planar layout of a TLPM on a mesh pattern for which a trench region is formed like a mesh with each of the regions that are not subjected to trench etching left as an island, i.e., trench surrounding the non-trench regions. FIG. 126 illustrates a basic pattern of the mesh-shaped trench pattern disclosed in the above identified patent application. In FIG. 126, a hatched region is a trench etching region 1 surrounding the non-trench or non-etched regions 2. Moreover, reference numerals 3 and 4 denote a drain contact and a drain electrode, respectively, and reference numerals 5 and 6 denote a source contact and a source electrode, respectively. An active region comprises the trench region Wt extending between the non-trench regions 2 with the source electrode 6 formed therein. A gate insulator film and gate polysilicon are formed in the trench region, and source polysilicon and the like are further formed, in the active region. At the bottom of the trench, a source region, a base region, a body region, etc., are formed. In the non-trench region 2, a drain region, an expanded drain region, etc., are formed.

Incidentally, it is generally desirable for a MOSFET to have a lower on-resistance per unit area. An important parameter for determining the on-resistance per unit area is called a channel width per unit area (hereinafter referred to as a channel density). With the channel width taken as Wch and an element area expressed as A, the value of the channel density P is given by the following Equation (1). For a high integration of a transistor to enhance a driving capability of a current per unit area, it is better to have a larger channel density P:

$$P=Wch/A. \qquad (1)$$

For convenience of explanation, in FIG. 126, the non-trench region 2 is designated as a rectangle STUV, where, a length of a side extending parallel to the longitudinal direction of the drain electrode 4 or the source electrode 6 of the rectangle STUV (hereinafter referred to as the longitudinal direction), and a length of a side extending perpendicular to the longitudinal direction (hereinafter referred to as the lateral direction) are designated as St and Lt, respectively. Moreover, the distance between a pair of adjacent non-trench regions 2 in the longitudinal direction is designated as Wg, and the distance between the non-trench regions 2 adjacent to each other in the lateral direction is designated as Wt.

Furthermore, a rectangle, formed by two adjacent center lines EF and HG of trenches extending longitudinally and two adjacent center lines EH and FG of trenches extending laterally intersecting with each other, is designated as EFGH. The area A of the rectangle EFGH is expressed by the following Equation (2):

$$A = (Wt/2 + Lt + Wt/2) \times (Wg/2 + St + Wg/2) \qquad (2)$$
$$= (Wt + Lt) \times (Wg + St).$$

In the mash pattern shown in FIG. 126, a channel is formed around the non-trench region 2. Therefore, the channel width Wch in each rectangle EFGH is expressed by the following Equation (3):

$$Wch=2(Lt+St) \qquad (3)$$

Thus, from the previous Equation (1), the above Equation (2) and the Equation (3), the channel density P is given by the following Equation (4):

$$P = 2(Lt+St)/A \qquad (4)$$
$$= 2(Lt+St)/\{(Wt+Lt)\times(Wg+St)\}.$$

The above-explained mesh-shaped trench pattern provides the value of the channel density P becoming larger than that provided by a conventional stripe-like trench pattern. Namely, in a stripe pattern shown in FIG. 127, no trench is formed in the lateral direction. Nevertheless, by setting a rectangle EFGH in the same way as that in FIG. 126, the channel width Wch in each rectangle EFGH can be expressed by the following Equation (5).

$$Wch=2(Wg+St) \qquad (5)$$

Hence, the channel density P is given by the following Equation (6):

$$P = 2(Wg+St)/\{(Wt+Lt)\times(Wg+St)\} \qquad (6)$$
$$= 2/(Wt+Lt).$$

Here, as is apparent from FIG. 126 and FIG. 127, the value of (Lt+St) becomes larger than the value of (Wg+St). Thus, from the comparison of the above Equation (6) and the previous Equation (4), it is understood that the mesh pattern provides a channel density P that is than that of the stripe pattern. Therefore, in the TLPM with the mesh pattern, miniaturization can increase the channel density P more than in the TLPM with the stripe pattern to make it possible to reduce on-resistance per unit area.

However, miniaturization of the TLPM with the mesh pattern necessitates minimizing the dimensions of the Lt and the St, that is, minimizing the non-trench region 2. This miniaturizes the drain contact 3 because the mesh pattern shown in FIG. 126 provides a layout in which the drain contact 3 is formed within the non-trench region 2. This increases the contact resistance, making it impossible to reduce the on-resistance as much as an amount of increase in the channel density P. Moreover, this also can cause failure in continuity due to reduced contact hole openings.

In addition, the source region is presented only at the bottom of the trench in the active region without being provided in a region (a gate region) for leading out the gate polysilicon in the trench etching region 1 onto the substrate surface. This causes current to pass around insufficiently to the trench side in the gate region. Therefore, even though the channel density P is increased by the mesh-shaped trench pattern, reduced on-resistance due to the increase in the channel density P is not sufficiently realized. These problems similarly arise in all of TLPMs each being of a type with drain polysilicon formed in the trench etching region 1 and with a drain region formed at the bottom of the trench.

Accordingly, there remains a need for a semiconductor device, such as a TLPM, in which the lowered on-resistance can be realized. The present invention addresses this need.

SUMMARY OF THE INVENTION

The present invention relates to a semiconductor device and a method of manufacturing the device, more particularly to a semiconductor device including an insulated gate power semiconductor element for which trenches formed on a semiconductor substrate.

One aspect of the present invention is a semiconductor device. This device can include a semiconductor substrate, a trench formed in the substrate, at least one non-trench region surrounded by the trench, an active region formed on the substrate over the trench for driving current as a semiconductor element, a first diffusion region formed at a bottom of the trench in the active region, and a second diffusion region formed in the non-trench region, current being flowable between the first diffusion region and the second diffusion region.

The trench can comprise a first trench section formed in the active region, and a second trench section intersecting the first trench section to form a mesh pattern surrounding the non-trench region. The first diffusion region can be formed at the bottom of the first and second trench sections. The trench can further includes at least one third trench section connected to the first and second trench sections forming the mesh pattern to divide the non-trench region into a plurality of smaller regions.

The semiconductor device can further include an electrode electrically connected to the second diffusion region, and a contact section electrically connected to the second diffusion region and the electrode. The contact section can be disposed over and contacting all of the smaller regions in the non-trench region.

Third trench section can extend parallel to the first or second trench section, or can extends diagonally to both the first and second trench sections. The third trench section can be also a combination of two or three subsections, each of which extends parallel to the first trench section, parallel to the second trench, or diagonally to both the first and second trench sections. The width of the second trench section can be narrower than the width of the first trench section.

The semiconductor device can be a trench lateral transistor composed of at least the semiconductor substrate, the first and second diffusion regions, the first diffusion region driving current as a transistor, a gate insulator film formed inside the trench, a first conductor formed inside the gate insulator film, a second conductor formed inside the first conductor in the active region with an interlayer insulator film interposed therebetween and electrically connected to the first diffusion region, a first electrode penetrating through the interlayer insulator film electrically connected to the second diffusion region, and a second electrode penetrating through the interlayer insulator film to electrically connect to the second conductor.

The second diffusion region can be a drain region and the first diffusion region can be a source region. The second diffusion region can be a source region and the first diffusion region can be a drain region. The inside of the third trench section can be filled with the first conductor with the gate insulator film interposed therebetween, and the first conductor in the third trench section and the first electrode can be insulated from each other by an interlayer insulator film. The interlayer insulator film thicker than the gate insulator film can be provided along a part of a side section of the first trench section. The thicker interlayer insulator film can be provided in each of the first and second trench sections, on each side section of the first trench section and on each side section or at a bottom of the second trench section.

Another aspect of the present invention is a method of manufacturing the semiconductor device described above. The method can include the steps of forming the first and second trench sections on the semiconductor substrate, forming the first diffusion region on each of the bottom of the first and second trench sections, filling the first trench and the second trench, and forming the second diffusion region in the non-trench region.

BRIEF DESCRIPTION OF THE DRAWINGS

FIG. 120 illustrates a cross sectional structure of the eighth TLPM applicable to the mesh-shaped trench pattern according to the invention in the course of manufacture.

FIG. 121 illustrates a cross sectional structure of the eighth TLPM applicable to the mesh-shaped trench pattern according to the invention in the course of manufacture.

FIG. 122 illustrates a cross sectional structure of the eighth TLPM applicable to the mesh-shaped trench pattern according to the invention in the course of manufacture.

FIG. 123 illustrates a cross sectional structure of the eighth TLPM applicable to the mesh-shaped trench pattern according to the invention in the course of manufacture.

FIG. 124 illustrates a cross sectional structure of the eighth TLPM applicable to the mesh-shaped trench pattern according to the invention in the course of manufacture.

FIG. 125 illustrates a cross sectional structure of the eighth TLPM applicable to the mesh-shaped trench pattern according to the invention in the course of manufacture.

FIG. 126 illustrates a planar layout of a mesh-shaped trench pattern.

FIG. 127 illustrates a planar layout of a stripe-shaped trench pattern.

DETAILED DESCRIPTION

Figure 1:
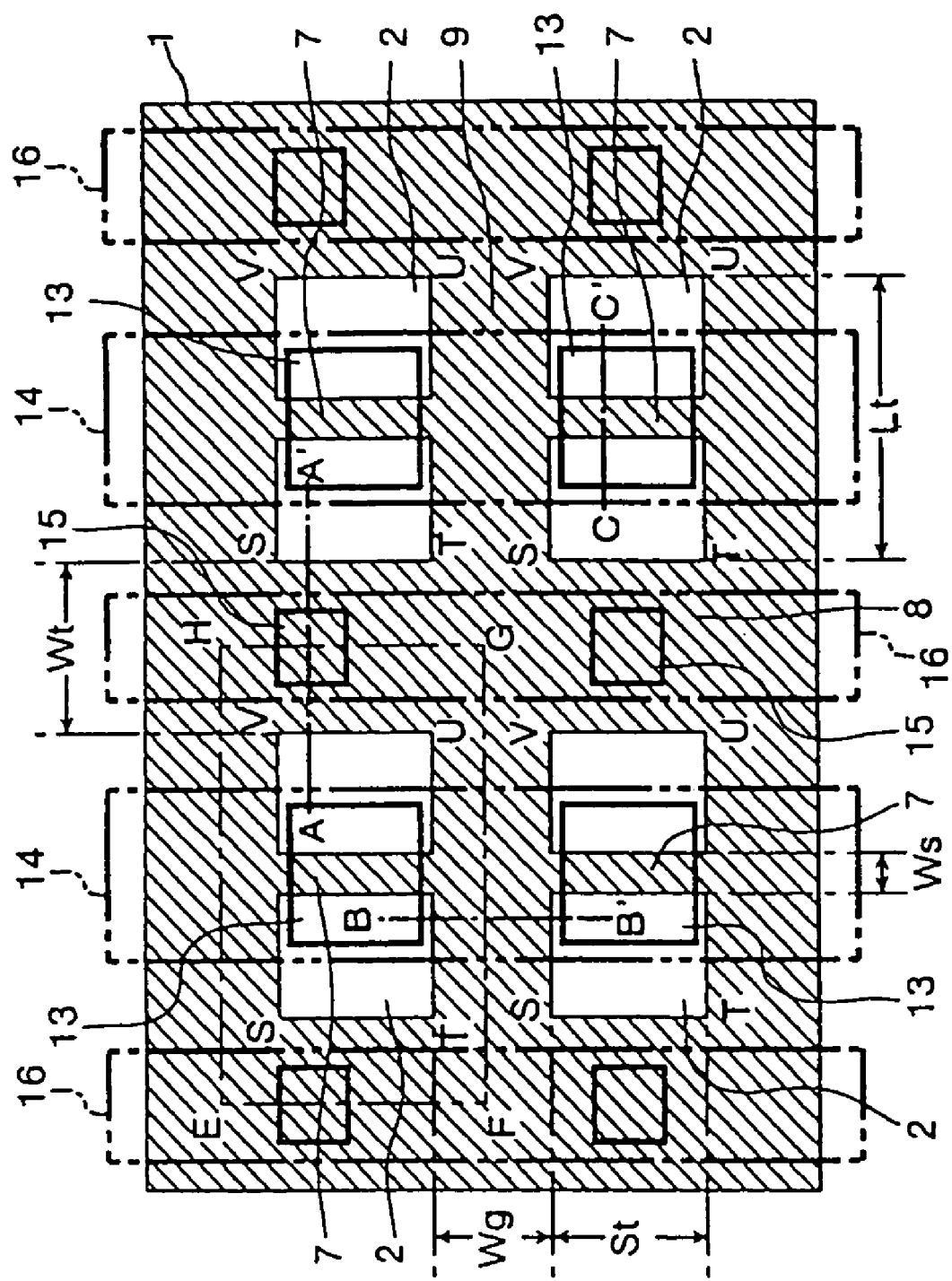
FIG. 1 illustrates a planar layout of a mesh-shaped trench pattern according to one embodiment of the present invention.

FIG. 1 illustrates a planar layout of a trench pattern of a semiconductor device according one embodiment of the present invention. As shown in FIG. 1, the basic pattern of the mesh-shaped trench pattern shown in FIG. 126, but with a third trench section or portion 7 of the trench region 1 traversing each of the non-trench regions 2 formed parallel to the longitudinal direction. A first trench section 8 is formed in an active region and communicates with a second trench section 9 formed in a gate region. Here, a region in which the second trench section 9 is provided is taken as a first gate region, and a region in which the third trench section 7 is provided is taken as a second gate region. In FIG. 1, the first trench section 8 and the second trench section 9 are portions extending in the lateral direction and in the longitudinal direction, respectively, in a cruciform or cross-shaped section at the center of the hatched trench (etched) region 1. Therefore, in this embodiment, the third trench section 7 extends in the longitudinal direction.

As shown in FIG. 1, the non-trench region 2, although its plane shape is not particularly limited, takes a rectangular, island plane shape. Moreover, the third trench section divides each non-trench region 2 into two smaller regions. Such a planar layout shape is formed by leaving a mask oxide film for the trench etching to be in a pattern corresponding to the layout shape.

In each non-trench region 2, a contact section 13, electrically connecting the non-trench region 2 and a first electrode 14 as a drain electrode (or a source electrode) provided thereon, is formed spread over the divided two smaller regions in the non-trench region 2. Moreover, a contact section 15 for a second electrode 16 as a source electrode (or a drain electrode) is formed on the first trench section 8.

Figure 126:
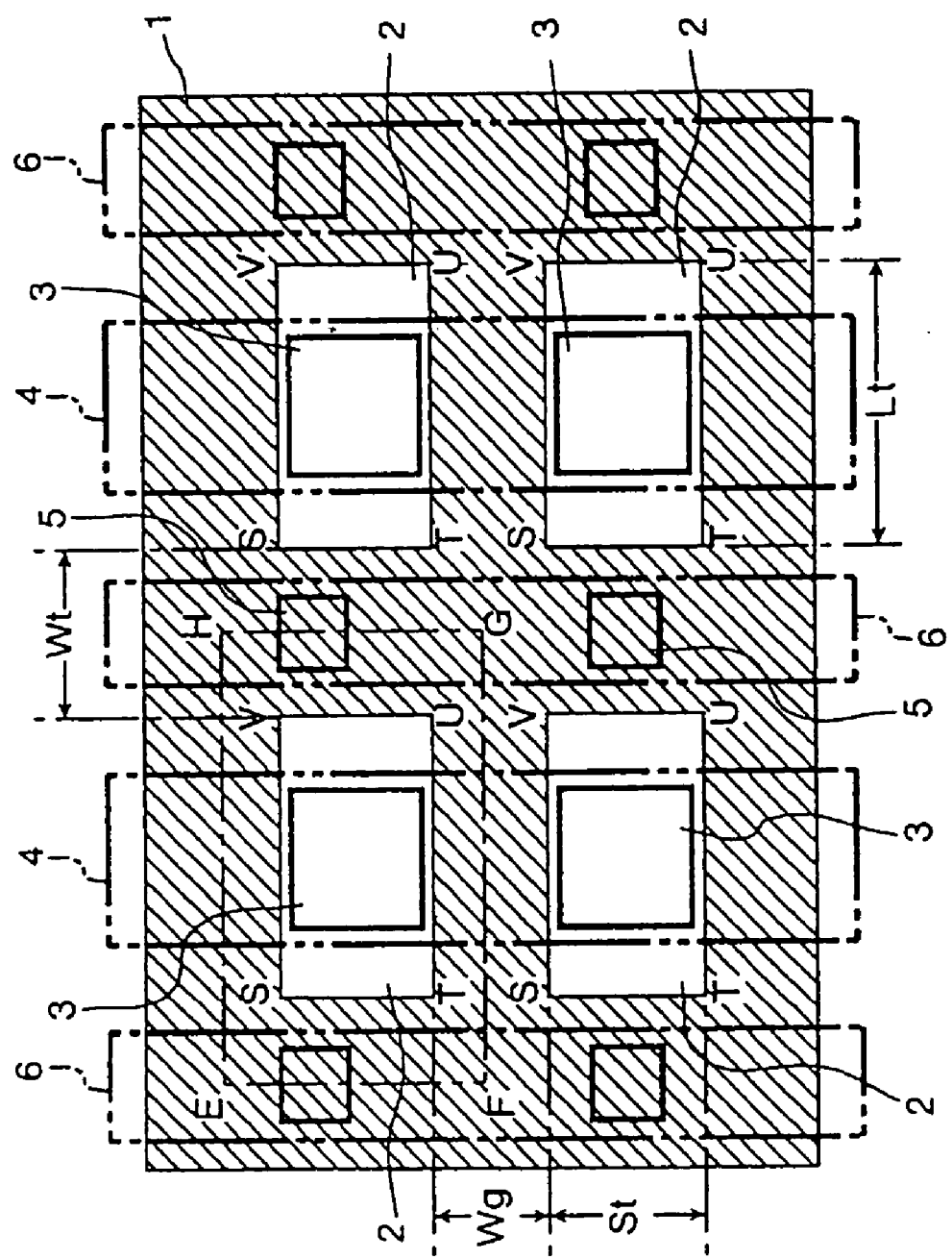
Figure 127:
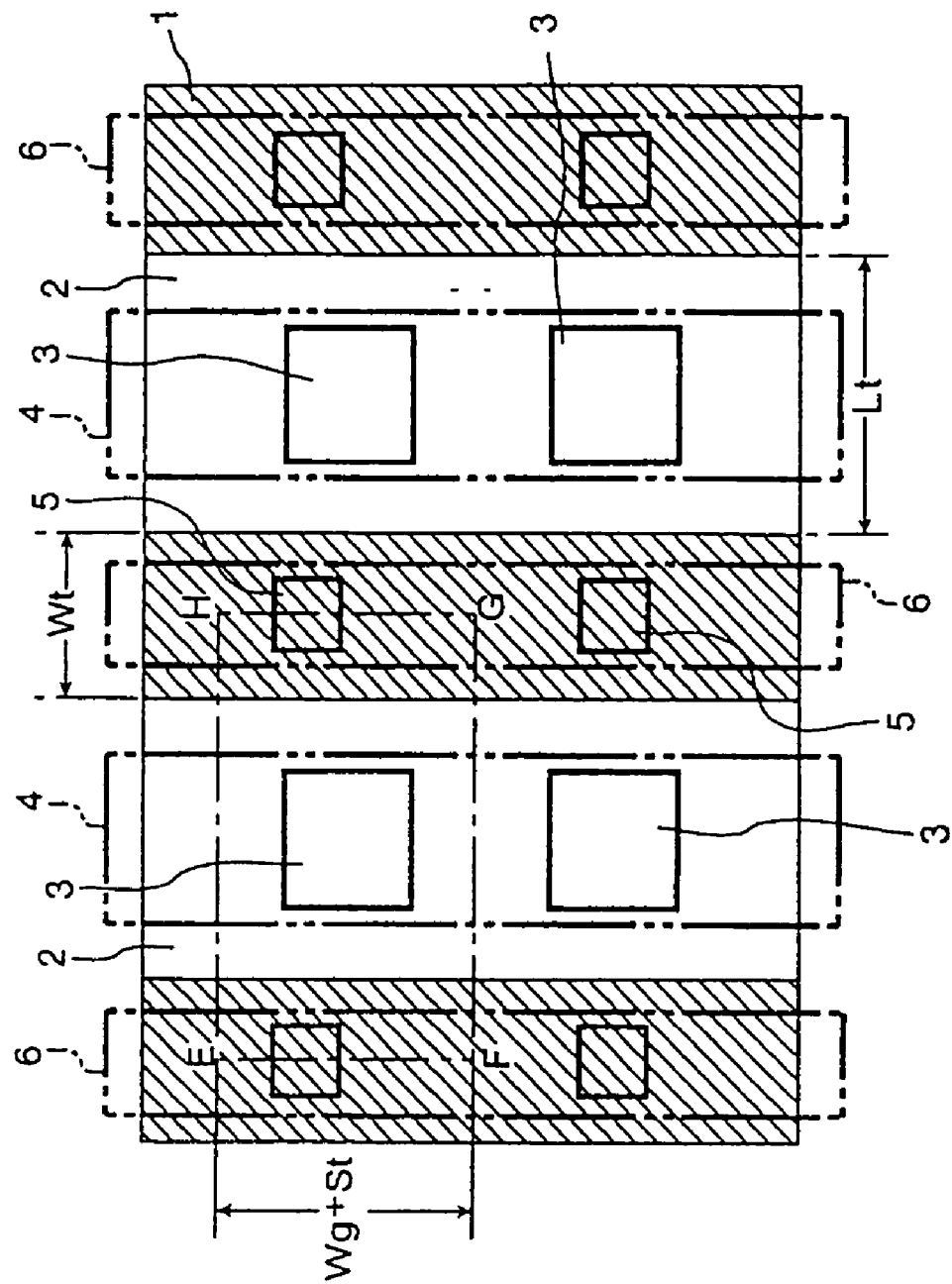

Here, like in the layout shown in FIG. 126, the non-trench region 2 is designated as a rectangle STUV with the longitudinal length and the lateral length thereof designated as St and Lt, respectively. As explained previously, the contact section 13 for the non-trench region 2 contacts the divided two smaller regions in the non-trench region 2 across the third trench section 7. Thus, the dimensions of St and Lt can be equal to those in the layout shown in FIG. 126.

Furthermore, a rectangle made up of the center lines of the trench sections surrounding the rectangle STUV is designated as EFGH, as previously explained. Moreover, the widths of the first trench section 8 and the second trench section 9 are designated as Wt and Wg, respectively, the dimensions of which are made equal to those in the layout shown in FIG. 126. Therefore, the area A of the rectangle EFGH is expressed by the Equation (2). Moreover, the width of the third trench section 7 is designated as Ws.

In the layout shown in FIG. 1, the channel width Wch in each rectangle EFGH is a sum of the parameters of portions with which the non-trench region 2 in the rectangle EFGH is in contact with the first trench section 8, the second trench section 9, and the third trench section 7. Therefore, Wch is expressed by the following Equation (7):

$$Wch = 2(Lt - Ws + 2St) \qquad (7)$$

Furthermore, from the previous Equation (1) and the Equation (7), the channel density P is given by the following Equation (8):

$$P = 2(Lt - Ws + 2St)/A \qquad (8)$$
$$= 2\{Lt + St + (St - Ws)\}/A.$$

Here, Ws is made narrower than St by miniaturization. Then, as is apparent from the comparison of the above Equation (8) and the previous Equation (4), the channel density P obtained from the above Equation (8) becomes larger than the channel density P obtained from the previous Equation (4). Namely, in the trench pattern in the embodiment of FIG. 1, the channel density P becomes larger than in the pattern shown in FIG. 126.

Moreover, a plurality of the third trench sections 7 can be provided in each rectangle STUV. In this case, the contact section 13 for the non-trench region 2 is, in each non-trench region 2, formed spread over all of smaller regions into which the non-trench region 2 is divided by a plurality of the third trench sections 7. That is, the contact section 13 is in contact with all of the divided smaller regions in each non-trench region 2.

The number of the third trench sections 7 in each rectangle STUV is designated as n (where, n represents a natural number). In this case, the channel width Wch and the channel density P in each rectangle EFGH are given by the following Equation (9) and Equation (10), respectively:

$$Wch = 2\{Lt - nWs + (n+1)St\} \qquad (9)$$

$$P = 2\{Lt - nWs + (n+1)St\}/A \qquad (10)$$
$$= 2\{Lt + St + n(St - Ws)\}/A.$$

With Ws made narrower than St by miniaturization, as is apparent from the comparison of the above Equation (10) and the previous Equation (4), the channel density P obtained from the above Equation (10) becomes larger than the channel density P obtained from the previous Equation (4). Moreover, as the number n of the third trench sections 7 in each rectangle STUV is increased, the channel density P becomes larger.

Furthermore, as shown in FIG. 1, the number of the third trench sections 7 can be equal in all of the non-trench regions 2 and, although not particularly illustrated, the number of the third trench sections 7 can be different in each non-trench region 2.

Next, explanations will be made to the cross sectional structures of TLPMs having the trench patterns according to the invention. The cross sectional structures of TLPMs shown in FIG. 12 to FIG. 23 are common to the embodiments illustrated in FIGS. 1–11.

Figure 12:
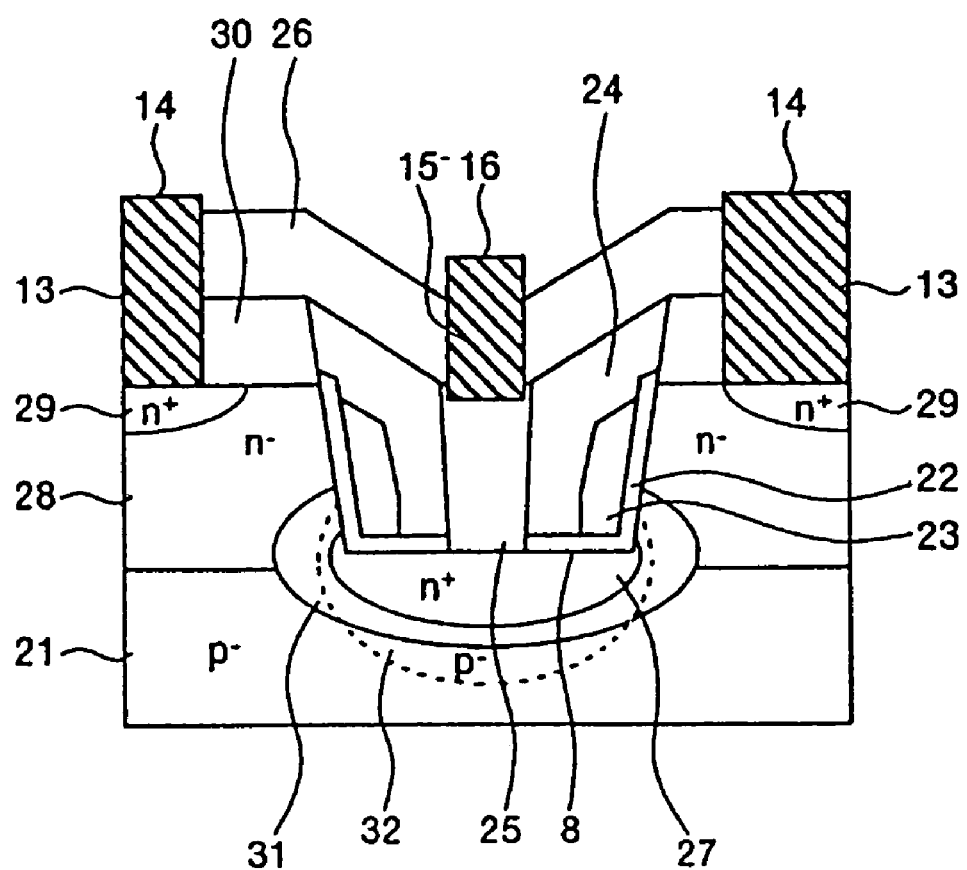
FIG. 12 illustrates a cross sectional structure in an active region of a first TLPM applicable to the mesh-shaped trench pattern according to the invention.
Figure 13:
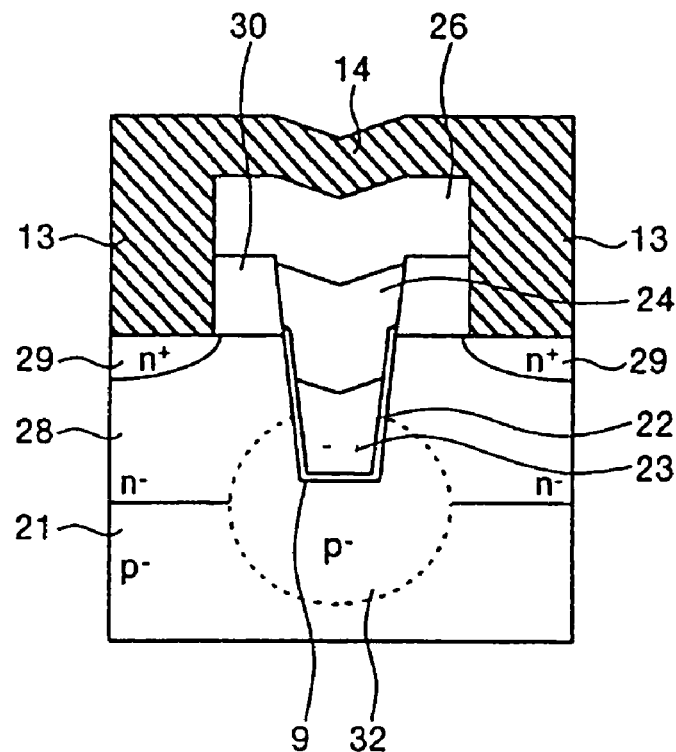
FIG. 13 illustrates a cross sectional structure in a first gate region of the first TLPM applicable to the mesh-shaped trench pattern according to the invention.
Figure 14:
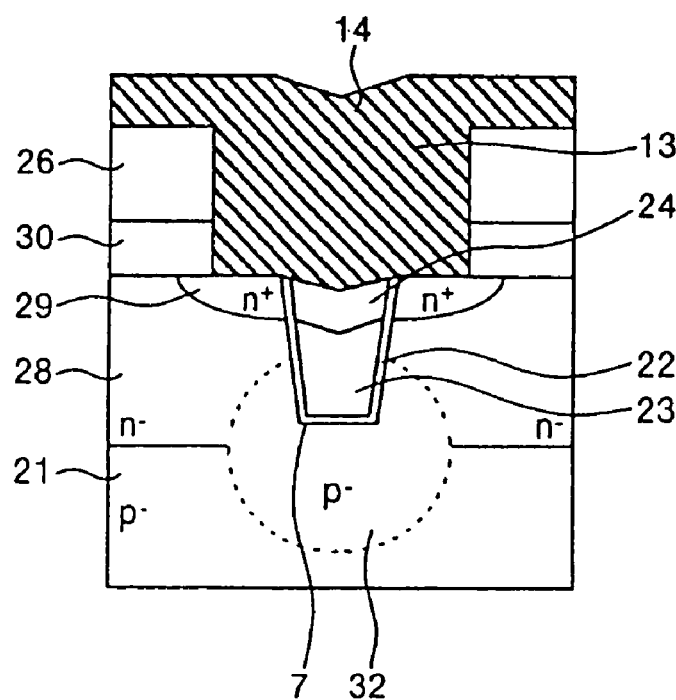
FIG. 14 illustrates a cross sectional structure in a second gate region of the first TLPM applicable to the mesh-shaped trench pattern according to the invention.

FIGS. 12–14 each illustrate a cross sectional structure of a TLPM with a one-step trench structure in which a source region is presented at the bottom of a trench. FIG. 12 is a cross sectional view in the active region taken along line A–A' of FIG. 1. As shown in FIG. 12, in the active region, in the first trench section 8 formed in a p⁻-semiconductor substrate 21, a gate polysilicon 23 as a first conductor is formed with a gate insulator film 22 put between. Moreover, the inside of the gate polysilicon 23 is filled with source polysilicon 25 as a second conductor with an interlayer insulator film 24 interposed therebetween.

A source electrode as the second electrode 16 is electrically connected to the source polysilicon 25 through the contact section (a source contact) 15 penetrating through an interlayer insulator film 26. Furthermore, at the bottom of the first trench section 8, there is provided an n⁺-source region 27 as a first diffusion region. The source polysilicon 25 penetrates through the gate insulator film 22 to directly contact the n⁺-source region 27.

The outside of the first trench section 8 is an n⁻-drain region 28 on the surface layer of which an n⁺-drain region 29 as a second diffusion region is formed apart from the first trench section 8. A drain electrode as the first electrode 14 is electrically connected to the n⁺-drain region 29 through the contact section (a drain contact) 13 penetrating through the interlayer insulator film 26 and a mask oxide film 30. Moreover, at the bottom of the first trench section 8, there are provided a p-base region 31 and a p⁻-body region 32.

FIG. 13 illustrates a cross section of the first gate region taken along line B–B' of FIG. 1. As shown in FIG. 13, in the first gate region, the second trench section 9 formed in the p⁻-semiconductor substrate 21 is filled with the gate polysilicon 23 with the gate insulator film 22 interposed therebetween. The outside of the second trench section 9 is the n⁻-drain region 28 on the surface layer of which the n⁺-drain regions 29 are formed apart from the second trench section 9. The first electrode (the drain electrode) 14 is electrically connected to the n⁺-drain region 29 through the contact section 13. Moreover, at the bottom of the second trench section 9, there is provided the p⁻-body region 32.

FIG. 14 illustrates a cross section of the second gate region taken along line C–C' of FIG. 1. As shown in FIG. 14, in the second gate region, the third trench section 7 formed in the p⁻-semiconductor substrate 21 is filled with the gate polysilicon 23 with the gate insulator film 22 put between. The outside of the third trench section 7 is the n⁻-drain region 28 on the surface layer of which the n⁺-drain region 29 is formed in contact with the third trench section 7. The first electrode (the drain electrode) 14 is electrically connected to the n⁺-drain region 29 on each side of the third trench section 7 through the contact section 13. Namely, the contact section 13 is formed over the n⁺-drain region 29 on each of the outsides putting the third trench section 7 between. The contact section 13, however, is insulated from the gate polysilicon 23 by the interlayer insulator film 24. Moreover, at the bottom of the third trench section 7, there is provided the p⁻-body region 32.

A brief explanation will be made about a manufacturing process of the TLPM having cross sectional arrangements shown in FIGS. 12–14. First, on the p⁻-semiconductor substrate 21, the n⁻-drain region 28 is formed, on the surface of which the mask oxide film 30 is formed with the mesh-shaped trench pattern according to the invention. With the mask oxide film 30 used as a mask, trench etching is carried out to form the first to third trench sections 8, 9 and 7. Subsequently, the gate insulator film 22 is formed in the first to third trench sections 8, 9 and 7, and then the gate polysilicon 23 is formed. Moreover, the p-base region 31, the p⁻-body region 32 and the n⁺-source region 27 are formed, and then the interlayer insulator film 24 is deposited. Next, a contact hole is opened at the bottom of the first trench section 8 and the source polysilicon 25 is formed in the first trench section 8. Then, the interlayer insulator film 26 is deposited, contact holes, which penetrate through the interlayer insulator film 26 and the mask oxide film 30, are formed, and the n⁺-drain region 29 is formed by ion implantation and diffusion processing. Finally, by depositing a metal interconnection layer and patterning the layer, the contact sections 13 and 15, the first electrode (the drain electrode) 14 and the second electrode (the source electrode) 16 are formed to complete the cross sectional arrangements shown in FIGS. 12–14.

Figure 15:
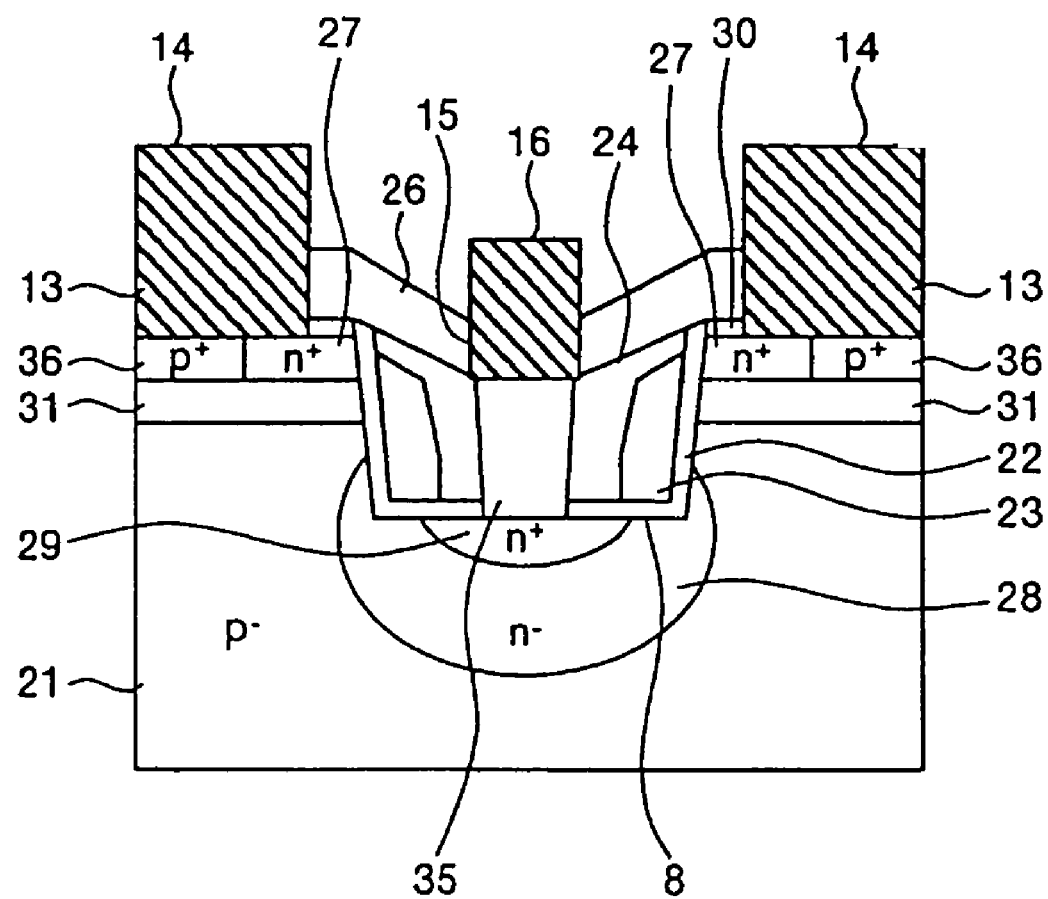
FIG. 15 illustrates a cross sectional structure in an active region of a second TLPM applicable to the mesh-shaped trench pattern according to the invention.
Figure 16:
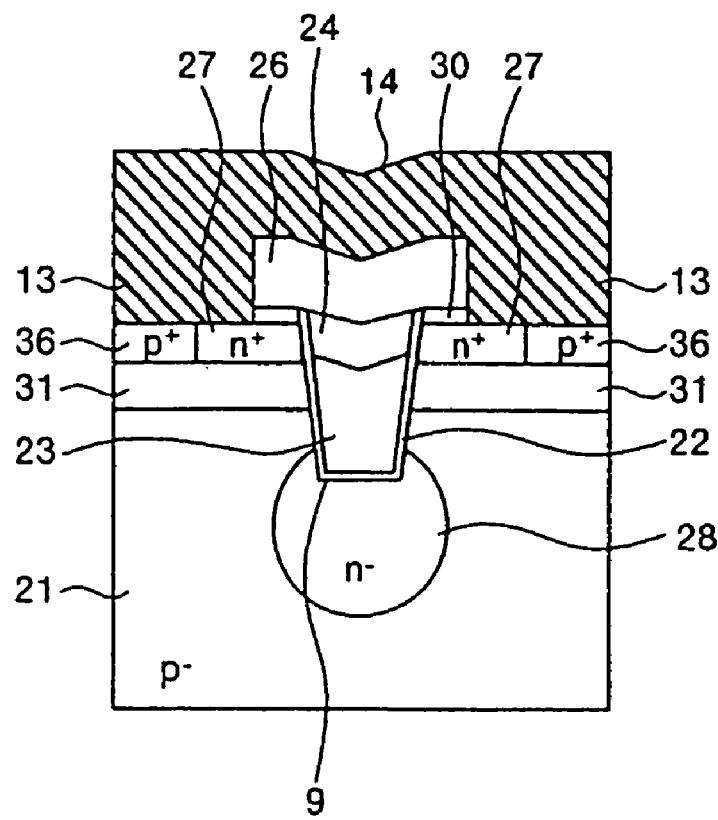
FIG. 16 illustrates a cross sectional structure in a first gate region of the second TLPM applicable to the mesh-shaped trench pattern according to the invention.
Figure 17:
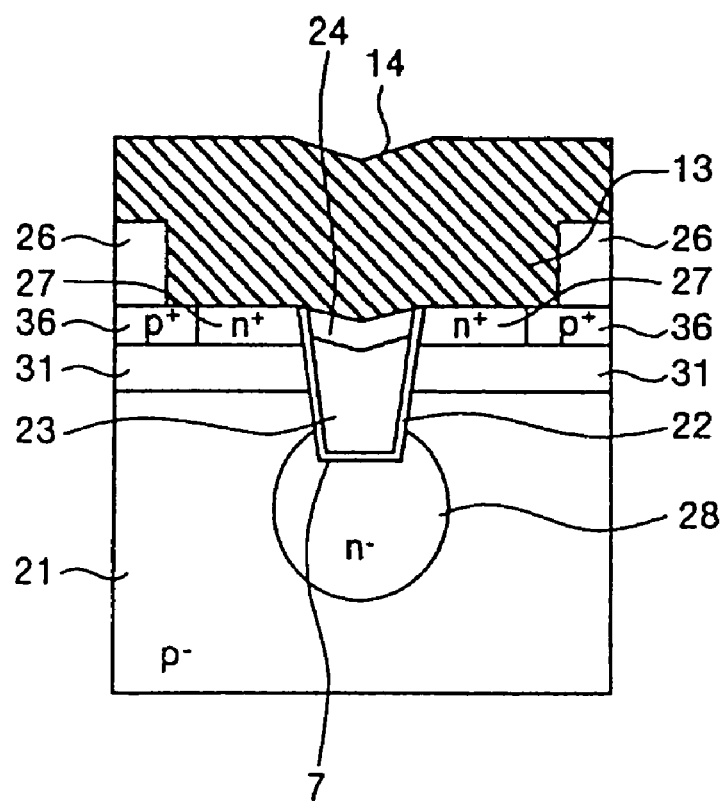
FIG. 17 illustrates a cross sectional structure in a second gate region of the second TLPM applicable to the mesh-shaped trench pattern according to the invention.

FIGS. 15–17 each illustrate a cross sectional structure of a TLPM with a one-step trench structure, with a drain region presented at the bottom of a trench. FIG. 15 illustrates a cross section of the active region taken along line A–A' of FIG. 1. As shown in FIG. 15, in the active region, in the first trench section 8 formed in the p$^-$-semiconductor substrate 21, the gate insulator film 22, the gate polysilicon 23, and the interlayer insulator film 24 are formed in the order from the outside. The central portion thereof is filled with drain polysilicon 35 as a second conductor.

A drain electrode as the second electrode 16 is electrically connected to the drain polysilicon 35 through the contact section (a drain contact) 15 penetrating through the interlayer insulator film 26. Furthermore, at the bottom of the first trench section 8, there are provided an n$^+$-drain region 29 as the first diffusion region and an n$^-$-drain region 28. The drain polysilicon 35 penetrates through the gate insulator film 22 to directly contact the n$^+$-drain region 29. On the outside of the first trench section 8, there are formed a p-base region 31, an n$^+$-source region 27 as the second diffusion region and a p$^+$-plug region 36. A source electrode as the first electrode 14 is electrically connected to the n$^+$-source region 27 and the p$^+$-plug region 36 through the contact section (a source contact) 13 penetrating through the interlayer insulator film 26 and the mask oxide film 30.

FIG. 16 illustrates a cross section of the first gate region taken along line B–B' of FIG. 1. As shown in FIG. 16, in the first gate region, the second trench section 9 formed in the p$^-$-semiconductor substrate 21 is filled with the gate polysilicon 23 with the gate insulator film 22 disposed therebetween. On the outside of the second trench section 9, there are formed the p-base region 31, the n$^+$-source region 27 and the p$^+$-plug region 36. The first electrode (the source electrode) 14 is electrically connected to the n$^+$-source region 27 and the p$^+$-plug region 36 through the contact section 13. Moreover, at the bottom of the second trench section 9, there is provided the n$^-$-drain region 28.

FIG. 17 illustrates a cross section of the second gate region taken along line C–C' of FIG. 1. As shown in FIG. 17, in the second gate region, the third trench section 7 formed in the p$^-$-semiconductor substrate 21 is filled with the gate polysilicon 23 with the gate insulator film 22 disposed therebetween. On the outside of the third trench section 7, there are formed the p-base region 31, the n$^+$-source region 27 and the p$^+$-plug region 36. The first electrode (the source electrode) 14 is electrically connected to the n$^+$-source region 27 and the p$^+$-plug region 36 on each side of the third trench section 7 through the contact section 13. Namely, the contact section 13 is formed over the n$^+$-source region 27 and the p$^+$-plug region 36 on each of the outer sides, putting the third trench section 7 therebetween. The contact section 13, however, is insulated from the gate polysilicon 23 by the interlayer insulator film 24. Moreover, at the bottom of the third trench section 7, there is provided the n$^-$-drain region 28.

A brief explanation will be made about a manufacturing process of the TLPM having cross sectional arrangements shown in FIGS. 15–17. First, on the p$^-$-semiconductor substrate 21, the mask oxide film 30 with the mesh-shaped trench pattern according to the invention is formed. Using the pattern as a mask, trench etching is carried out to form the first to third trench sections 8, 9 and 7. Subsequently, after the n$^-$-drain region 28 is formed, the gate insulator film 22 is formed in the first to third trench sections 8, 9 and 7, and the gate polysilicon 23 is formed. Then, the interlayer insulator film 24 is deposited. Next, a contact hole is opened at the bottom of the first trench section 8 and the drain polysilicon 35 is formed in the first trench section 8. Then, the p-base region 31, the n$^+$-source region 27, and the p$^+$-plug region 36 are formed, and the interlayer insulator film 26 is deposited. Subsequently, contact holes, which penetrate through the interlayer insulator film 26 and the mask oxide film 30, are formed. Then, by depositing a metal interconnection layer and patterning this layer, the contact sections 13 and 15, the first electrode (the source electrode) 14, and the second electrode (the drain electrode) 16 are formed to complete the cross sectional arrangements shown in FIGS. 15–17.

Figure 18:
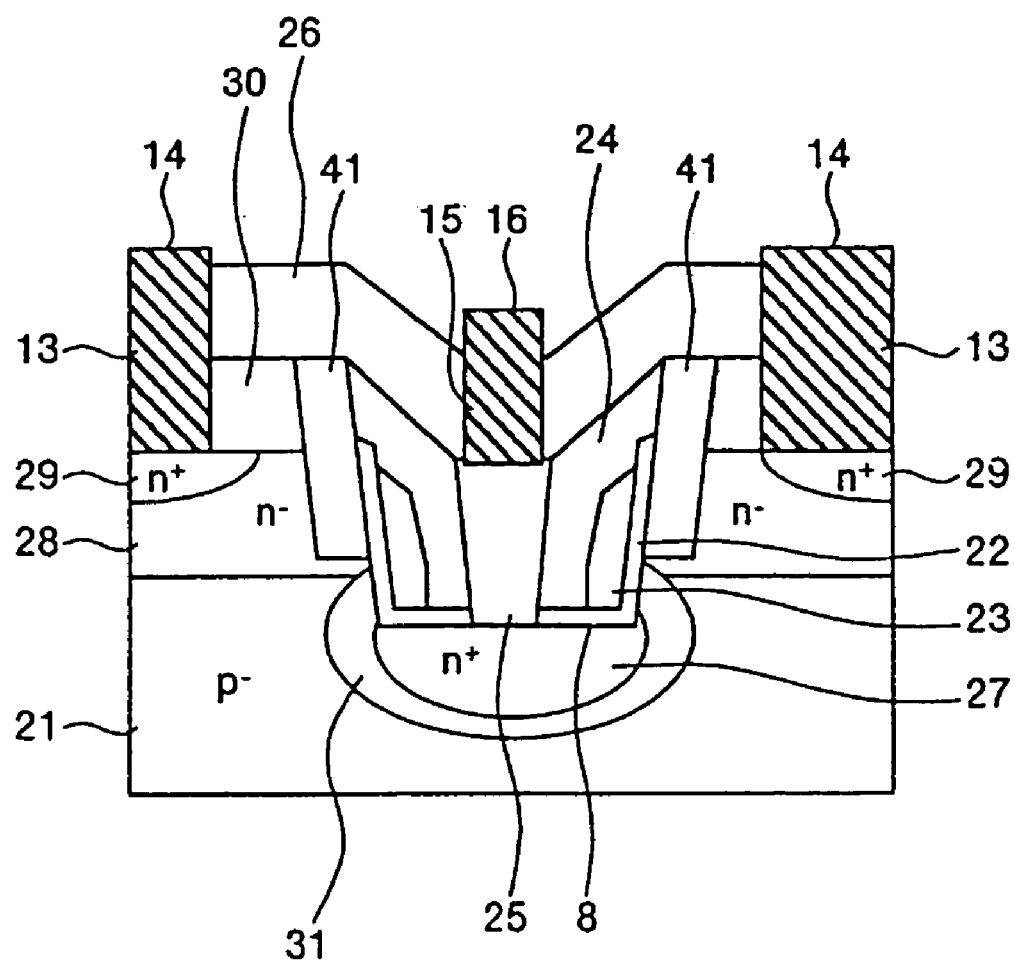
FIG. 18 illustrates a cross sectional structure in an active region of a third TLPM applicable to the mesh-shaped trench pattern according to the invention.
Figure 19:
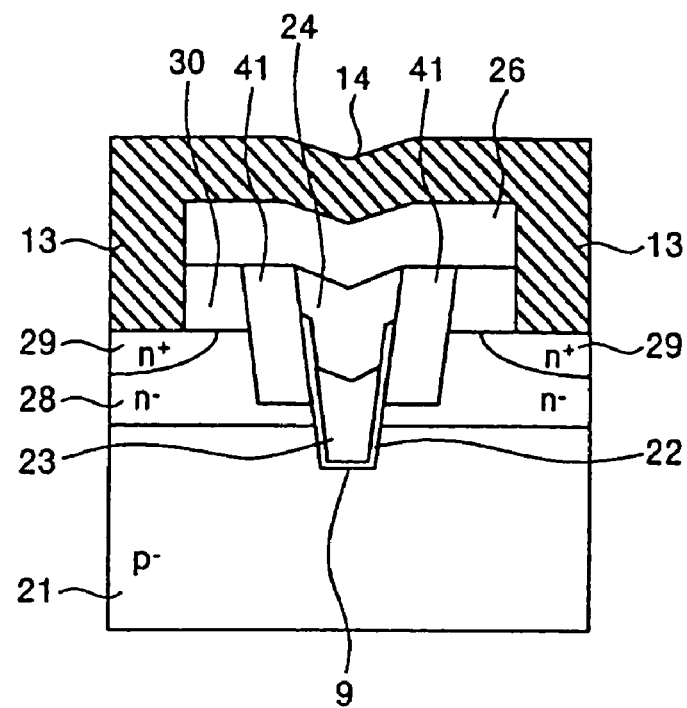
FIG. 19 illustrates a cross sectional structure in a first gate region of the third TLPM applicable to the mesh-shaped trench pattern according to the invention.
Figure 20:
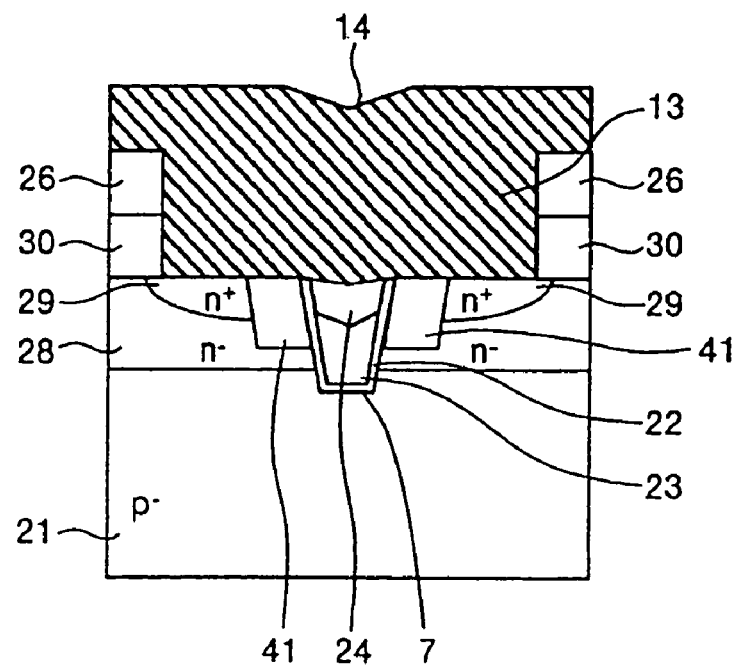
FIG. 20 illustrates a cross sectional structure in a second gate region of the third TLPM applicable to the mesh-shaped trench pattern according to the invention.

FIGS. 18–20 each illustrate a cross sectional structure of a TLPM with a two-step trench structure in which a source region is presented at the bottom of a trench, taken along line A–A', line B–B', and line C–C' of FIG. 1, respectively. As shown in FIGS. 18–20, is similar to the embodiment of FIGS. 12–14, but with a thicker interlayer insulator film 41 thicker than the gate insulator film 22 along an upper half section of the side wall of each of the first to the third trench sections 8, 9 and 7. Moreover, in the third embodiment, no p$^-$-body region 32 is provided. Other arrangements are the same as those of the first embodiment. Hence, the same reference numerals and signs are given thereto and explanations thereof will be omitted.

A brief explanation will be made about a manufacturing process of the TLPM having cross sectional arrangements shown in FIGS. 18–20. First, on the p$^-$-semiconductor substrate 21, the n$^-$-drain region 28 is formed, on the surface of which the mask oxide film 30 is formed with the mesh-shaped trench pattern according to the invention. With the mask oxide film 30 used as a mask, trench etching of a first step is carried out to form the first to third trench sections 8, 9 and 7. Subsequently, the thick interlayer insulator film 41 is formed along a side wall of each of the first to third trench sections 8, 9, and 7. Using the interlayer insulator film 41 as a mask, trench etching of a second step is carried out at the bottom of each of the trench sections. Thereafter, the gate insulator film 22 is formed. Thereafter, the process is the same as that in the first embodiment.

Figure 21:
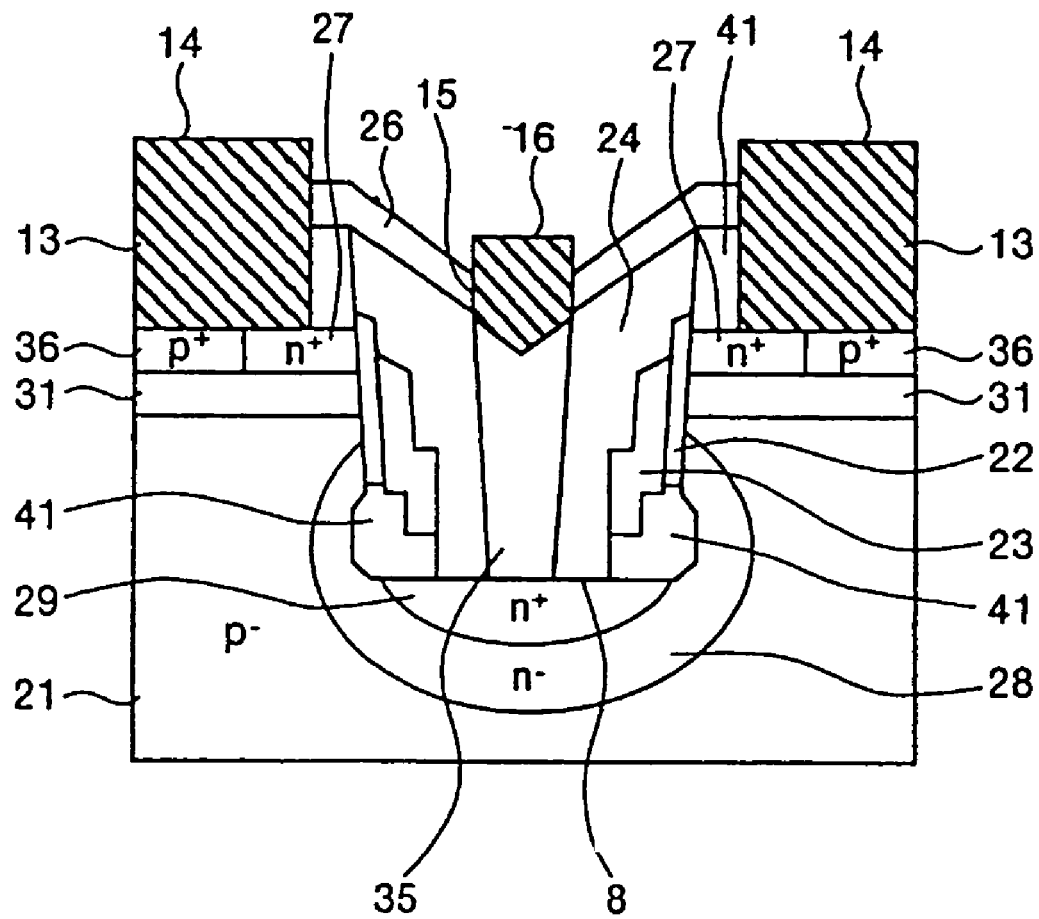
FIG. 21 illustrates a cross sectional structure in an active region of a fourth TLPM applicable to the mesh-shaped trench pattern according to the invention.
Figure 22:
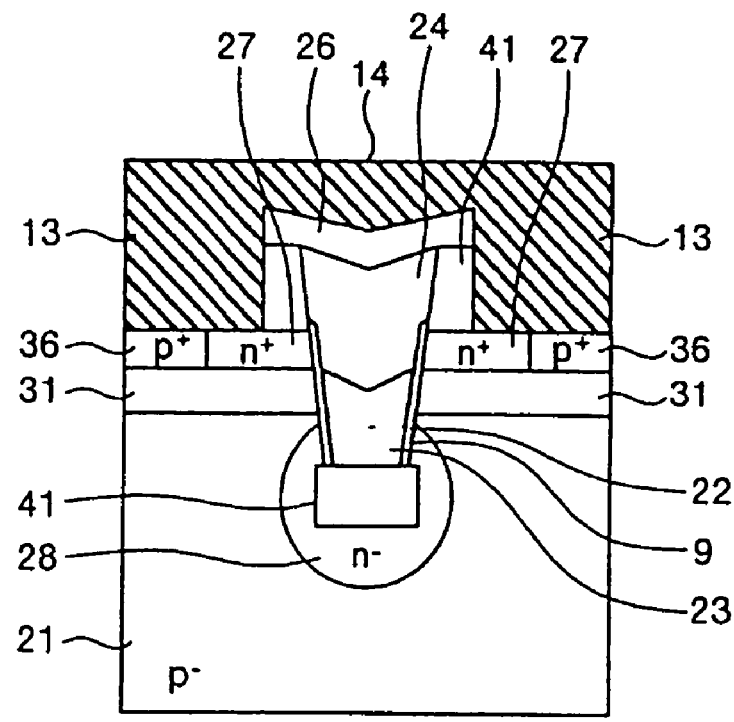
FIG. 22 illustrates a cross sectional structure in a first gate region of the fourth TLPM applicable to the mesh-shaped trench pattern according to the invention.
Figure 23:
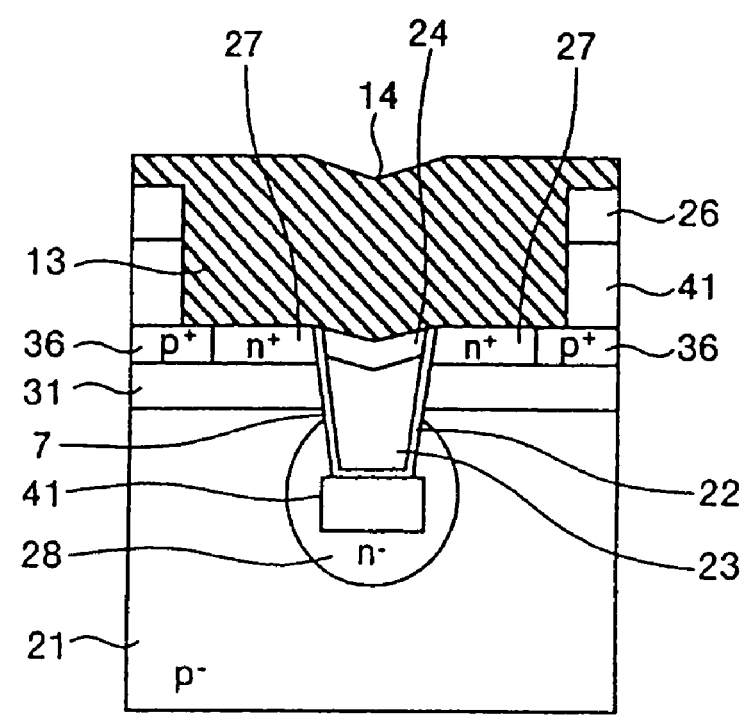
FIG. 23 illustrates a cross sectional structure in a second gate region of the fourth TLPM applicable to the mesh-shaped trench pattern according to the invention.

FIGS. 21–23 each illustrate a cross sectional structure of a TLPM with a two-step trench structure in which a drain region is presented at the bottom of a trench, taken along line A–A', line B–B', and line C–C' of FIG. 1, respectively. The fourth embodiment illustrated in FIGS. 21–23 is similar to the second embodiment illustrated in FIGS. 15–17, but with a thicker interlayer insulator film 41, thicker than the gate insulator film 22 formed from the lower half section to the bottom of the first trench section 8 and on each of the bottoms of the second and third trench sections 9 and 7. Moreover, the fourth embodiment, also has a thick interlayer insulator film 41 on the surface of the substrate. Other arrangements are the same as those of the second embodiment. Hence, the same reference numerals and signs are given thereto and explanations thereof will be omitted.

A brief explanation will be made about a manufacturing process of the TLPM having cross sectional arrangements shown in FIGS. 21–23. First, on the p$^-$-semiconductor substrate 21, the mask oxide film 30 with the mesh-shaped trench pattern according to the invention is formed. Using the patterned oxide film 30 as a mask, trench etching of a first step is carried out to form the first to third trench sections 8, 9 and 7. Subsequently, the side wall of each of the trench sections is coated with a nitride film. Using the nitride film as a mask, trench etching of a second step is carried out at the bottom of each of the trench sections. Then, after the n⁻-drain region 28 is formed, the thick interlayer insulator film 41 is formed and the nitride film is removed. Next, the gate insulator film 22 is formed in each of the first to third trench sections 8, 9 and 7. Thereafter, the process is the same as that in the second embodiment.

Figure 2:
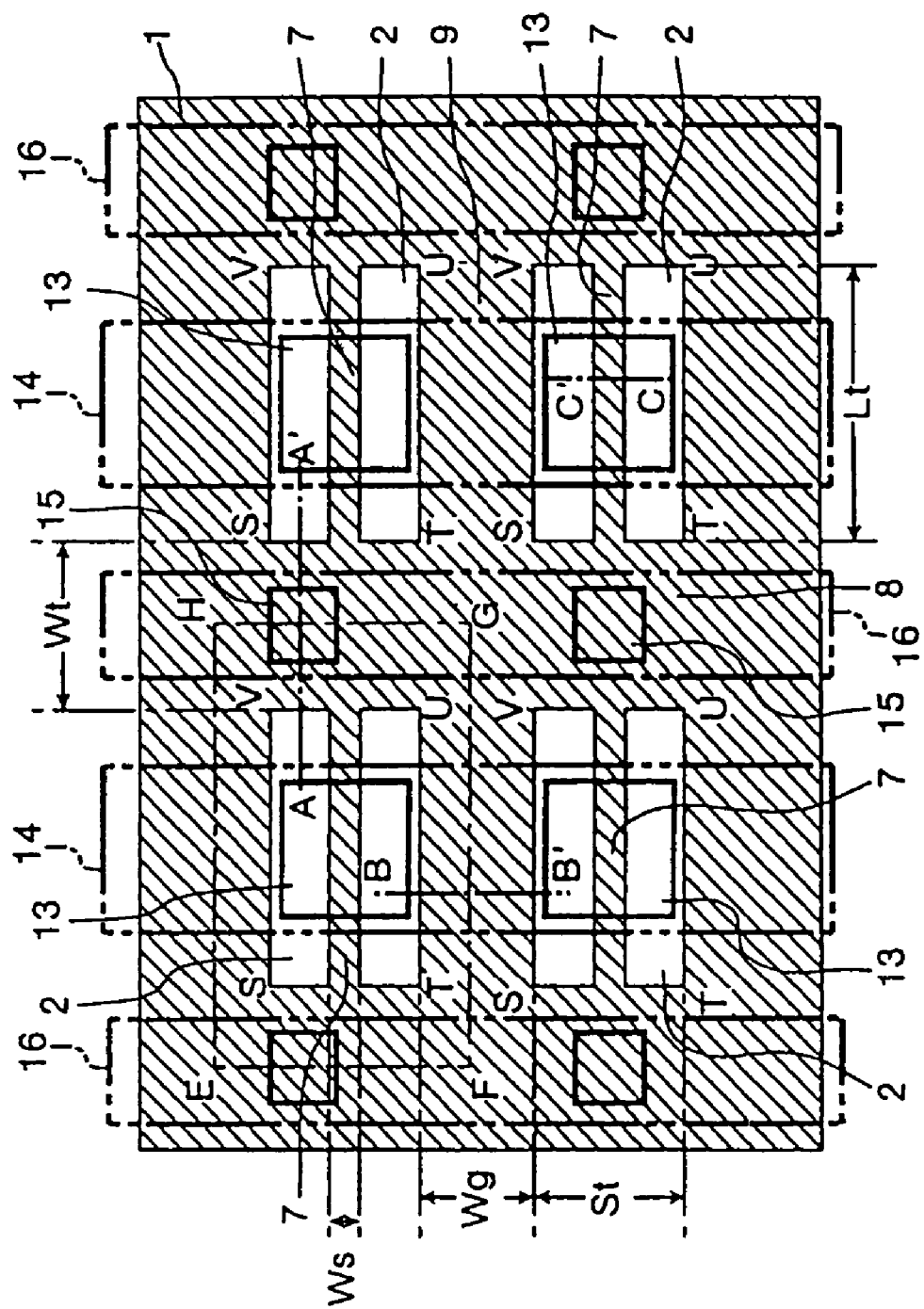
FIG. 2 illustrates a planar layout of a mesh-shaped trench pattern according to according to another embodiment of the present invention.

FIG. 2 illustrates a planar layout of a trench pattern of a semiconductor device according to another embodiment of the present invention. In this embodiment, in the basic pattern of the mesh-shaped trench pattern shown in FIG. 126, a third trench section 7 is formed similar to the first embodiment of FIG. 1, but with the third trench section 7 extending parallel to the lateral direction from the first trench section 8. Namely, in this embodiment, the third trench section 7 extends in the lateral direction to divide each non-trench region 2 into two smaller regions. In each non-trench region 2, the contact section 13 for the non-trench region 2 is formed spreading over the two smaller regions.

Here, a rectangle STUV and a rectangle EFGH are defined similarly to those in the layout shown in FIG. 126, with the dimension of each of St, Lt, Wt, and Wg made equal to that in the layout shown in FIG. 126. Moreover, the width of the third trench section 7 is designated as Ws. In the layout shown in FIG. 2, a channel width Wch in each rectangle EFGH is expressed by the following Equation (11):

$$Wch=2(2Lt-Ws+St) \quad (11)$$

Moreover, a channel density P is given by the following Equation (12):

$$P = 2(2Lt - Ws + St)/A \quad (12)$$
$$= 2\{Lt + St + (Lt - Ws)\}/A.$$

By making Ws narrower than Lt by miniaturization, as is apparent from the comparison of the above Equation (12) and the previous Equation (4), the channel density P obtained from the above Equation (12) becomes larger than the channel density P obtained from the previous Equation (4). Namely, in the trench pattern in the embodiment of FIG. 2, the channel density P becomes larger than in the pattern shown in FIG. 126.

Moreover, a plurality of the third trench sections 7 can be provided in each rectangle STUV. In this case, in each non-trench region 2, the contact section 13 for the non-trench region 2 is in contact with all of the smaller regions divided by a plurality of the third trench sections 7.

With the number of the third trench sections 7 in each rectangle STUV designated as m (where, m represents a natural number), the channel width Wch and the channel density P in each rectangle EFGH are given by the following Equation (13) and Equation (14), respectively:

$$Wch=2\{(m+1)Lt-mWs+St\} \quad (13)$$

$$P = 2\{(m + 1)Lt - mWs + St\}/A \quad (14)$$
$$= 2\{Lt + St + m(Lt - Ws)\}/A.$$

With Ws made narrower than Lt by miniaturization, as is apparent from the comparison of the above Equation (14) and the previous Equation (4), the channel density P obtained from the above Equation (14) becomes larger than the channel density P obtained from the previous Equation (4). Moreover, as the number m of the third trench sections 7 in each rectangle STUV is increased, the channel density P becomes larger.

Furthermore, in each of the non-trench regions 2, the number of the third trench sections 7 can be different. In addition, the non-trench regions 2 with the third trench sections 7 extending parallel to or along the lateral direction and the non-trench regions 2 with the third trench sections 7 extending parallel to or along the longitudinal direction, as in the embodiment of FIG. 1, can be mixed.

Figure 3:
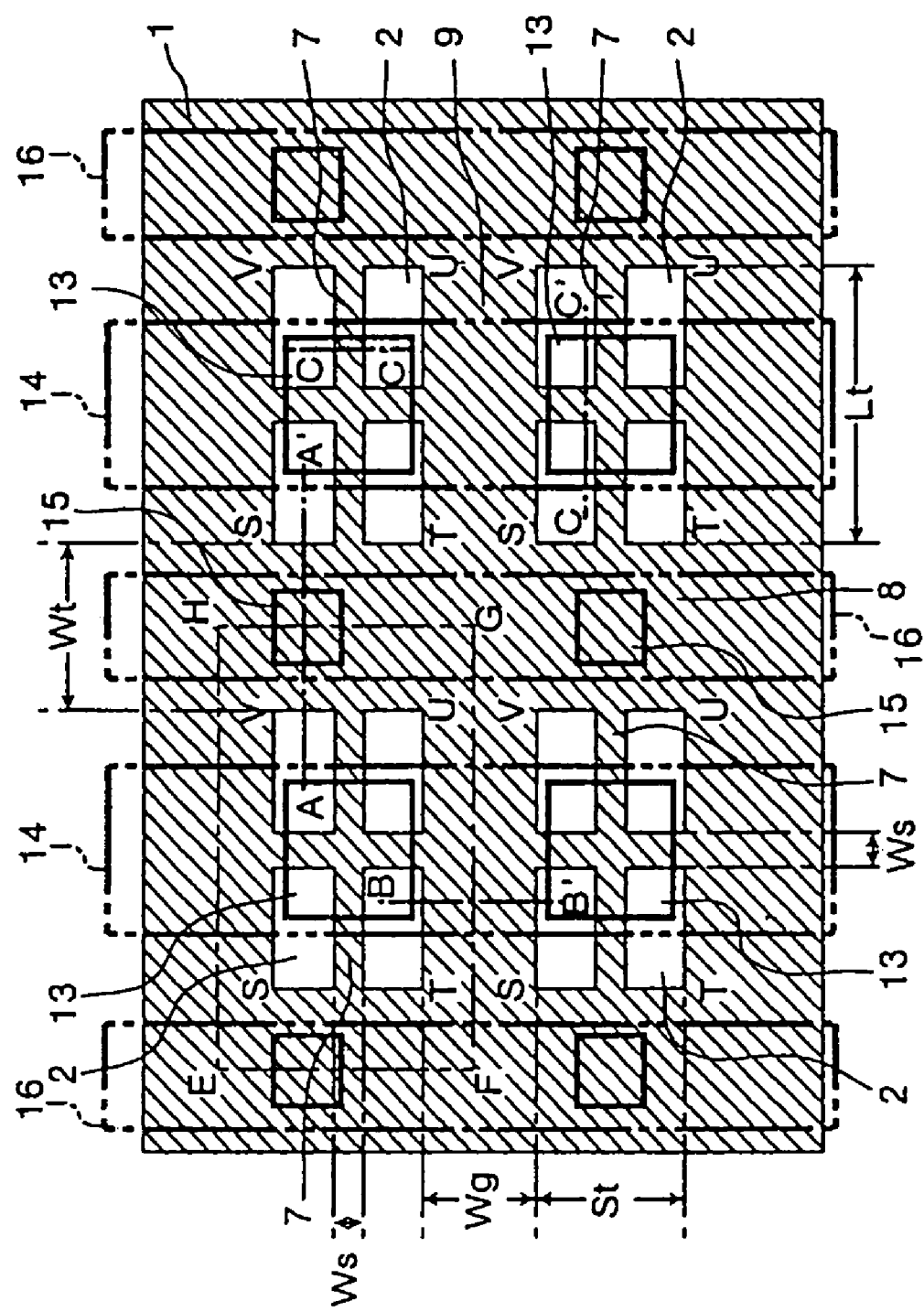
FIG. 3 illustrates a planar layout of a mesh-shaped trench pattern according to according to another embodiment of the present invention.

FIG. 3 illustrates a planar layout of a trench pattern of a semiconductor device according to another embodiment of the present invention. This embodiment is a combination of the embodiments of FIGS. 1 and 2, where, in the basic pattern of the mesh-shaped trench pattern shown in FIG. 126, a third trench section 7 having a cross or cruciform shape, which is made up of a section extending parallel to the longitudinal direction and a section extending parallel to the lateral direction.

Therefore, in the embodiment of FIG. 3, each non-trench region 2 is divided into four smaller regions. In each non-trench region 2, the contact section 13 for the non-trench region 2 is formed spread over the four smaller regions. In the layout shown in FIG. 3, a channel width Wch and a channel density P in each rectangle EFGH are given by the following Equations (15) and Equation (16), respectively:

$$Wch=4\{(Lt-Ws)+(St-Ws)\} \quad (15)$$

$$P = 4\{(Lt - Ws) + (St - Ws)\}/A \quad (16)$$
$$= 4(Lt + St - 2Ws)/A$$
$$= 2\{(Lt + St) + (Lt + St - 4Ws)\}/A.$$

By making Ws so that 4Ws becomes smaller than (Lt+St) by miniaturization, as is apparent from the comparison of the above Equation (16) and the previous Equation (4), the channel density P obtained from the above Equation (16) becomes larger than the channel density P obtained from the previous Equation (4). Namely, in the trench pattern of FIG. 3, the channel density P becomes larger than in the pattern shown in FIG. 126.

Moreover, the third trench sections 7 can be provided with an arrangement in which a plurality of sections parallel to the longitudinal direction are provided, can be provided with an arrangement in which a plurality of sections parallel to the lateral direction are provided, or can be provided with both. Furthermore, in each non-trench region 2, the number of the sections of the third trench sections 7 parallel to the longitudinal direction or the number of the sections parallel to the lateral direction can be different.

Figure 4:
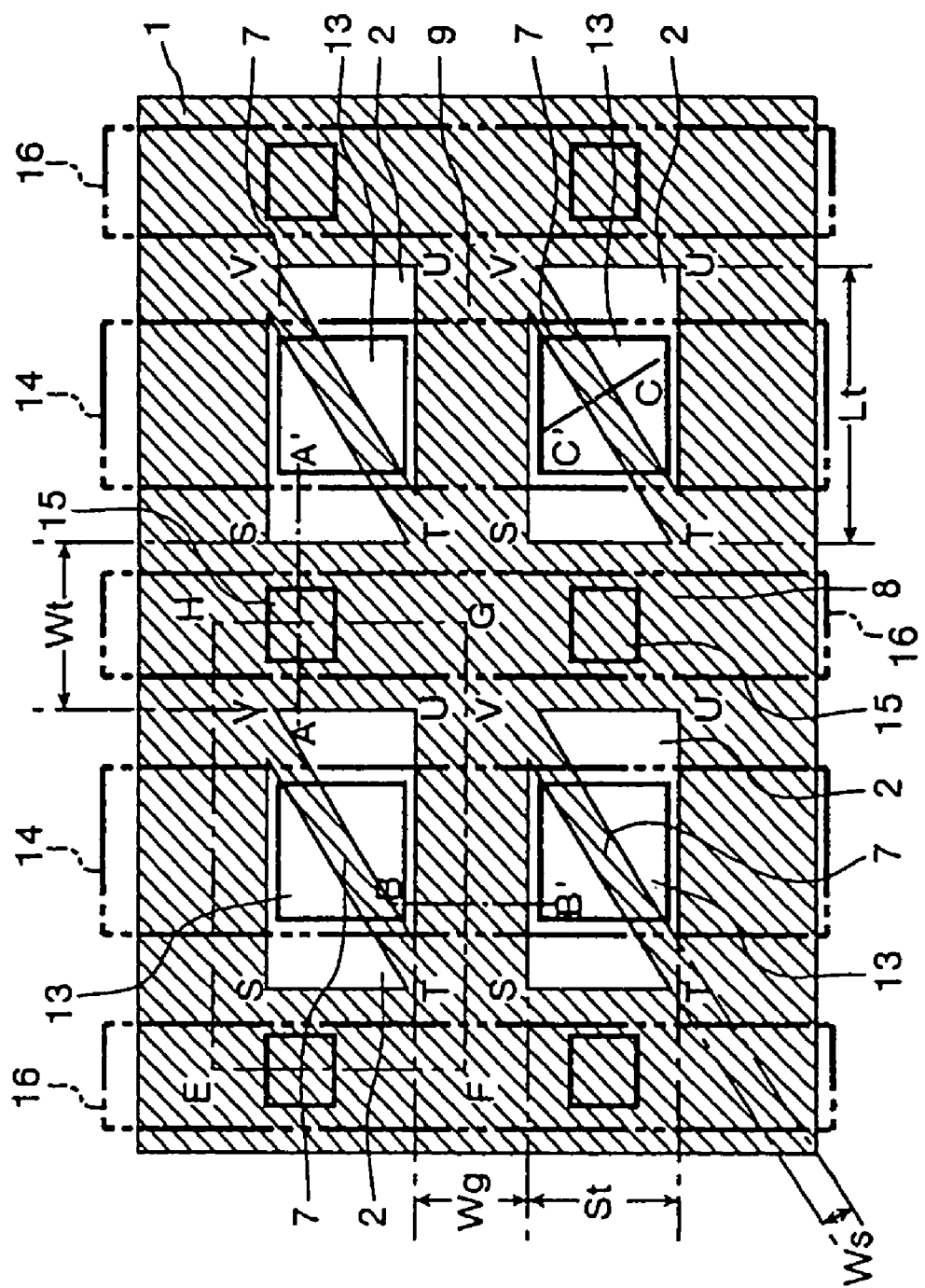
FIG. 4 illustrates a planar layout of a mesh-shaped trench pattern according to according to another embodiment of the present invention.

FIG. 4 illustrates a planar layout of a trench pattern of a semiconductor device according to another embodiment of the present invention. This embodiment has the basic pattern of the mesh-shaped trench pattern shown in FIG. 126, but a third trench section 7 extends diagonally, in the diagonal direction to both of the first trench section 8 and the second trench section 9. In each non-trench region 2, the third trench section 7 is formed so that the center line thereof (not shown) matches a diagonal TV of the non-trench region 2. Each non-trench region 2 is divided into two smaller regions. In each non-trench region 2, a contact section 13 for the non-trench region 2 is formed spread over the two smaller regions.

Here, a rectangle STUV and a rectangle EFGH are defined similarly to those in the layout shown in FIG. 126, with the dimension of each of St, Lt, Wt, and Wg made equal to that in the layout shown in FIG. 126. Moreover, the width of the third trench section 7 is designated as Ws. In the layout shown in FIG. 4, a channel width Wch and a channel density P in each rectangle EFGH are given by the following Equation (17) and Equation (18), respectively:

$$Wch = 2\left(Lt + St\sqrt{Lt^2 + St^2}\right) \cdot \left\{1 - \left(\frac{Ws}{2St}\right) \cdot \frac{\sqrt{Lt^2 + St^2}}{Lt}\right\} \quad (17)$$

$$P = \frac{2\left(Lt + St + \sqrt{Lt^2 + St^2}\right)}{A} \cdot \left\{1 - \left(\frac{Ws}{2St}\right) \cdot \frac{\sqrt{Lt^2 + St^2}}{Lt}\right\} \quad (18)$$

Here, Ws is determined so as to satisfy the following Equation:

$$Ws < (Lt + St - \sqrt{Lt^2 + St^2})$$

As is apparent from the comparison of the above Equation (18) and the previous Equation (4), the channel density P obtained from the above Equation (18) becomes larger than the channel density P obtained from the previous Equation (4). Namely, in the trench pattern in the embodiment of FIG. 4, the channel density P becomes larger than in the pattern shown in FIG. 126.

Moreover, an arrangement can be provided in which the center line of the third trench section 7 matches a diagonal SU in each non-trench region 2. Furthermore, non-trench regions 2 in each of which the center line of a third trench section 7 matches the diagonal TV and non-trench regions 2 in each of which the center line of a third trench section 7 matches the diagonal SU can be mixed. In addition, the third trench section 7, on condition that it extends in the diagonal direction, is not necessarily required to match the diagonal TV or SU of the non-trench region 2. Moreover, a plurality of the diagonal third trench sections 7 can be provided in each non-trench region 2, and in each of the non-trench regions 2, the number of the third trench sections 7 can be different.

Figure 5:
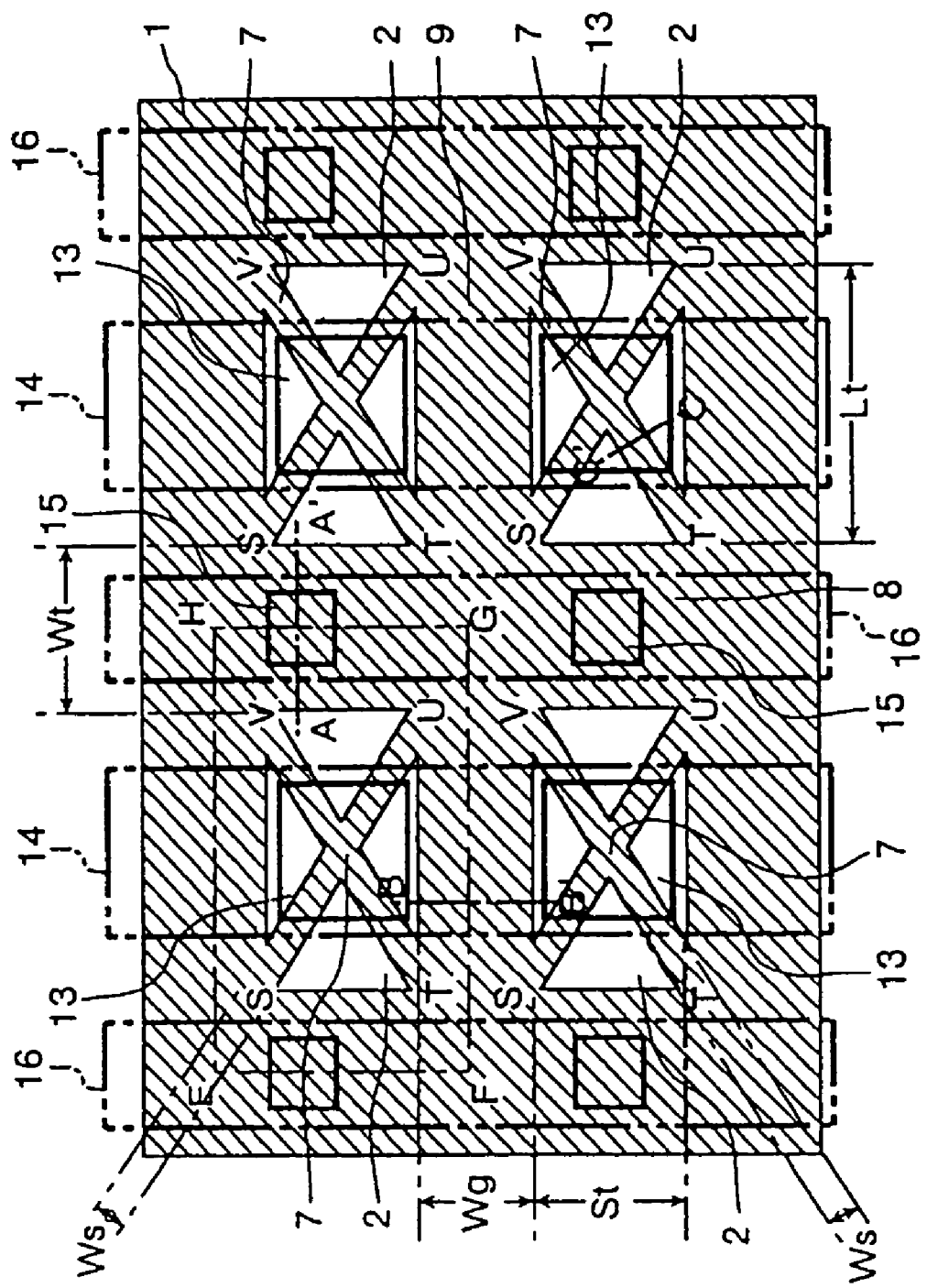
FIG. 5 illustrates a planar layout of a mesh-shaped trench pattern according to according to another embodiment of the present invention.

FIG. 5 illustrates a planar layout of a trench pattern of a semiconductor device according to another embodiment of the present invention. This embodiment has the basic pattern of the mesh-shaped trench pattern shown in FIG. 126, but with a third trench section 7 crossing to form an X-shape made up of a section with the center line thereof matching the diagonal TV of the non-trench region 2 and a section with the center line thereof matching the diagonal SU. Therefore, each non-trench region 2 is divided into four smaller regions. In each non-trench region 2, the contact section 13 for the non-trench region 2 is formed spread over the four smaller regions.

Here, a rectangle STUV and a rectangle EFGH are defined similarly to those in the layout shown in FIG. 126, with the dimension of each of St, Lt, Wt and Wg made equal to that in the layout shown in FIG. 126. Moreover, the width of the third trench section 7 is designated as Ws. In the layout shown in FIG. 5, a channel width Wch and a channel density P in each rectangle EFGH are given by the following Equation (19) and Equation (20), respectively:

$$Wch = 2\left(Lt + St + 2\sqrt{Lt^2 + St^2}\right) \cdot \left\{1 - \left(\frac{Ws}{St}\right) \cdot \frac{\sqrt{Lt^2 + St^2}}{Lt}\right\} \quad (19)$$

$$P = \frac{2\left(Lt + St + 2\sqrt{Lt^2 + St^2}\right)}{A} \cdot \left\{1 - \left(\frac{Ws}{St}\right) \cdot \frac{\sqrt{Lt^2 + St^2}}{Lt}\right\} \quad (20)$$

Here, Ws is determined so as to satisfy the following Equation:

$$Ws < \frac{2\left(2\sqrt{Lt^2 + St^2} - Lt - St\right)}{3\left(\frac{Lt}{St} + \frac{St}{Lt}\right) - 2}$$

As is apparent from the comparison of the above Equation (20) and the previous Equation (4), the channel density P obtained from the above Equation (20) becomes larger than the channel density P obtained from the previous Equation (4). Namely, in the trench pattern of FIG. 5, the channel density P becomes larger than in the pattern shown in FIG. 126.

Moreover, the third trench section 7, on condition that it extends in the diagonal direction, is not necessarily required to match the diagonal TV or SU of the non-trench region 2. Furthermore, the third trench section 7 can be provided with an arrangement in which a plurality of sections extending in the direction of the diagonal TV of the non-trench region 2 are provided, can be provided with an arrangement in which a plurality of sections extending in the direction of the diagonal SU are provided, or can be provided with both. In addition, in each of the non-trench regions 2, the number of sections of the third trench section 7 extending in the direction of the diagonal TV of the non-trench region 2, or the number of sections extending in the direction of the diagonal SU can be different.

Figure 6:
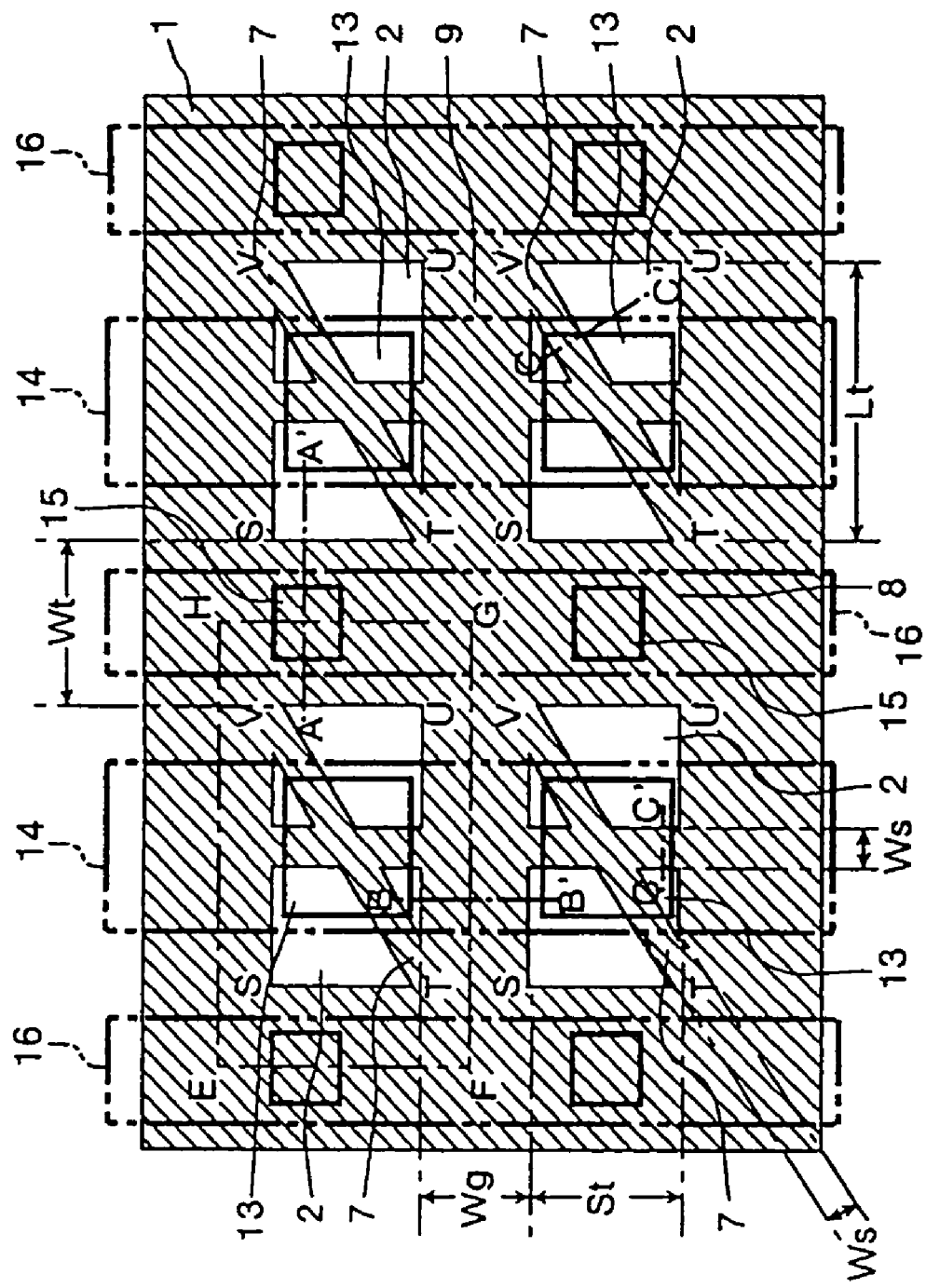
FIG. 6 illustrates a planar layout of a mesh-shaped trench pattern according to according to another embodiment of the present invention.

FIG. 6 illustrates a planar layout of a trench pattern of a semiconductor device according to another embodiment of the present invention. This embodiment is a combination of the embodiments of FIGS. 1 and 4, where a third trench section 7 is, in the basic pattern of the mesh-shaped trench pattern shown in FIG. 126, but made up of a section parallel to the longitudinal direction and a section with the center line thereof matching the diagonal TV of the non-trench region 2. Therefore, in the embodiment of FIG. 6, each non-trench region 2 is divided into four smaller regions. In each non-trench region 2, the contact section 13 for the non-trench region 2 is formed in being spread over the four smaller regions. In the layout shown in FIG. 6, a channel width Wch and a channel density P in each rectangle EFGH are given by the following Equation (21) and Equation (22), respectively:

$$Wch = 2\left(Lt + 2St + \sqrt{Lt^2 + St^2}\right) - Ws\left(\frac{(Lt + St)^2}{LtSt} + \left(\frac{5}{Lt} + \frac{1}{St}\right)\sqrt{Lt^2 + St^2}\right) \quad (21)$$

-continued $$P = \left\{2\left(Lt + 2St + \sqrt{Lt^2 + St^2}\right) - Ws\left(\frac{(Lt+St)^2}{LtSt} + \left(\frac{5}{Lt} + \frac{1}{St}\right)\sqrt{Lt^2 + St^2}\right)\right\}/A \quad (22)$$

Here, Ws is determined so as to satisfy the following Equation:

$$Ws < \frac{2\left(St + \sqrt{Lt^2 + St^2}\right)}{\left(\frac{(Lt+St)^2}{LtSt} + \left(\frac{5}{Lt} + \frac{1}{St}\right)\sqrt{Lt^2 + St^2}\right)}$$

As is apparent from the comparison of the above Equation (22) and the previous Equation (4), the channel density P obtained from the above Equation (22) becomes larger than the channel density P obtained from the previous Equation (4). Namely, in the trench pattern in FIG. 6, the channel density P becomes larger than in the pattern shown in FIG. 126.

Moreover, the third trench section 7 can be provided with an arrangement in which a plurality of sections parallel to the longitudinal direction are provided, can be provided with an arrangement in which a plurality of sections extending in the direction of the diagonal TV of the non-trench region 2 are provided, or can be provided with both. Furthermore, the third trench section 7 can be arranged with a section parallel to the longitudinal direction and a section extending in the direction of the diagonal SU of the non-trench region 2.

In addition, the non-trench region 2 in which the diagonal section of the third trench section 7 extends in the direction of the diagonal TV and the non-trench region 2 in which the diagonal section of the third trench section 7 extends in the direction of the diagonal SU can be provided as being mixed. Moreover, for the diagonal section of the third trench section 7, it is not necessarily required that the center line thereof matches the diagonal TV or SU of the non-trench region 2. Furthermore, in each non-trench region 2, of the third trench sections 7, the number of the sections parallel to the longitudinal direction and the number of the sections extending in the direction of the diagonal TV or SU of the non-trench region 2 can be different.

Figure 7:
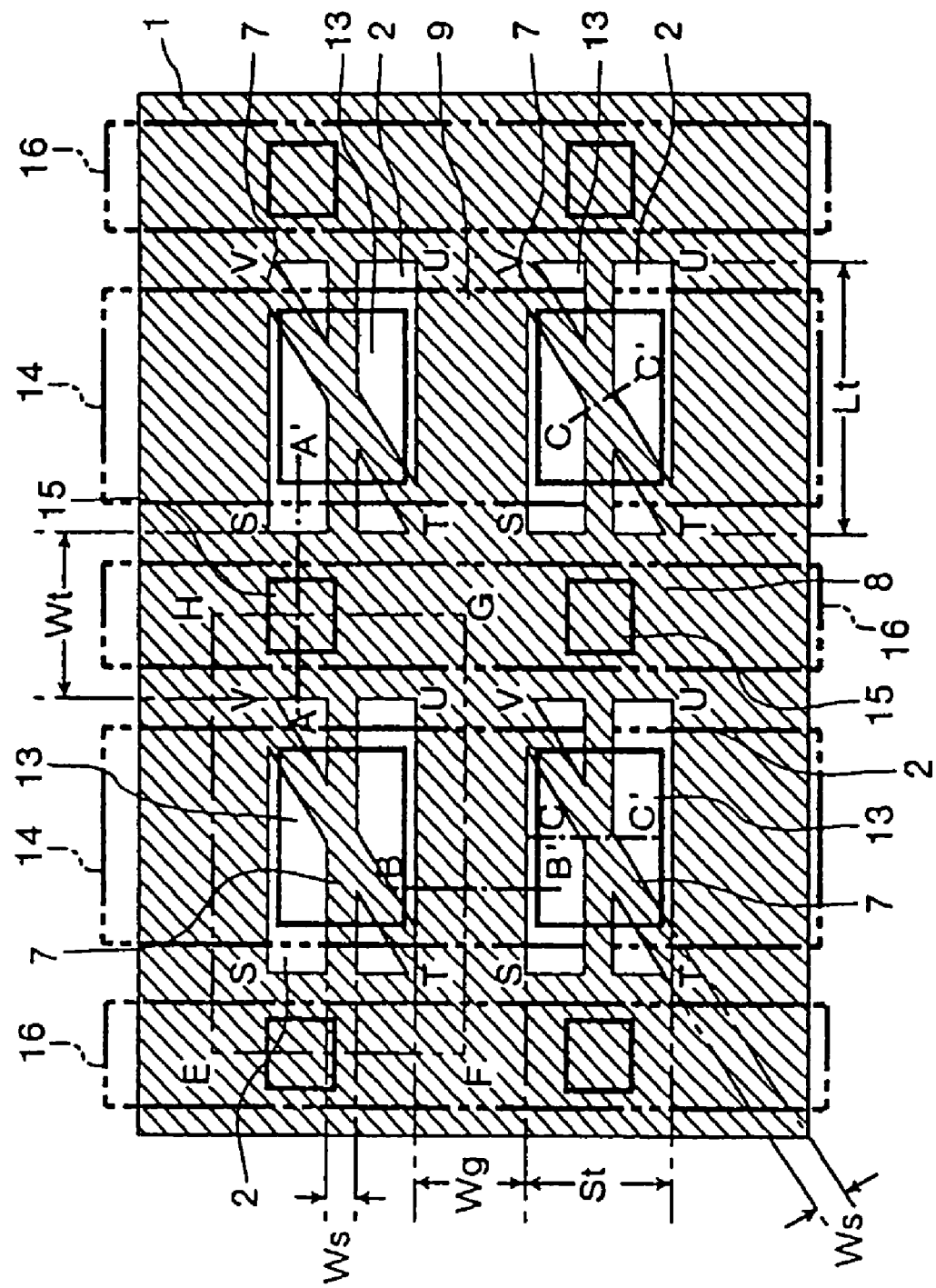
FIG. 7 illustrates a planar layout of a mesh-shaped trench pattern according to according to another embodiment of the present invention.

FIG. 7 illustrates a planar layout of a trench pattern of a semiconductor device according to another embodiment of the present invention. This embodiment is a combination of embodiments of FIGS. 2 and 4, where a third trench section 7 is, in the basic pattern of the mesh-shaped trench pattern shown in FIG. 126, but made up of a section parallel to the lateral direction and a section with the center line thereof matching the diagonal TV of the non-trench region 2.

Therefore, in FIG. 7, each non-trench region 2 is divided into four smaller regions. In each non-trench region 2, a contact section 13 for the non-trench region 2 is formed spread over the four smaller regions. Here, to clearly show that the contact section 13 is spread over the four smaller regions, the contact section 13 is larger compared with those of FIGS. 1–6. Practically, the contact section 13 can be larger than or can be of the same size as each contact section 13 of FIGS. 1–6 (this is the same also in each of FIGS. 9–11). In the layout shown in FIG. 7, a channel width Wch and a channel density P in each rectangle EFGH are given by the following Equation (23) and Equation (24), respectively:

$$Wch = 2\left(2Lt + St + \sqrt{Lt^2 + St^2}\right) - Ws\left(\frac{(Lt+St)^2}{LtSt} + \left(\frac{1}{Lt} + \frac{5}{St}\right)\sqrt{Lt^2 + St^2}\right) \quad (23)$$

$$P = \left\{2\left(2Lt + St + \sqrt{Lt^2 + St^2}\right) - Ws\left(\frac{(Lt+St)^2}{LtSt} + \left(\frac{1}{Lt} + \frac{5}{St}\right)\sqrt{Lt^2 + St^2}\right)\right\}/A \quad (24)$$

Here, Ws is determined so as to satisfy the following Equation:

$$Ws < \frac{2\left(Lt + \sqrt{Lt^2 + St^2}\right)}{\left(\frac{(Lt+St)^2}{LtSt} + \left(\frac{1}{Lt} + \frac{5}{St}\right)\sqrt{Lt^2 + St^2}\right)}$$

As is apparent from the comparison of the above Equation (24) and the previous Equation (4), the channel density P obtained from the above Equation (24) becomes larger than the channel density P obtained from the previous Equation (4). Namely, in the trench pattern of FIG. 7, the channel density P becomes larger than in the pattern shown in FIG. 126.

Moreover, the third trench section 7 can be provided with an arrangement in which a plurality of sections parallel to the lateral direction are provided, can be provided with an arrangement in which a plurality of sections extending in the direction of the diagonal TV of the non-trench region 2 are provided, or can be provided with both. Furthermore, the third trench section 7 can be arranged with a section in perpendicular to the longitudinal direction and a section extending in the direction of the diagonal SU of the non-trench region 2.

In addition, the non-trench region 2 in which the diagonal section of the third trench section 7 extends in the direction of the diagonal TV and the non-trench region 2 in which the diagonal section of the third trench section 7 extends in the direction of the diagonal SU can be mixed. Moreover, it is not necessarily required that the diagonal section of the third trench section 7 matches the diagonal TV or SU of the non-trench region 2. Furthermore, in each non-trench region 2, of the third trench sections 7, the number of the sections parallel to the lateral direction and the number of the sections extending in the direction of the diagonal TV or SU of the non-trench region 2 can be different.

Figure 8:
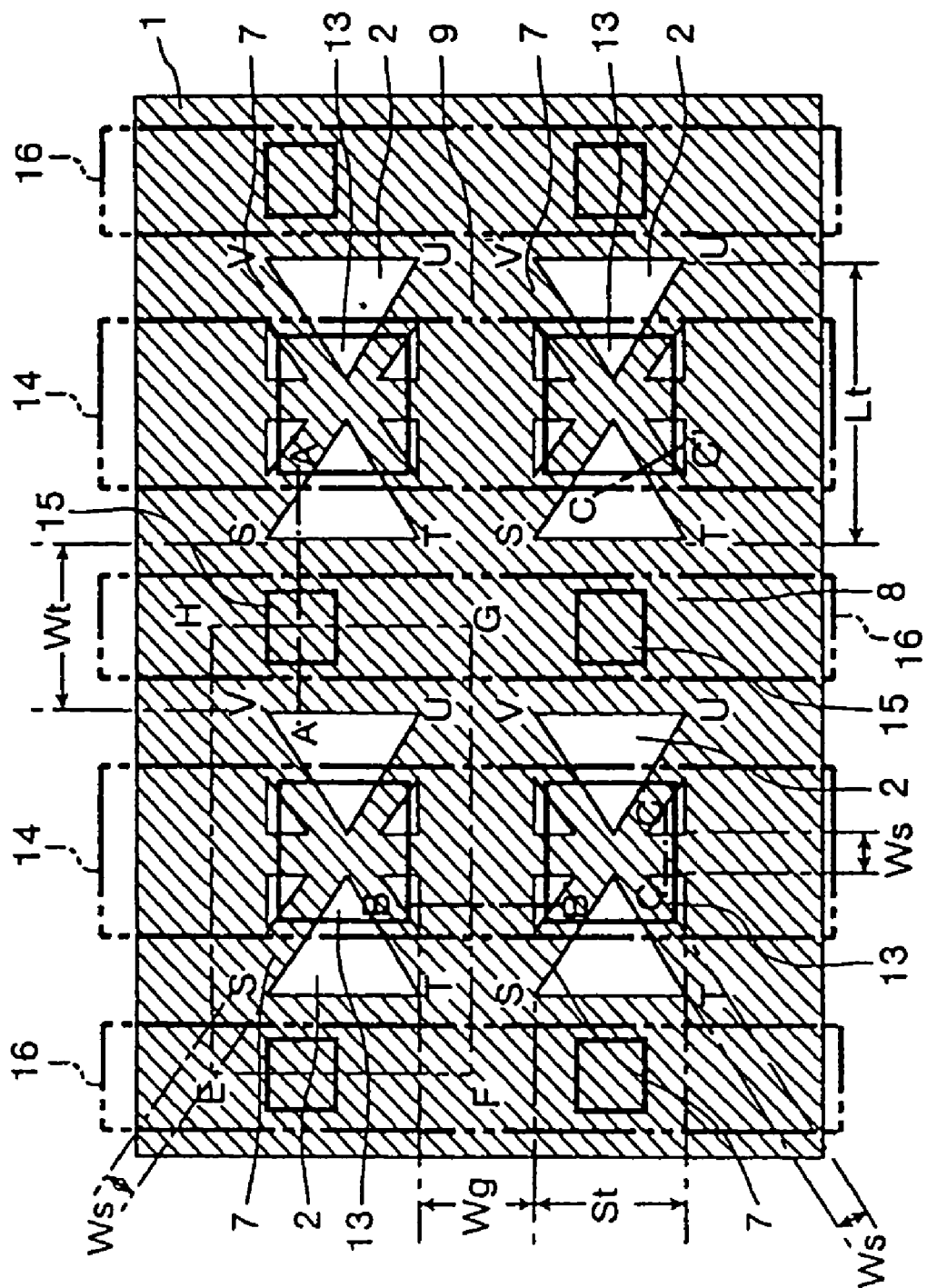
FIG. 8 illustrates a planar layout of a mesh-shaped trench pattern according to according to another embodiment of the present invention.

FIG. 8 illustrates a planar layout of a trench pattern of a semiconductor device according to another embodiment of the present invention. This embodiment is a combination of the embodiments of FIGS. 1 and 5, where a third trench section 7 is, in the basic pattern of the mesh-shaped trench pattern shown in FIG. 126, but made up of a section parallel to the longitudinal, a section with the center line thereof matching the diagonal TV of the non-trench region 2 and a section with the center line thereof matching the diagonal SU.

Therefore, in FIG. 8, each non-trench region 2 is divided into six smaller regions. In each non-trench region 2, the contact section 13 for the non-trench region 2 is formed spread over the six smaller regions. In the layout shown in FIG. 8, a channel width Wch and a channel density P in each rectangle EFGH are given by the following Equation (25) and Equation (26), respectively:

$$P = 2\left\{(Lt + 2St + 2\sqrt{Lt^2 + St^2}) - Ws\left(\frac{(Lt + St + 2\sqrt{Lt^2 + St^2})(St + \sqrt{Lt^2 + St^2})}{LtSt}\right)\right\}/A \quad (26)$$

Here, Ws is determined so as to satisfy the following Equation:

$$Ws < \left(\frac{St}{Lt}\right)\frac{(-St + \sqrt{Lt^2 + St^2})(St + 2\sqrt{Lt^2 + St^2})(-Lt - St + 2\sqrt{Lt^2 + St^2})}{(3Lt^2 + 3St^2 - 2LtSt)}$$

As is apparent from the comparison of the above Equation (26) and the previous Equation (4), the channel density P obtained from the above Equation (26) becomes larger than the channel density P obtained from the previous Equation (4). Namely, in the trench pattern in FIG. 8, the channel density P becomes larger than in the pattern shown in FIG. 126.

Moreover, the third trench section 7 can be provided with an arrangement in which a plurality of sections parallel to the longitudinal direction are provided, can be provided with an arrangement in which a plurality of sections extending in the direction of the diagonal TV of the non-trench region 2 are provided, can be provided with an arrangement in which a plurality of sections extending in the direction of the diagonal SU are provided, or can be provided with an arrangement in which the above ones are combined as appropriate. Furthermore, for the diagonal section of the third trench section 7, it is not necessarily required that the center line thereof matches the diagonal TV or SU of the non-trench region 2. In addition, in each non-trench region 2, of the third trench sections 7, the number of the sections parallel to the longitudinal direction, the number of the sections extending in the direction of the diagonal TV of the non-trench region 2, and the number of the sections extending in the direction of the diagonal SU can be different.

Figure 9:
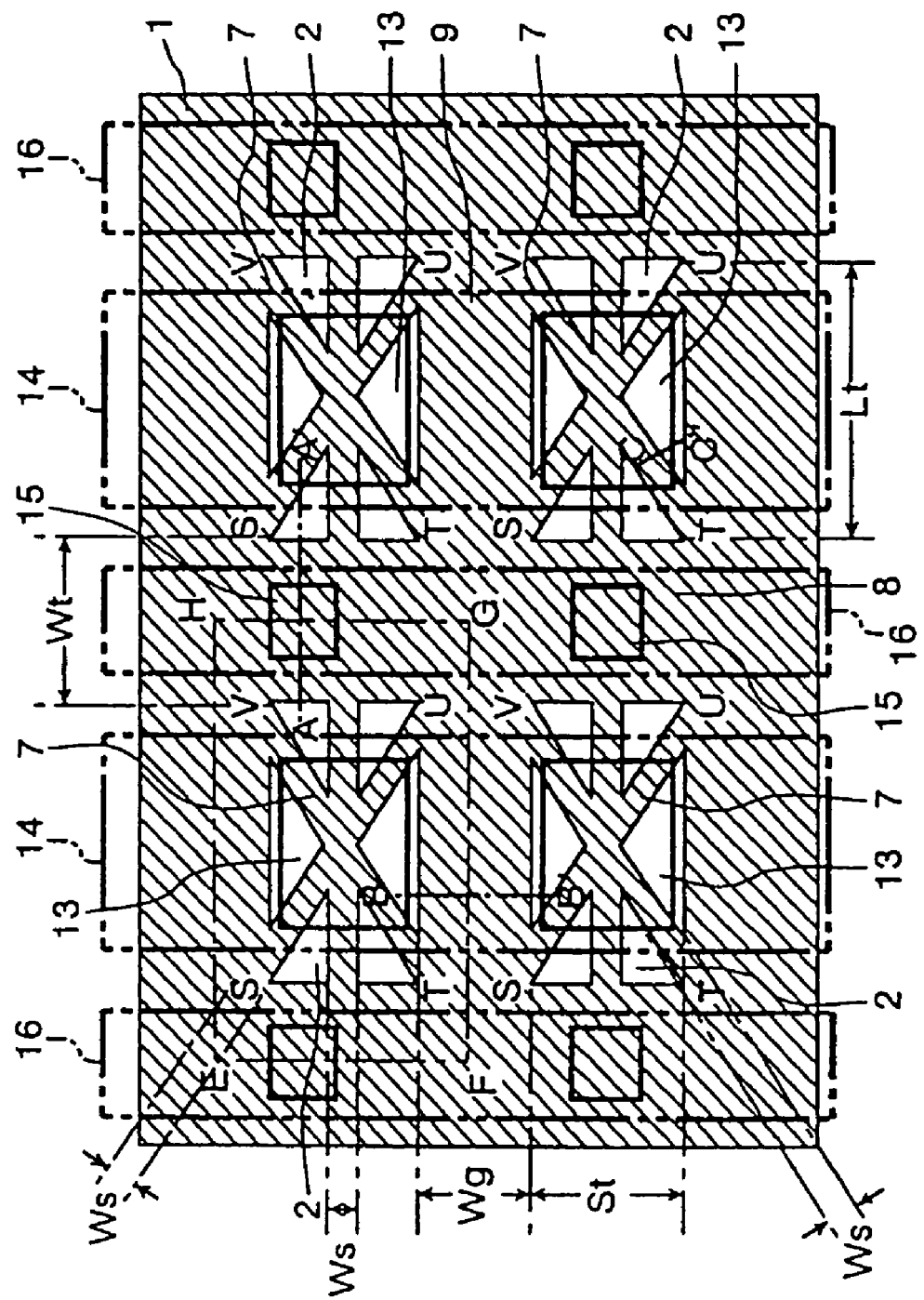
FIG. 9 illustrates a planar layout of a mesh-shaped trench pattern according to according to another embodiment of the present invention.

FIG. 9 illustrates a planar layout of a trench pattern of a semiconductor device according to another embodiment of the present invention. This embodiment is a combination of the embodiments of FIGS. 2 and 5, where a third trench section 7 is, in the basic pattern of the mesh-shaped trench pattern shown in FIG. 126, but made up of a section perpendicular to the longitudinal direction, a section with the center line thereof matching the diagonal TV of the non-trench region 2, and a section with the center line thereof matching the diagonal SU.

Therefore, in the embodiment of FIG. 9, each non-trench region 2 is divided into six smaller regions. In each non-trench region 2, the contact section 13 for the non-trench region 2 is formed in being spread over the six smaller regions. In the layout shown in FIG. 9, a channel width Wch and a channel density P in each rectangle EFGH are given by the following Equation (27) and Equation (28), respectively:

$$Wch = 2\left\{(2Lt + St + 2\sqrt{Lt^2 + St^2}) - Ws\left(\frac{(Lt + St + 2\sqrt{Lt^2 + St^2})(Lt + \sqrt{Lt^2 + St^2})}{LtSt}\right)\right\} \quad (27)$$

$$P = 2\left\{(2Lt + St + 2\sqrt{Lt^2 + St^2}) - Ws\left(\frac{(Lt + St + 2\sqrt{Lt^2 + St^2})(Lt + \sqrt{Lt^2 + St^2})}{LtSt}\right)\right\}/A \quad (28)$$

Here, Ws is determined so as to satisfy the following Equation:

$$Ws < \left(\frac{Lt}{St}\right)\frac{(-Lt + \sqrt{Lt^2 + St^2})(Lt + 2\sqrt{Lt^2 + St^2})(-Lt - St + 2\sqrt{Lt^2 + St^2})}{(3Lt^2 + 3St^2 - 2LtSt)}$$

As is apparent from the comparison of the above Equation (28) and the previous Equation (4), the channel density P obtained from the above Equation (28) becomes larger than the channel density P obtained from the previous Equation (4). Namely, in the trench pattern in FIG. 9, the channel density P becomes larger than in the pattern shown in FIG. 126.

Moreover, the third trench section 7 can be provided with an arrangement in which a plurality of sections parallel to the lateral direction are provided, can be provided with an arrangement in which a plurality of sections extending in the direction of the diagonal TV of the non-trench region 2 are provided, can be provided with an arrangement in which a plurality of sections extending in the direction of the diagonal SU of the non-trench region 2 are provided, or can be provided with an arrangement in which the above ones are combined as appropriate. Furthermore, for the diagonal section of the third trench section 7, it is not necessarily required that the center line thereof matches the diagonal TV or SU of the non-trench region 2. In addition, in each non-trench region 2, of the third trench sections 7, the number of the sections perpendicular to the longitudinal direction, the number of the sections extending in the direction of the diagonal TV of the non-trench region 2, and the number of the sections extending in the direction of the diagonal SU can be different.

Figure 10:
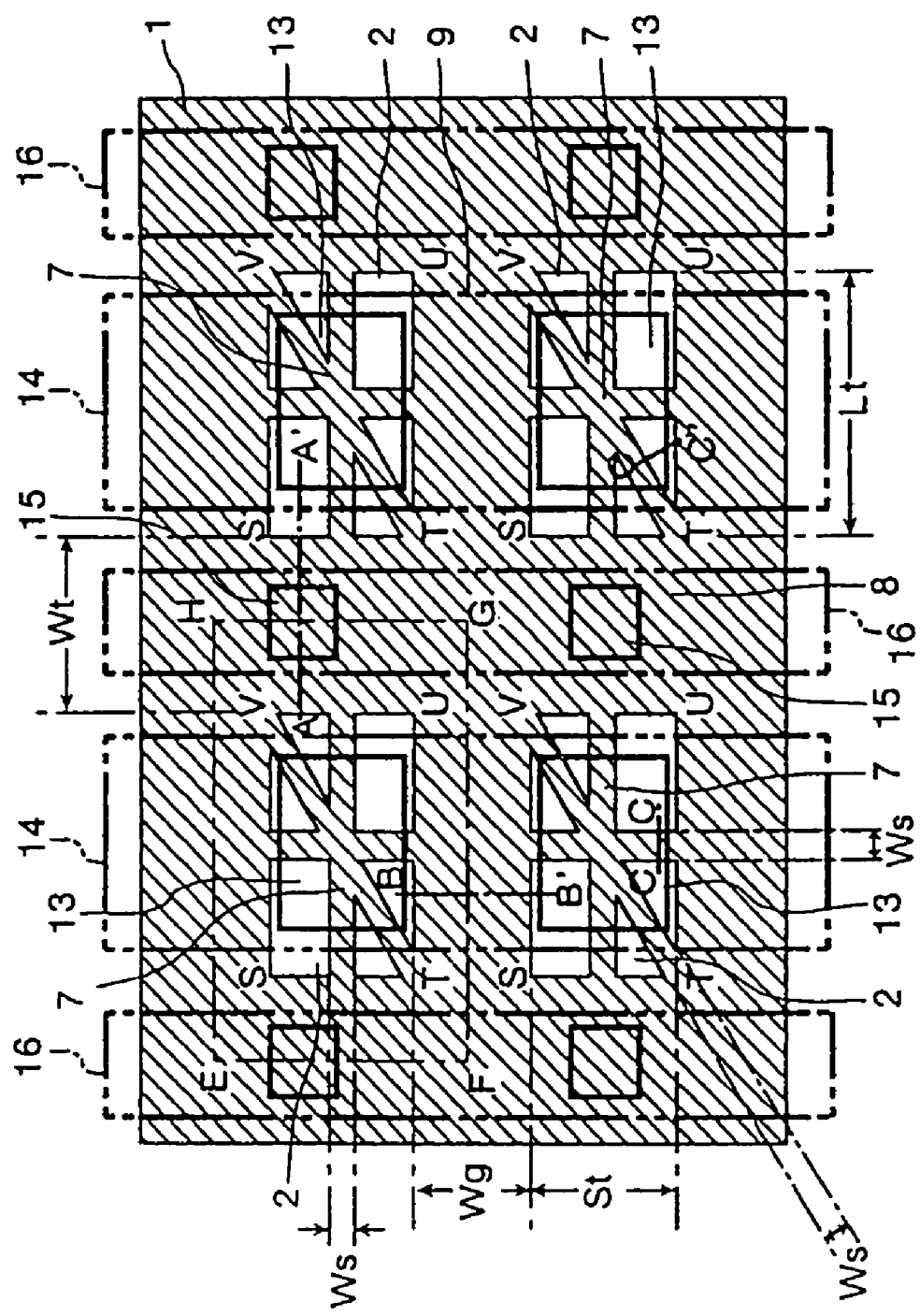
FIG. 10 illustrates a planar layout of a mesh-shaped trench pattern according to another embodiment of the present invention.

FIG. 10 illustrates a planar layout of a trench pattern of a semiconductor device according to another embodiment of the present invention. This embodiment is a combination of the embodiments of FIGS. 3 and 4, where a third trench section 7 is, in the basic pattern of the mesh-shaped trench pattern shown in FIG. 126, but made up of a section parallel to the longitudinal direction, a section parallel to the lateral direction, and a section with the center line thereof matching the diagonal TV of the non-trench region 2.

Therefore, in the embodiment of FIG. 10, each non-trench region 2 is divided into six smaller regions. In each non-trench region 2, the contact section 13 for the non-trench region 2 is formed spread over the six smaller regions. In the layout shown in FIG. 10, a channel width Wch and a channel density P in each rectangle EFGH are given by the following Equation (29) and Equation (30), respectively:

$$Wch = \left(4Lt + 4St + 2\sqrt{Lt^2 + St^2}\right) - \qquad (29)$$

$$Ws\left(8 + \frac{\left(3Lt + 3St + 2\sqrt{Lt^2 + St^2}\right)\left(\sqrt{Lt^2 + St^2}\right)}{LtSt}\right)$$

$$P = \left\{\left(4Lt + 4St + 2\sqrt{Lt^2 + St^2}\right) - \qquad (30)\right.$$

$$\left.Ws\left(8 + \frac{\left(3Lt + 3St + 2\sqrt{Lt^2 + St^2}\right)\left(\sqrt{Lt^2 + St^2}\right)}{LtSt}\right)\right\}/A$$

Here, Ws is determined so as to satisfy the following Equation:

$$Ws < \frac{2\left(Lt + St + \sqrt{Lt^2 + St^2}\right)}{\left(8 + \frac{\left(3Lt + 3St + 2\sqrt{Lt^2 + St^2}\right)\left(\sqrt{Lt^2 + St^2}\right)}{LtSt}\right)}$$

As is apparent from the comparison of the above Equation (30) and the previous Equation (4), the channel density P obtained from the above Equation (30) becomes larger than the channel density P obtained from the previous Equation (4). Namely, in the trench pattern in FIG. 10, the channel density P becomes larger than in the pattern shown in FIG. 126.

Moreover, the third trench sections 7 can be provided with an arrangement in which a plurality of sections parallel to the longitudinal direction are provided, can be provided with an arrangement in which a plurality of sections parallel to the lateral direction are provided, can be provided with an arrangement in which a plurality of sections extending in the direction of the diagonal TV of the non-trench region 2 are provided, or can be provided with an arrangement in which the above ones are combined as appropriate. Furthermore, the third trench section 7 can be arranged with a section parallel to the longitudinal direction of the first trench section 8, a section parallel to the lateral direction, and a section extending in the direction of the diagonal SU of the non-trench region 2.

In addition, the non-trench region 2 in which the diagonal section of the third trench section 7 extends in the direction of the diagonal TV and the non-trench region 2 in which the diagonal section of the third trench section 7 extends in the direction of the diagonal SU can be mixed. Moreover, for the diagonal section of the third trench section 7, it is not necessarily required that the center line thereof matches the diagonal TV or SU of the non-trench region 2. Furthermore, in each non-trench region 2, of the third trench sections 7, the number of the sections parallel to the longitudinal direction, the number of the sections parallel to the lateral direction, and the number of the sections extending in the direction of the diagonal TV or SU of the non-trench region 2 can be different.

Figure 11:
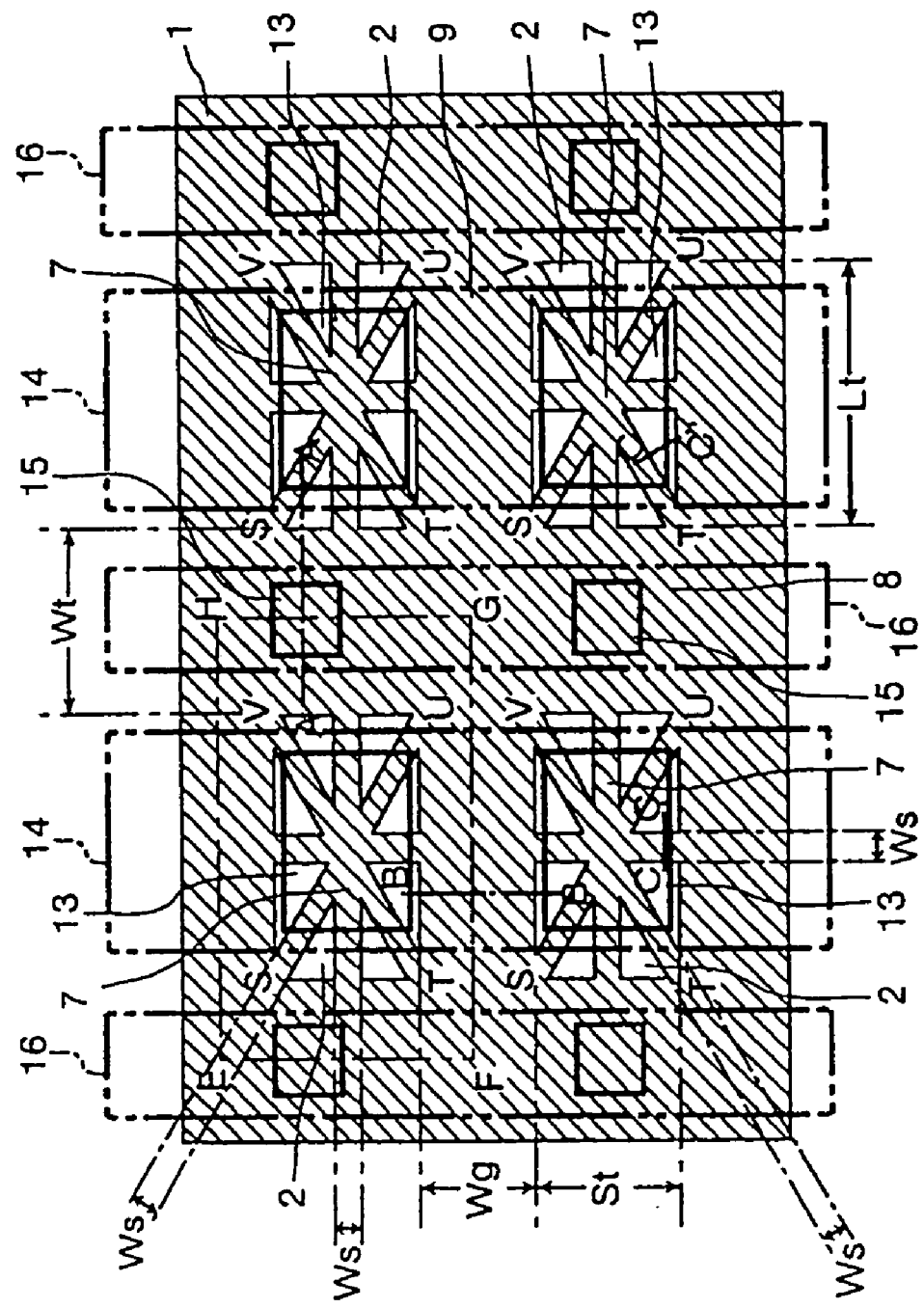
FIG. 11 illustrates a planar layout of a mesh-shaped trench pattern according to another embodiment of the present invention.

FIG. 11 illustrates a planar layout of a trench pattern of a semiconductor device according to another embodiment of the present invention. This embodiment is a combination of the embodiments of FIGS. 3 and 5. Namely, a third trench section 7 is, in the basic pattern of the mesh-shaped trench pattern shown in FIG. 126, but made up of a section parallel to the longitudinal direction, a section parallel to the lateral direction, a section with the center line thereof matching the diagonal TV of the non-trench region 2, and a section with the center line thereof matching the diagonal SU.

Therefore, in FIG. 11, each non-trench region 2 is divided into eight smaller regions. In each non-trench region 2, the contact section 13 for the non-trench region 2 is spread over the eight smaller regions. In the layout shown in FIG. 11, a channel width Wch and a channel density P in each rectangle EFGH are given by the following Equation (31) and Equation (32), respectively:

$$Wch = 2\left(Lt + St + \sqrt{Lt^2 + St^2}\right) \qquad (31)$$

$$\left(2 - Ws \cdot \frac{\left(Lt + St + 2\sqrt{Lt^2 + St^2}\right)}{LtSt}\right)$$

$$P = 2\left(Lt + St + \sqrt{Lt^2 + St^2}\right) \qquad (32)$$

$$\left(2 - Ws \cdot \frac{\left(Lt + St + 2\sqrt{Lt^2 + St^2}\right)}{LtSt}\right)/A$$

Here, Ws is determined so as to satisfy the following Equation:

$$Ws < \frac{\left(Lt + St - \sqrt{Lt^2 + St^2}\right)}{2}$$

As is apparent from the comparison of the above Equation (32) and the previous Equation (4), the channel density P obtained from the above Equation (32) becomes larger than the channel density P obtained from the previous Equation (4). Namely, in the trench pattern of FIG. 11, the channel density P becomes larger than in the pattern shown in FIG. 126.

Moreover, the third trench sections 7 can be provided with an arrangement in which a plurality of sections parallel to the longitudinal direction are provided, and can be provided with an arrangement in which a plurality of sections parallel to the lateral direction are provided. Furthermore, the third trench section 7 can be provided with an arrangement in which a plurality of sections extending in the direction of the diagonal TV of the non-trench region 2 are provided, and can be provided with an arrangement in which a plurality of sections extending in the direction of the diagonal SU are provided. In addition, the third trench section 7 can be also provided with an arrangement in which the above arrangements are combined as appropriate.

Moreover, for the diagonal section of the third trench section 7, it is not necessarily required that the center line thereof matches the diagonal TV or SU of the non-trench region 2. Furthermore, in each non-trench region 2, of the third trench sections 7, the number of the sections parallel to the longitudinal direction, the number of the sections parallel to the lateral direction, the number of the sections extending in the direction of the diagonal TV of the non-trench region 2, and the number of the sections extending in the direction of the diagonal SU can be different.

As explained above in detail, according to the embodiment of FIGS. 1–11, with the size of the contact in the non-trench region 2 being made equal to the size in the mesh pattern shown in FIG. 126, the channel density P can be made larger than that in the mesh pattern shown in FIG. 126. This can inhibit contact resistance. Moreover, occurrence of failure in continuity due to failure in contact hole opening can be prevented. Therefore, low on-resistance can be provided while high conductivity of the contact section between a semiconductor and an electrode is secured.

Figure 24:
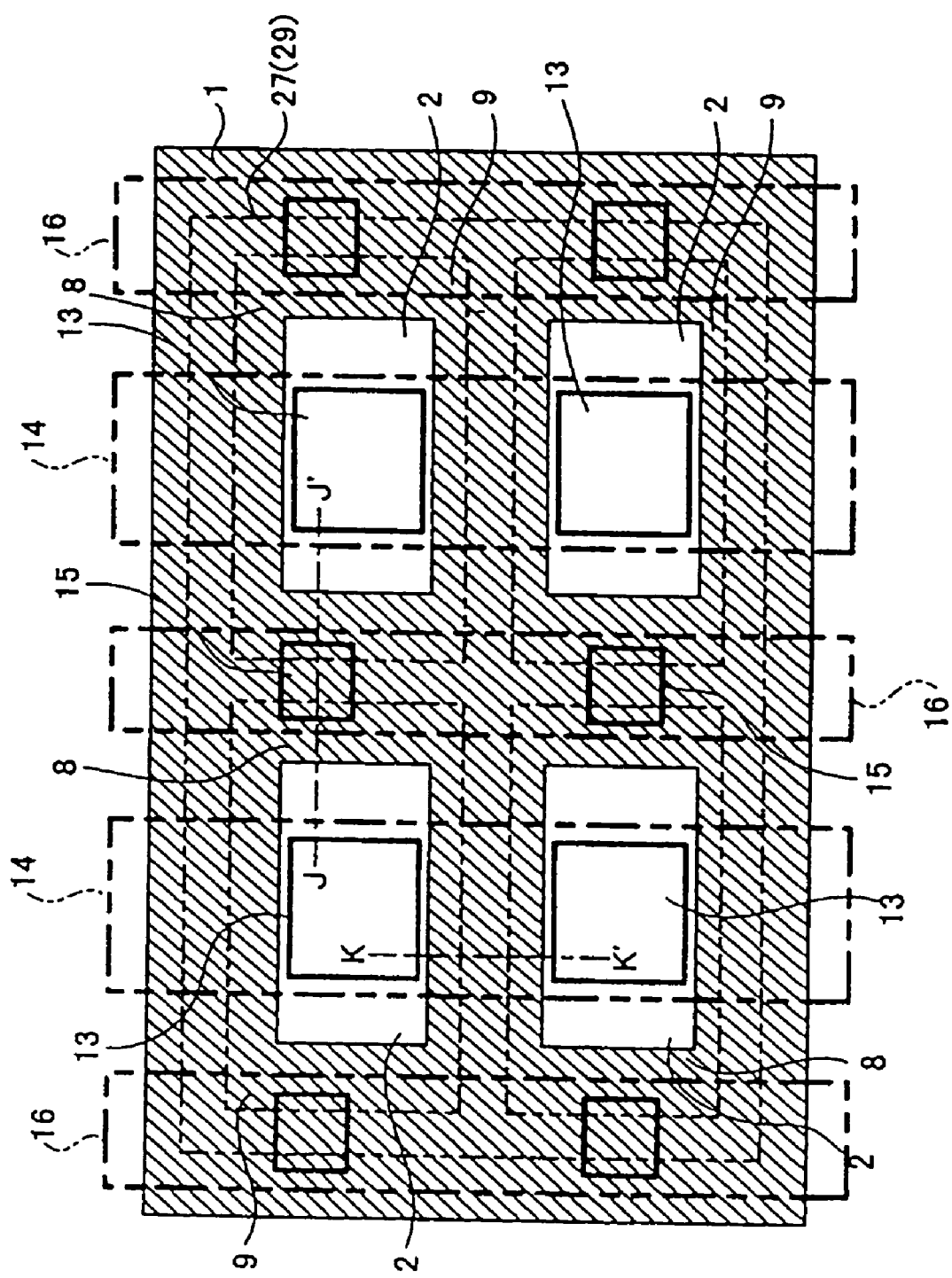
FIG. 24 illustrates a planar layout of a mesh-shaped trench pattern according to another embodiment of the present invention.

Up to here, explanations were made about that a channel density P was made increased by mainly changing variously the planar pattern of the trench for providing low on-resistance. In another embodiment, low on-resistance can be achieved by providing a source region (or a drain region) as the first diffusion region not only at the bottom of the trench in the active region but also at the bottom of the trench in the gate region. Forming the source region (or the drain region) as the first diffusion region at the bottom of the trench in the gate region increases the amount of current passing around to the trench side in the gate region. This makes it become possible to provide sufficiently low on-resistance. FIG. 24 illustrates a planar layout of a trench pattern of a semiconductor device according to this arrangement. As shown in FIG. 24, a source region 27 (or a drain region 29) as the first diffusion region is provided along the bottom of the first trench section 8 formed in the active region and the bottom of the second trench section 9 formed in the gate region. Incidentally, although not particularly referred to in FIGS. 1–11, in FIG. 24, each of the trench sections extending in the longitudinal direction at the left end and the right end is the first trench section 8, and thus the active region. Moreover, in FIG. 24, each of the trench sections extending in the lateral direction at the upper end and the lower end is the second trench section 9, and thus the gate region. Next, the cross sectional structures and the manufacturing methods of the TLPM of FIG. 12 will be specifically explained.

Figure 25:
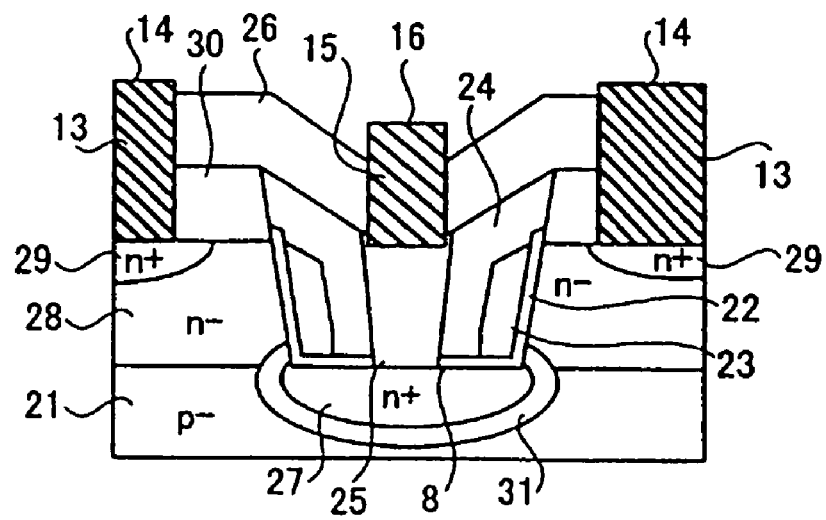
FIG. 25 illustrates a cross sectional structure in an active region of a fifth TLPM applicable to the mesh-shaped trench pattern according to the invention.
Figure 26:
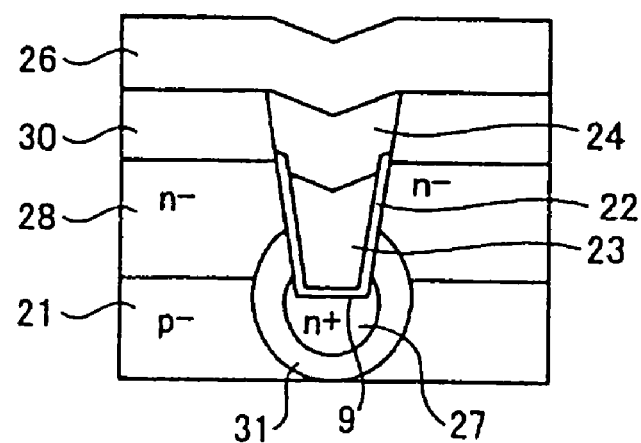
FIG. 26 illustrates a cross sectional structure in a gate region of the fifth TLPM applicable to the mesh-shaped trench pattern according to the invention.

FIGS. 25–26 each illustrate a cross sectional structure of a TLPM with a one-step trench structure in which the source region is presented at the a bottom of the trench, where FIG. 25 is taken along line J–J' and FIG. 26 taken along line K–K'. As shown in FIG. 25, the cross sectional arrangement in the active region is one in which no p⁻-body region 32 is provided in the cross sectional arrangement in the active region in the first example shown in FIG. 12. As shown in FIG. 26, in the gate region, at the bottom of the second trench section 9 formed in the p⁻-semiconductor substrate 21, the n⁺-source region 27 as the first diffusion region is provided. Moreover, at the bottom of the second trench section 9, the p-base region 31 to become a channel region surrounds the n⁺-source regions 27.

The second trench section 9 is filled with the gate polysilicon 23 with the gate insulator film 22 interposed therebetween. On the gate polysilicon 23, there is provided the interlayer insulator film 24. The outside of the second trench section 9 is the n⁻-drain region 28 that is to become an expanded drain region. On the n⁻-drain region 28, there is provided the mask oxide film 30. On the interlayer insulator film 24 and the mask oxide film 30, the interlayer insulator film 26 is further deposited.

Figure 27:
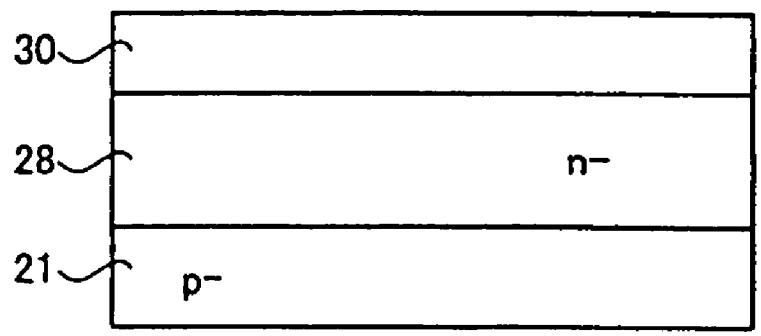
FIG. 27 illustrates a cross sectional structure of the fifth TLPM applicable to the mesh-shaped trench pattern according to the invention in the course of manufacture.
Figure 28:
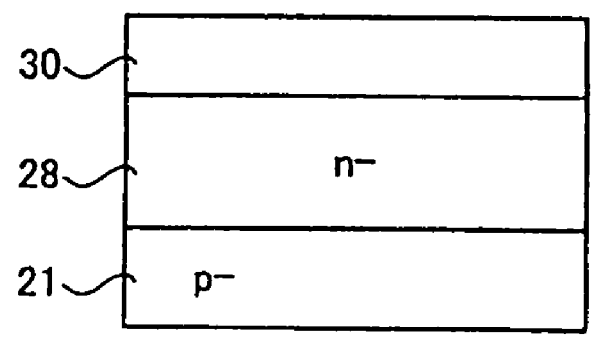
FIG. 28 illustrates a cross sectional structure of the fifth TLPM applicable to the mesh-shaped trench pattern according to the invention in the course of manufacture.
Figure 29:
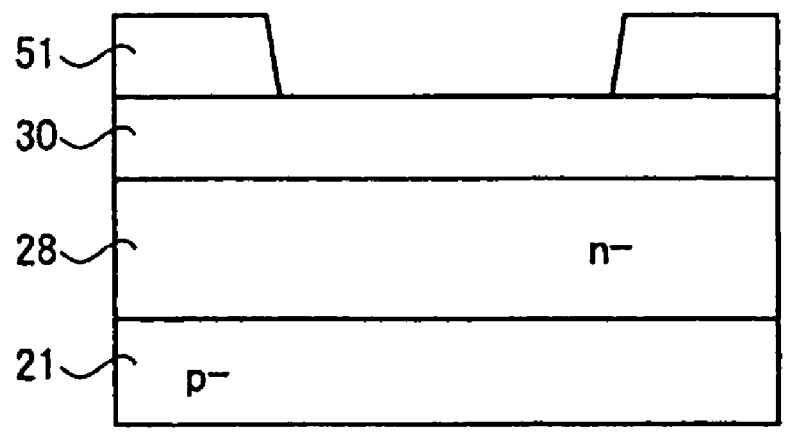
FIG. 29 illustrates a cross sectional structure of the fifth TLPM applicable to the mesh-shaped trench pattern according to the invention in the course of manufacture.
Figure 30:
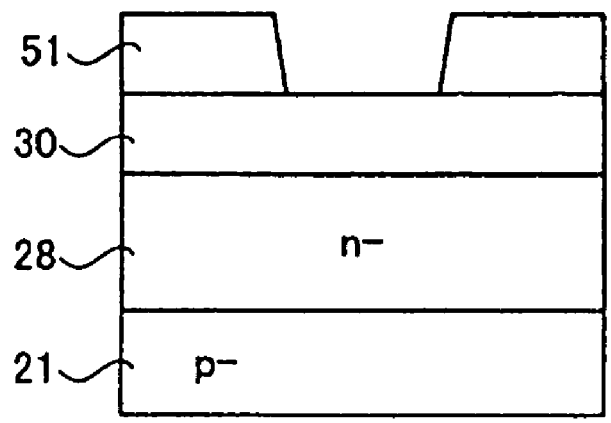
FIG. 30 illustrates a cross sectional structure of the fifth TLPM applicable to the mesh-shaped trench pattern according to the invention in the course of manufacture.
Figure 31:
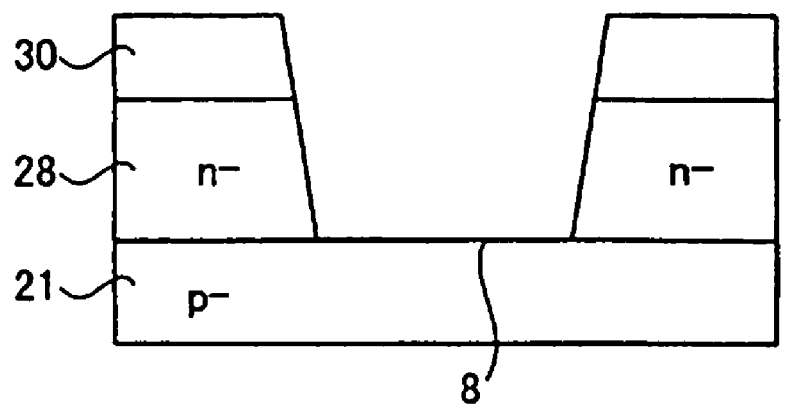
FIG. 31 illustrates a cross sectional structure of the fifth TLPM applicable to the mesh-shaped trench pattern according to the invention in the course of manufacture.
Figure 32:
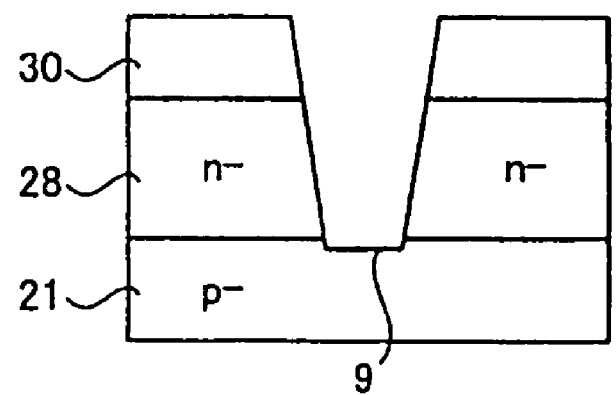
FIG. 32 illustrates a cross sectional structure of the fifth TLPM applicable to the mesh-shaped trench pattern according to the invention in the course of manufacture.
Figure 33:
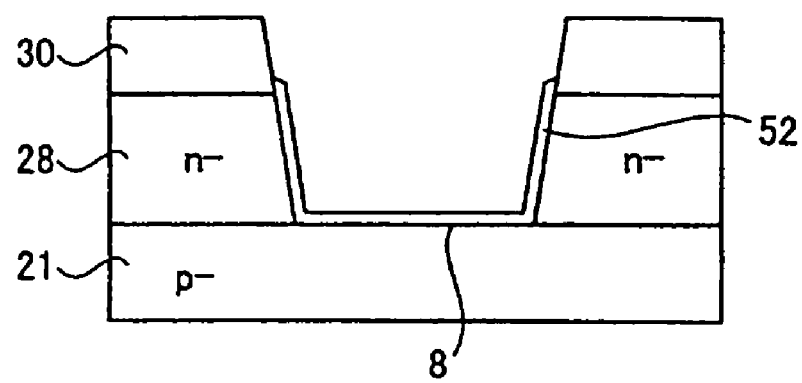
FIG. 33 illustrates a cross sectional structure of the fifth TLPM applicable to the mesh-shaped trench pattern according to the invention in the course of manufacture.
Figure 34:
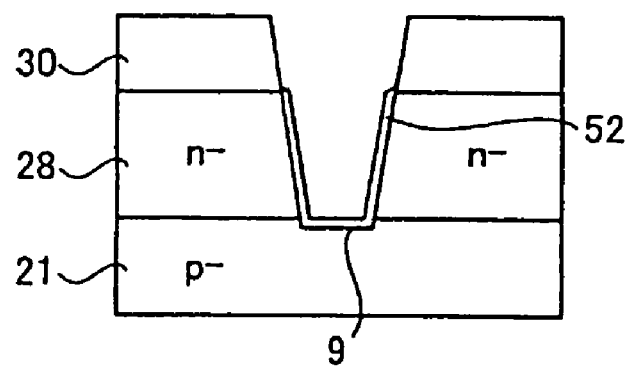
FIG. 34 illustrates a cross sectional structure of the fifth TLPM applicable to the mesh-shaped trench pattern according to the invention in the course of manufacture.
Figure 35:
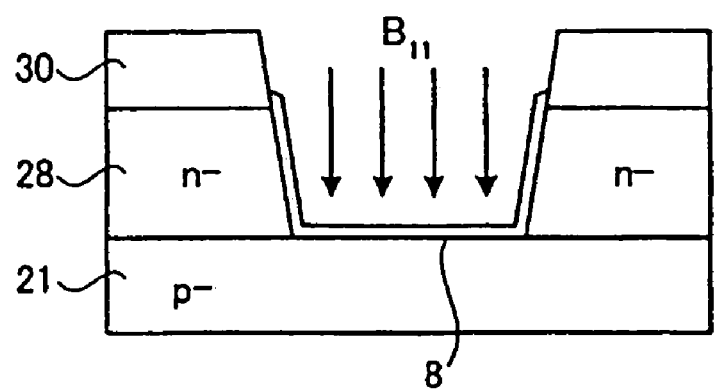
FIG. 35 illustrates a cross sectional structure of the fifth TLPM applicable to the mesh-shaped trench pattern according to the invention in the course of manufacture.
Figure 36:
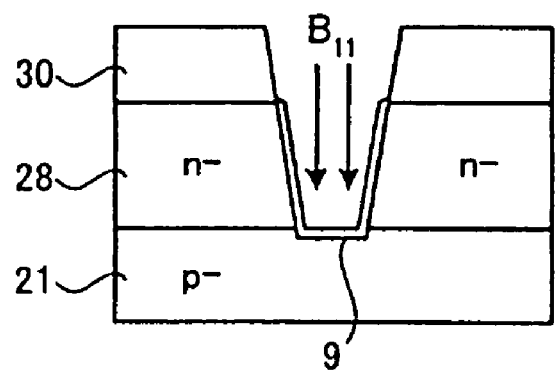
FIG. 36 illustrates a cross sectional structure of the fifth TLPM applicable to the mesh-shaped trench pattern according to the invention in the course of manufacture.
Figure 37:
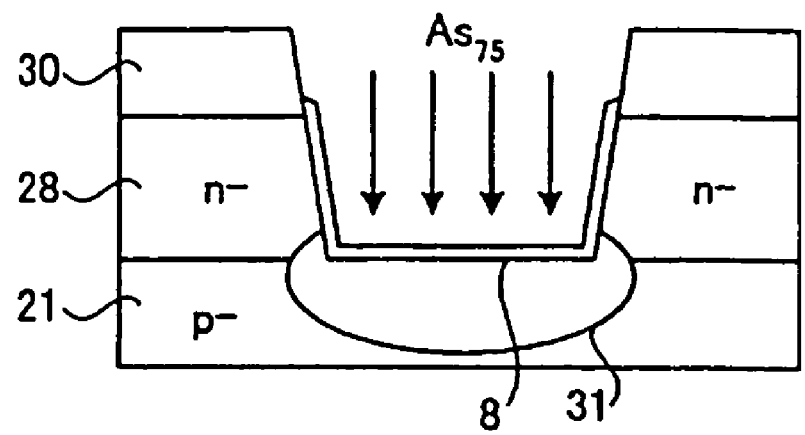
FIG. 37 illustrates a cross sectional structure of the fifth TLPM applicable to the mesh-shaped trench pattern according to the invention in the course of manufacture.
Figure 38:
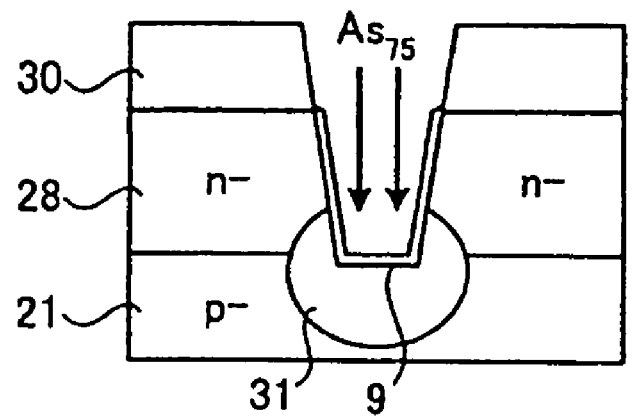
FIG. 38 illustrates a cross sectional structure of the fifth TLPM applicable to the mesh-shaped trench pattern according to the invention in the course of manufacture.
Figure 39:
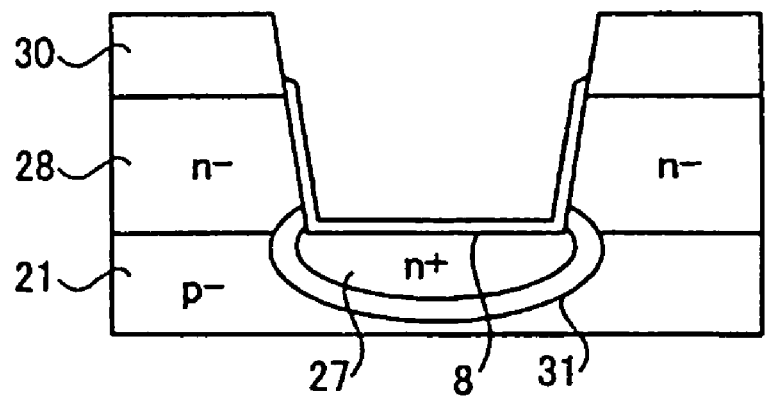
FIG. 39 illustrates a cross sectional structure of the fifth TLPM applicable to the mesh-shaped trench pattern according to the invention in the course of manufacture.
Figure 40:
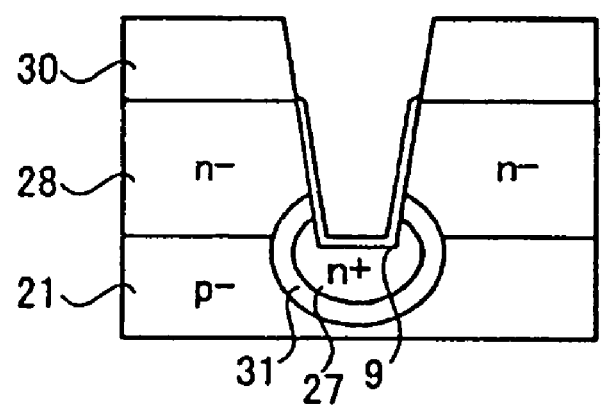
FIG. 40 illustrates a cross sectional structure of the fifth TLPM applicable to the mesh-shaped trench pattern according to the invention in the course of manufacture.

An explanation will be made about a manufacturing process of the TLPM, having cross sectional arrangements shown in FIG. 25 and FIG. 26, with reference to FIG. 27 to FIG. 56. First, on the p⁻-semiconductor substrate 21, the n⁻-drain region 28 is formed. On the surface of the n⁻-drain region 28, the mask oxide film 30 is formed (FIG. 27: the active region, FIG. 28: the gate region). Moreover, on the surface of the mask oxide film 30, a resist mask 51 for a mesh pattern is formed (FIG. 29: the active region, FIG. 30: the gate region). Next, in the mask oxide film 30, a mesh-shaped trench pattern shown in FIG. 24, for example, is formed. Using the mask oxide film 30 as a mask, trench etching is carried out to form the first and second trench sections 8 and 9 (FIG. 31: the active region, FIG. 32: the gate region). Then, sacrifice oxidation is carried out to form a sacrifice oxide film 52 in the first and second trench sections 8 and 9 (FIG. 33: the active region, FIG. 34: the gate region). Subsequently, onto each bottom surface of the first and second trench sections 8 and 9, ion implantation is carried out with boron ions, for example, as p-type impurities, and thereby p-base region 31 is formed (FIG. 35: the active region, FIG. 36: the gate region). Following the formation of the p-base region 31, onto each bottom surface of the first and second trench sections 8 and 9, ion implantation is carried out with arsenic ions, for example, as n-type impurities (FIG. 37: the active region, FIG. 38: the gate region). Moreover, the n⁺-source region 27 is formed (FIG. 39: the active region, FIG. 40: the gate region).

Figure 41:
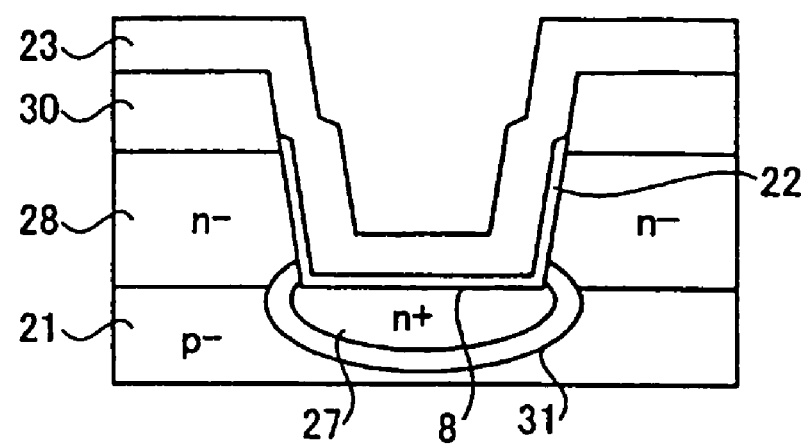
FIG. 41 illustrates a cross sectional structure of the fifth TLPM applicable to the mesh-shaped trench pattern according to the invention in the course of manufacture.
Figure 42:
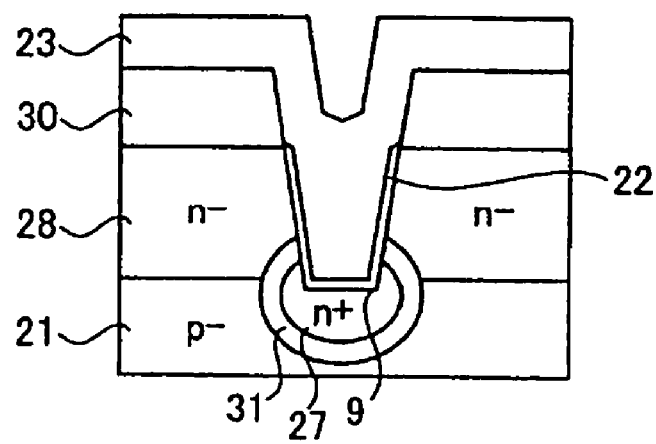
FIG. 42 illustrates a cross sectional structure of the fifth TLPM applicable to the mesh-shaped trench pattern according to the invention in the course of manufacture.
Figure 43:
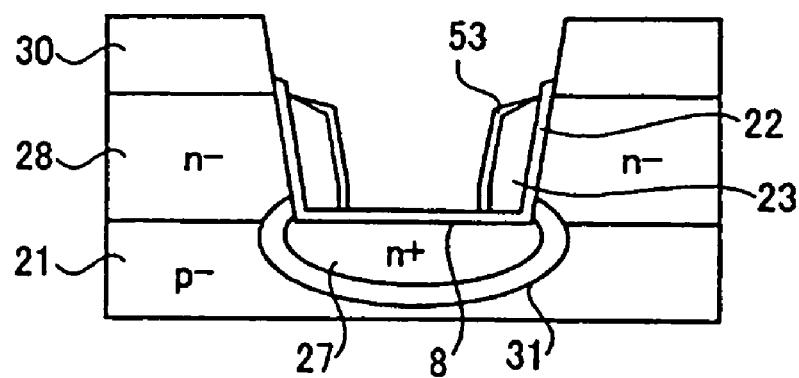
FIG. 43 illustrates a cross sectional structure of the fifth TLPM applicable to the mesh-shaped trench pattern according to the invention in the course of manufacture.
Figure 44:
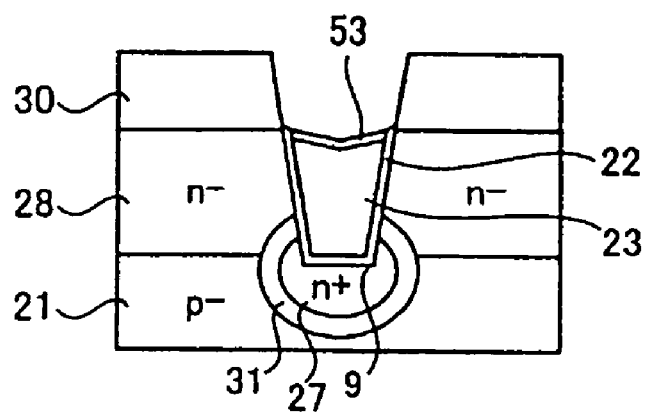
FIG. 44 illustrates a cross sectional structure of the fifth TLPM applicable to the mesh-shaped trench pattern according to the invention in the course of manufacture.

After subsequent removal of the sacrifice oxide film 52, the gate insulator film 22 is formed in each of the first and second trench sections 8 and 9, and the gate polysilicon 23 is deposited (FIG. 41: the active region, FIG. 42: the gate region). Then, the gate polysilicon 23 is subjected to etching and shadow oxidation to form a shadow oxide film 53 (FIG. 43: the active region, FIG. 44: the gate region). In the active region, the gate polysilicon 23 is left only on the side wall of the first trench section 8. In the gate region, the opening width of the second trench section 9 is narrower than the opening width of the first trench section 8. Thus, the second trench section 9 is completely filled with the gate polysilicon 23.

Figure 45:
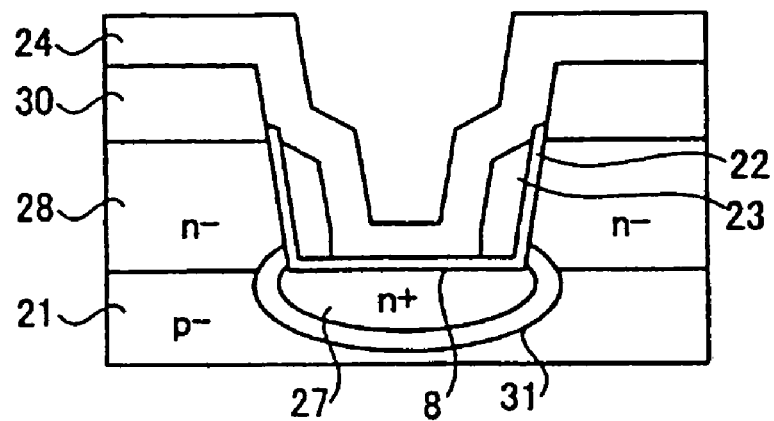
FIG. 45 illustrates a cross sectional structure of the fifth TLPM applicable to the mesh-shaped trench pattern according to the invention in the course of manufacture.
Figure 46:
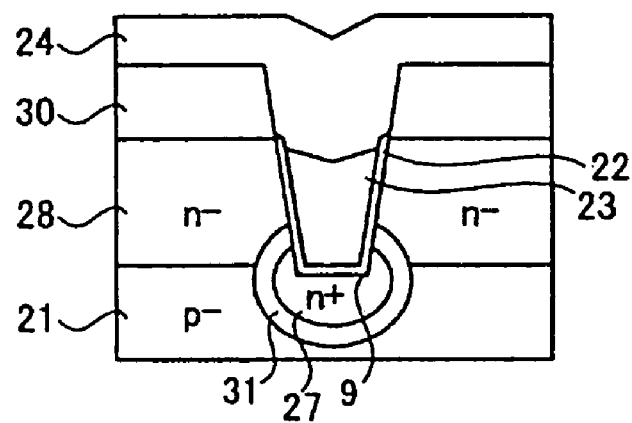
FIG. 46 illustrates a cross sectional structure of the fifth TLPM applicable to the mesh-shaped trench pattern according to the invention in the course of manufacture.
Figure 47:
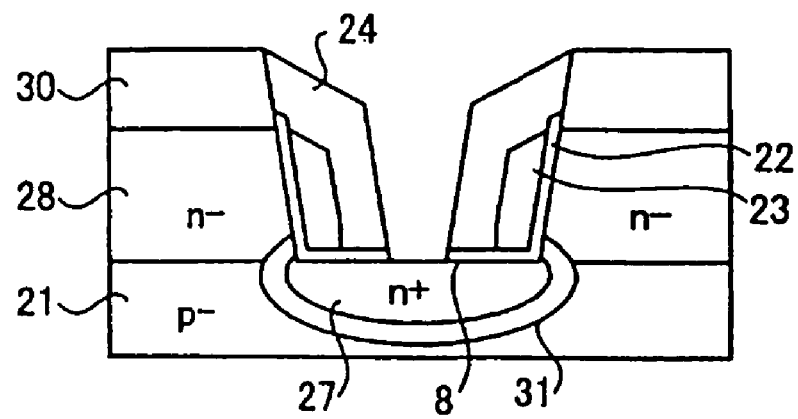
FIG. 47 illustrates a cross sectional structure of the fifth TLPM applicable to the mesh-shaped trench pattern according to the invention in the course of manufacture.
Figure 48:
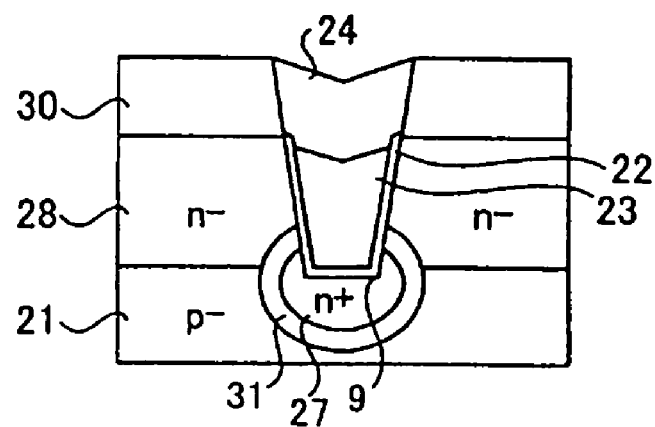
FIG. 48 illustrates a cross sectional structure of the fifth TLPM applicable to the mesh-shaped trench pattern according to the invention in the course of manufacture.
Figure 49:
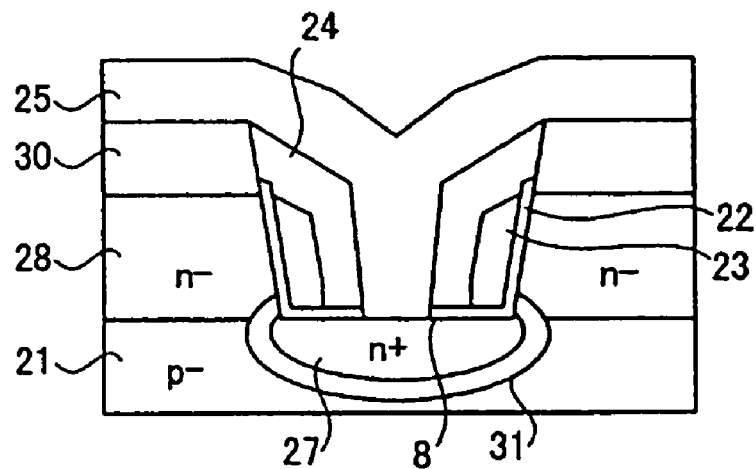
FIG. 49 illustrates a cross sectional structure of the fifth TLPM applicable to the mesh-shaped trench pattern according to the invention in the course of manufacture.
Figure 50:
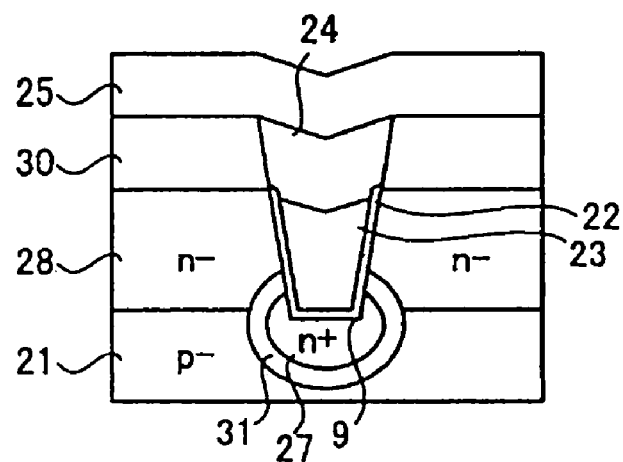
FIG. 50 illustrates a cross sectional structure of the fifth TLPM applicable to the mesh-shaped trench pattern according to the invention in the course of manufacture.
Figure 51:
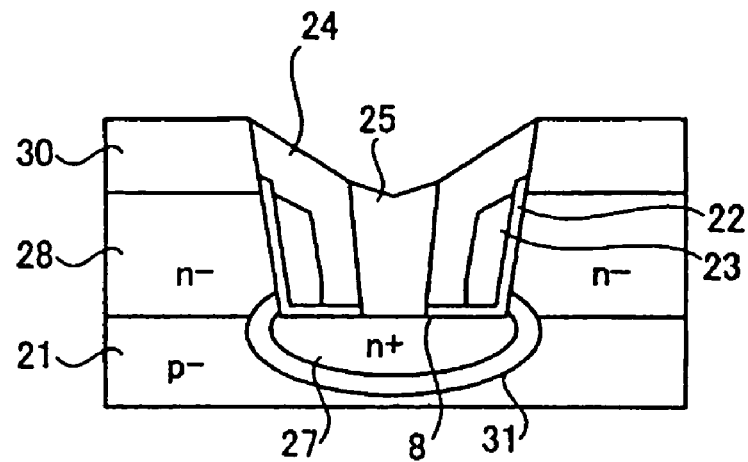
FIG. 51 illustrates a cross sectional structure of the fifth TLPM applicable to the mesh-shaped trench pattern according to the invention in the course of manufacture.
Figure 52:
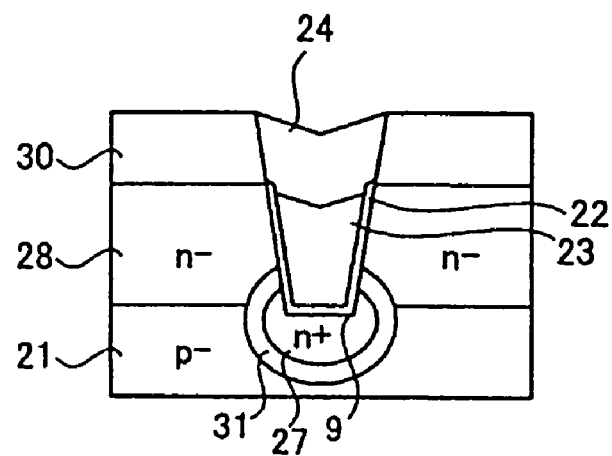
FIG. 52 illustrates a cross sectional structure of the fifth TLPM applicable to the mesh-shaped trench pattern according to the invention in the course of manufacture.

Next, an interlayer insulator film 24 is deposited (FIG. 45: the active region, FIG. 46: the gate region). The interlayer insulator film 24 is then subjected to etching (FIG. 47: the active region, FIG. 48: the gate region). The etching opens a contact hole in the active region at the bottom of the first trench section 8. Moreover, in the gate region, the interlayer insulator film 24 is left on the gate polysilicon 23. Subsequently, the source polysilicon 25 is deposited (FIG. 49: the active region, FIG. 50: the gate region). The source polysilicon 25 is subjected to etching (FIG. 51: the active region, FIG. 52: the gate region). The etching leaves in the active region the source polysilicon 25 only in the contact hole opened in the first trench section 8, which causes the contact hole to be filled with the source polysilicon 25. In the gate region, no source polysilicon 25 is left.

Figure 53:
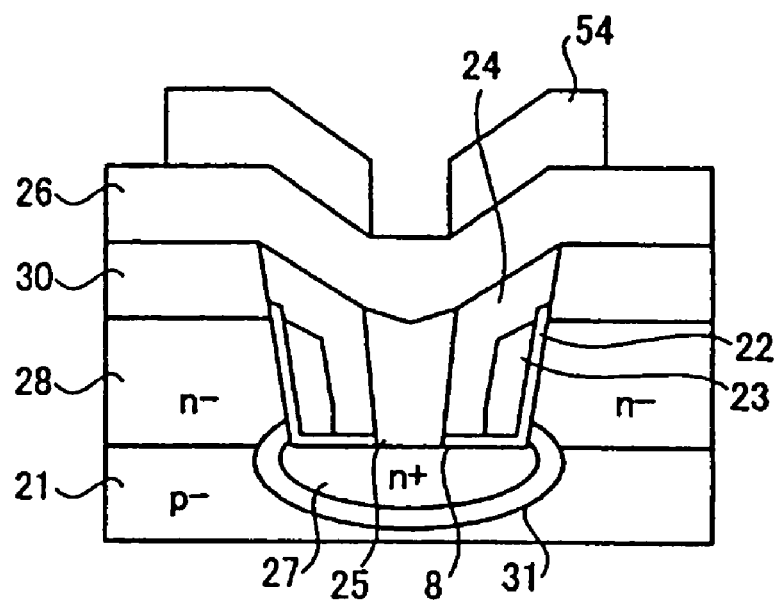
FIG. 53 illustrates a cross sectional structure of the fifth TLPM applicable to the mesh-shaped trench pattern according to the invention in the course of manufacture.
Figure 54:
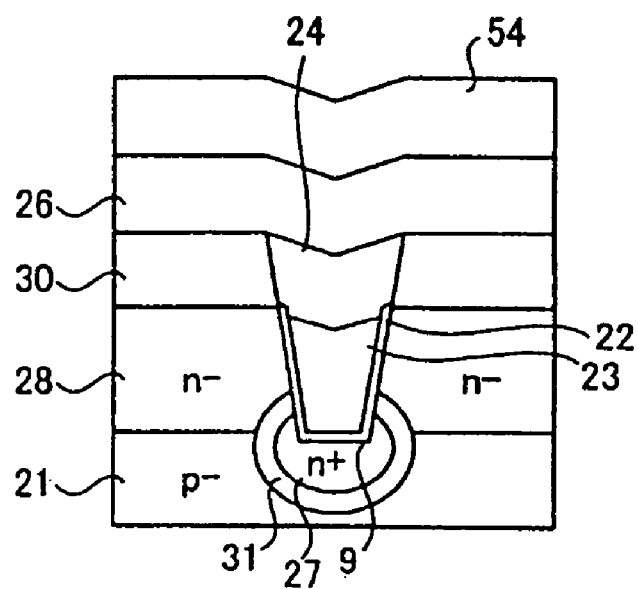
FIG. 54 illustrates a cross sectional structure of the fifth TLPM applicable to the mesh-shaped trench pattern according to the invention in the course of manufacture.
Figure 55:
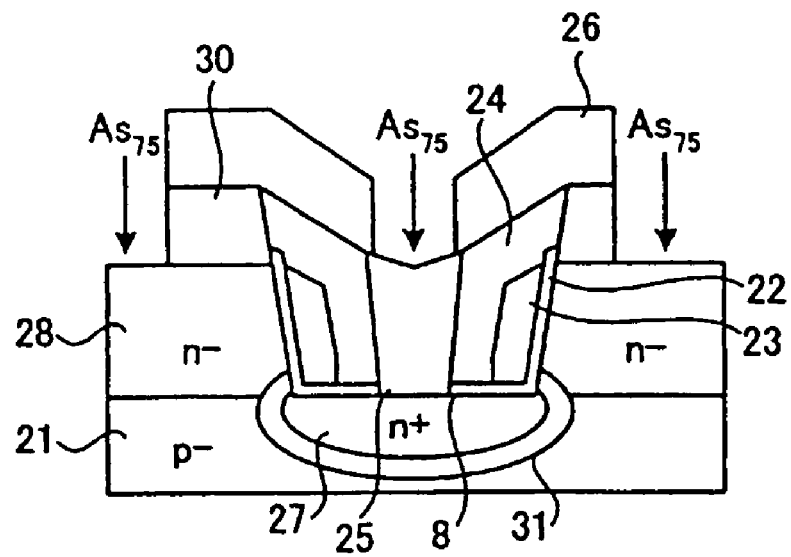
FIG. 55 illustrates a cross sectional structure of the fifth TLPM applicable to the mesh-shaped trench pattern according to the invention in the course of manufacture.
Figure 56:
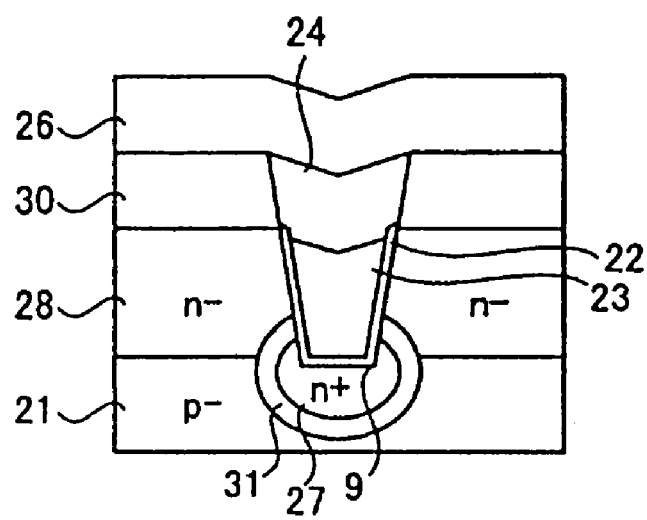
FIG. 56 illustrates a cross sectional structure of the fifth TLPM applicable to the mesh-shaped trench pattern according to the invention in the course of manufacture.

Thereafter, the interlayer insulator film 26 is deposited on the surface of which a resist mask 54 is formed (FIG. 53: the active region, FIG. 54: the gate region). With the resist mask 54 used as a mask, contact holes, penetrating through the interlayer insulator film 26 and the mask oxide film 30, are opened for carrying out ion implantation with arsenic ions, for example, as n-type impurities (FIG. 55: the active region, FIG. 56: the gate region). Then, diffusion processing is carried out to form the n⁺-drain regions 29. Finally, by depositing metal interconnection layer and patterning the layer, the contact sections 13 and 15, the first electrode (the drain electrode) 14 and the second electrode (the source electrode) 16 are formed to complete the cross sectional arrangements shown in FIG. 25 and FIG. 26.

Figure 57:
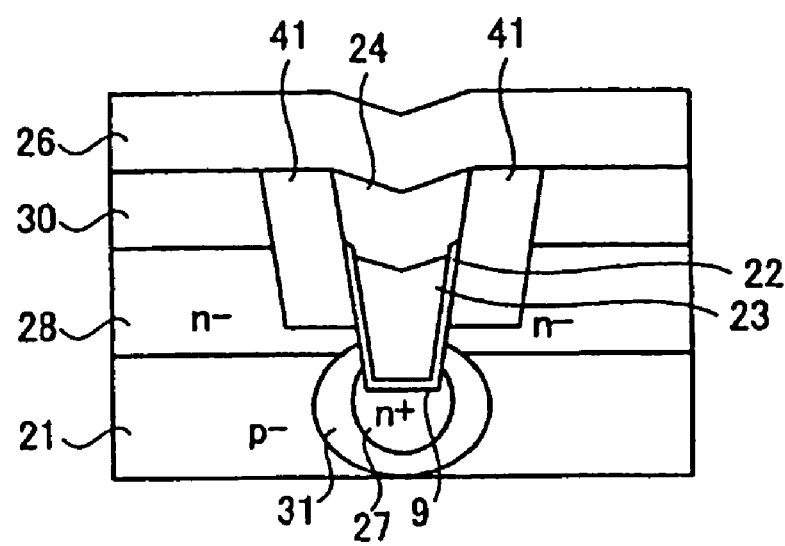
FIG. 57 illustrates a cross sectional structure in a gate region of a sixth TLPM applicable to the mesh-shaped trench pattern according to the invention.

FIG. 57 illustrates a cross sectional structure of a TLPM with a two-step trench structure in which the source region is presented at the bottom of the trench. The cross sectional arrangement in the active region taken along line J–J' of FIG. 24 is an arrangement in which, in the arrangement shown in FIG. 25, along an upper half section of the side wall of the first trench section 8, an interlayer insulator film 41 thicker than the gate insulator film 22 is provided, which is the same as the arrangement shown in FIG. 18. Moreover, the cross sectional arrangement in the active region shown by the cutting plane line K–K' of FIG. 24 is an arrangement in which, in the arrangement shown in FIG. 26, along an upper half section of the side wall of the second trench section 9, an interlayer insulator film 41 thicker than the gate insulator film 22 is provided.

An explanation will be made about a manufacturing process of the TLPM, having cross sectional arrangements shown in FIGS. 18 and 57, with reference to FIGS. 58–71. First, like in the above-explained fifth example, on the p⁻-semiconductor substrate 21, the n⁻-drain region 28 is formed. On the surface of the n⁻-drain region 28, the mask oxide film 30 is formed. Moreover, the first and second trench sections (the first step) 8 and 9 are formed, inside which a sacrifice oxide film 52 is formed (FIGS. 27–34).

Figure 58:
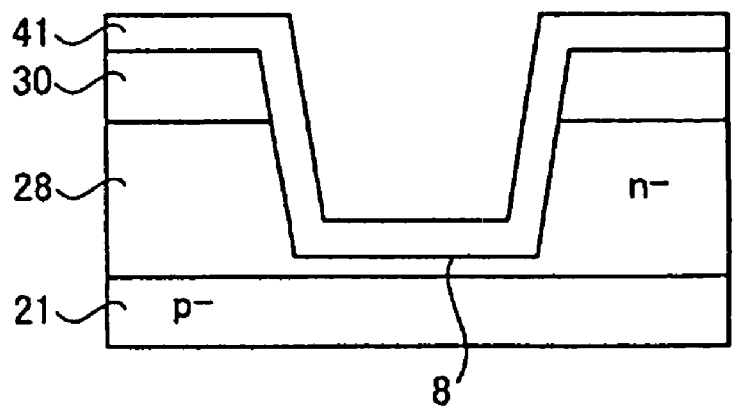
FIG. 58 illustrates a cross sectional structure of the sixth TLPM applicable to the mesh-shaped trench pattern according to the invention in the course of manufacture.
Figure 59:
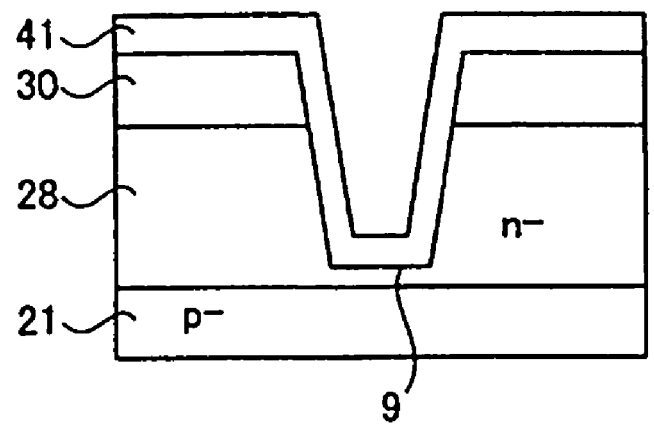
FIG. 59 illustrates a cross sectional structure of the sixth TLPM applicable to the mesh-shaped trench pattern according to the invention in the course of manufacture.
Figure 60:
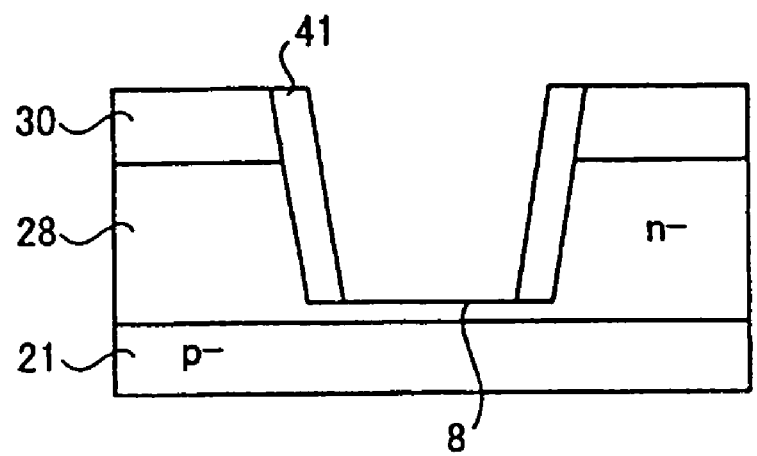
FIG. 60 illustrates a cross sectional structure of the sixth TLPM applicable to the mesh-shaped trench pattern according to the invention in the course of manufacture.
Figure 61:
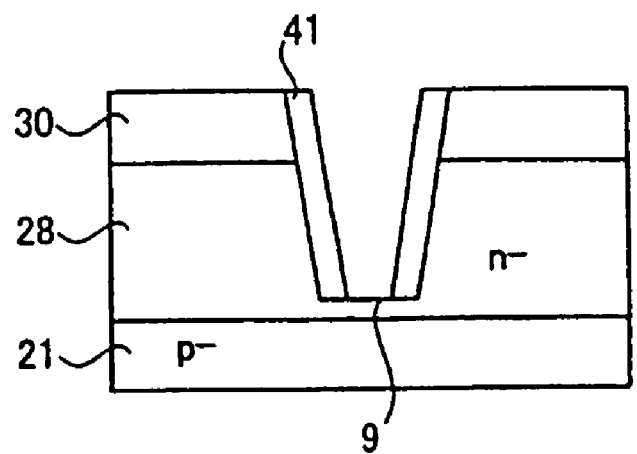
FIG. 61 illustrates a cross sectional structure of the sixth TLPM applicable to the mesh-shaped trench pattern according to the invention in the course of manufacture.
Figure 62:
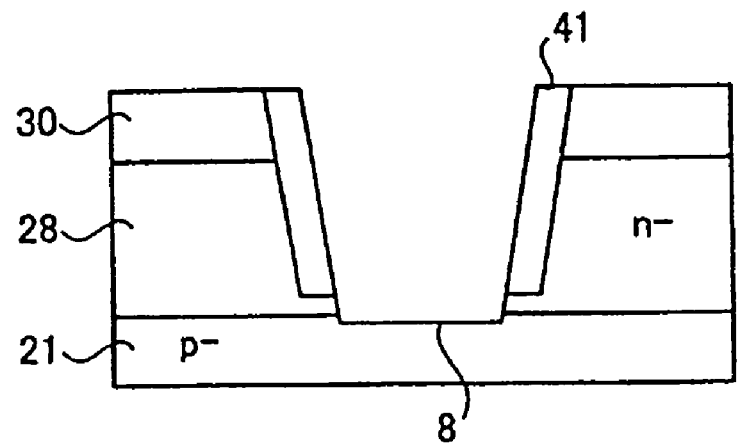
FIG. 62 illustrates a cross sectional structure of the sixth TLPM applicable to the mesh-shaped trench pattern according to the invention in the course of manufacture.
Figure 63:
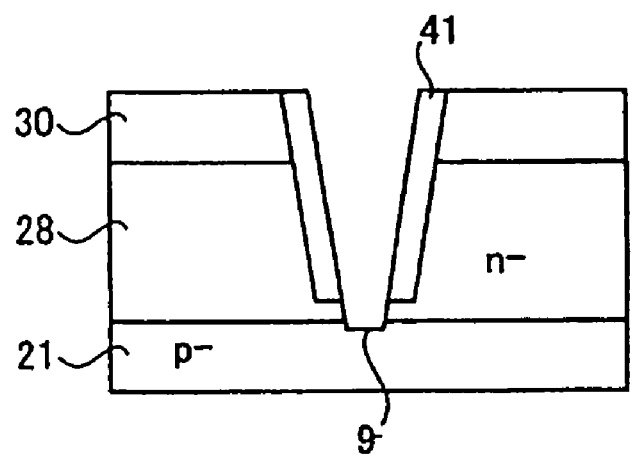
FIG. 63 illustrates a cross sectional structure of the sixth TLPM applicable to the mesh-shaped trench pattern according to the invention in the course of manufacture.
Figure 64:
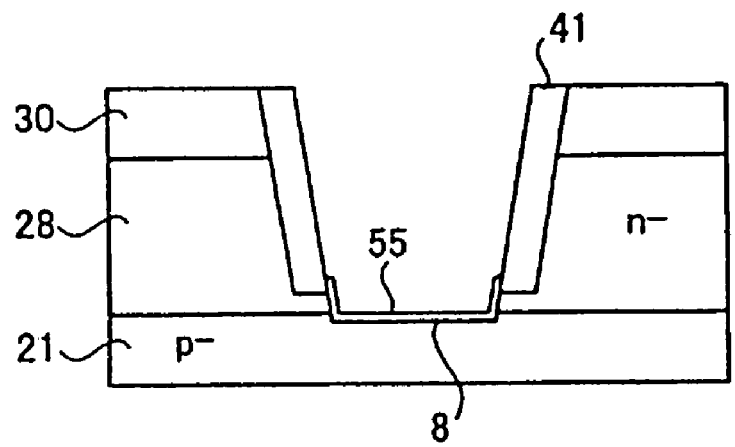
FIG. 64 illustrates a cross sectional structure of the sixth TLPM applicable to the mesh-shaped trench pattern according to the invention in the course of manufacture.
Figure 65:
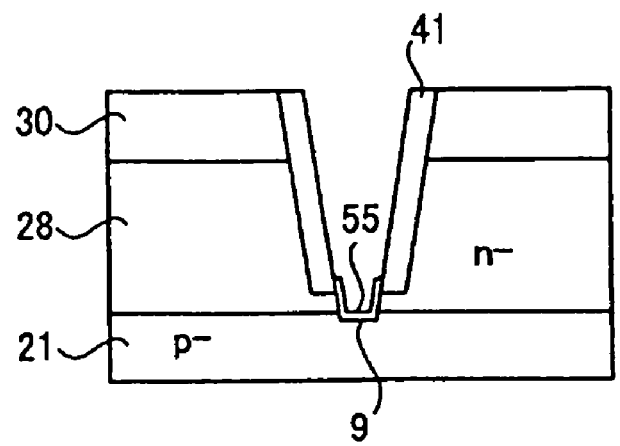
FIG. 65 illustrates a cross sectional structure of the sixth TLPM applicable to the mesh-shaped trench pattern according to the invention in the course of manufacture.

Next, an interlayer insulator film 41 is deposited (FIG. 58: the active region, FIG. 59: the gate region). The interlayer insulator film 41 is then subjected to etching and the interlayer insulator film 41 is left only on the side wall of each of the first and second trench sections (the first step) 8 and 9 (FIG. 60: the active region, FIG. 61: the gate region). Thereafter, with the left interlayer insulator film 41 used as a mask, trench etching is carried out again to form the second steps of the first and second trench sections 8 and 9 (FIG. 62: the active region, FIG. 63: the gate region). Moreover, inside the second step of each of the first and second trench sections 8 and 9, a sacrifice oxide film 55 is formed (FIG. 64: the active region, FIG. 65: the gate region).

Figure 66:
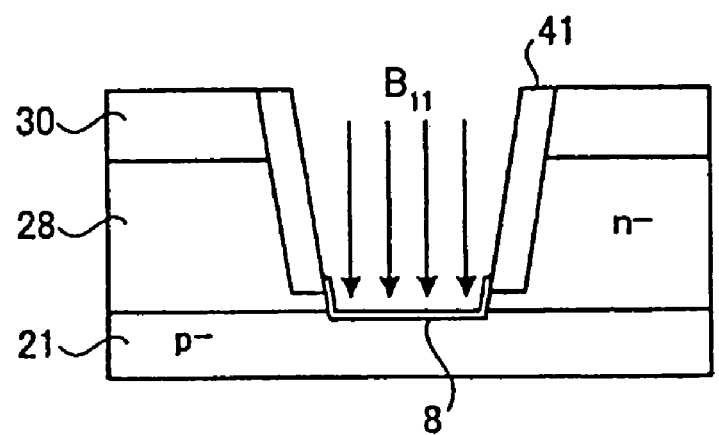
FIG. 66 illustrates a cross sectional structure of the sixth TLPM applicable to the mesh-shaped trench pattern according to the invention in the course of manufacture.
Figure 67:
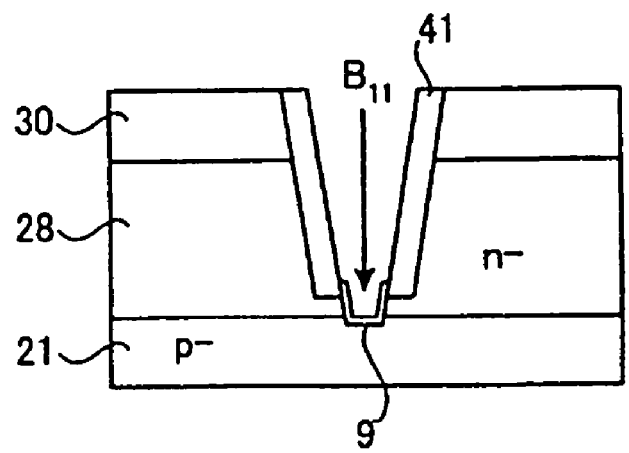
FIG. 67 illustrates a cross sectional structure of the sixth TLPM applicable to the mesh-shaped trench pattern according to the invention in the course of manufacture.
Figure 68:
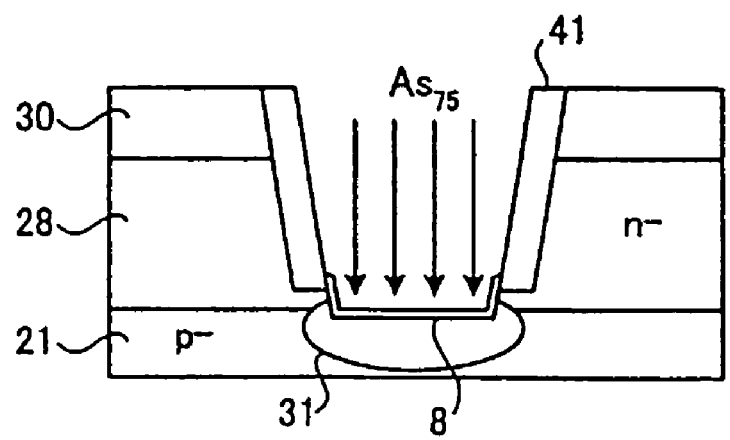
FIG. 68 illustrates a cross sectional structure of the sixth TLPM applicable to the mesh-shaped trench pattern according to the invention in the course of manufacture.
Figure 69:
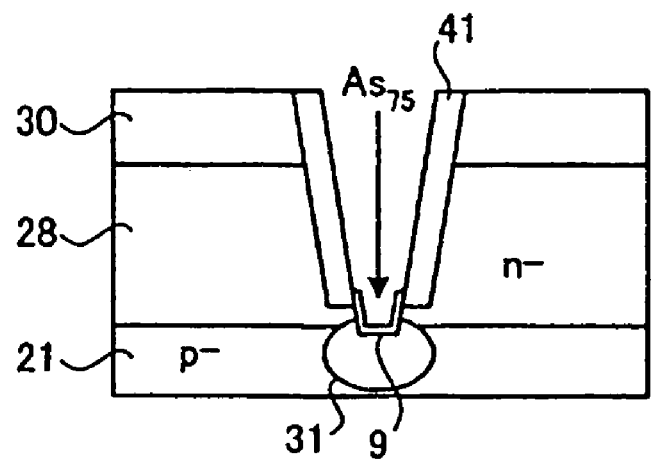
FIG. 69 illustrates a cross sectional structure of the sixth TLPM applicable to the mesh-shaped trench pattern according to the invention in the course of manufacture.
Figure 70:
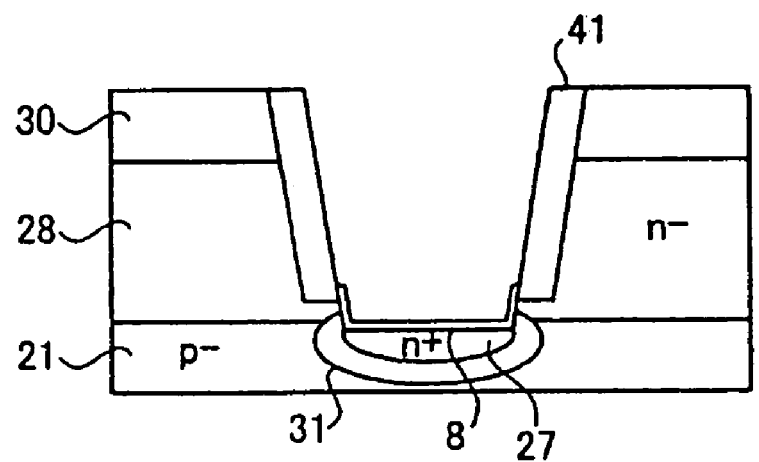
FIG. 70 illustrates a cross sectional structure of the sixth TLPM applicable to the mesh-shaped trench pattern according to the invention in the course of manufacture.
Figure 71:
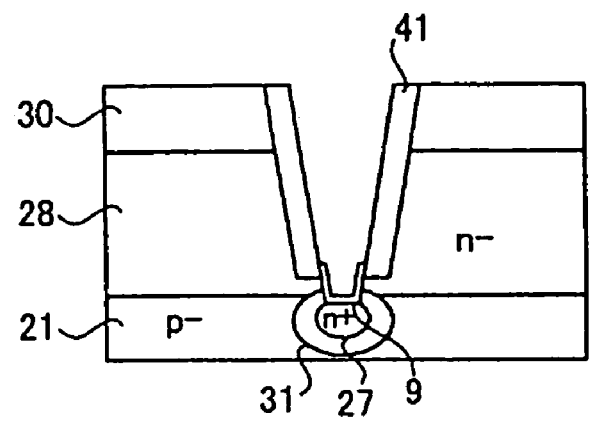
FIG. 71 illustrates a cross sectional structure of the sixth TLPM applicable to the mesh-shaped trench pattern according to the invention in the course of manufacture.

Subsequently, onto each bottom surface of the first and second trench sections 8 and 9, ion implantation is carried out with boron ions, for example, as p-type impurities (FIG. 66: the active region, FIG. 67: the gate region). Following the formation of a p-base region 31, onto each bottom surface of the first and second trench sections 8 and 9, ion implantation is carried out with arsenic ions, for example, as n-type impurities (FIG. 68: the active region, FIG. 69: the gate region). Thus, the n⁺-source region 27 is formed (FIG. 70: the active region, FIG. 71: the gate region).

Then, after the removal of the sacrifice oxide film 55, like in FIG. 41 to FIG. 56 in the above-explained fifth example, the gate insulator film 22 and the gate polysilicon 23 are formed. Furthermore, the interlayer insulator film 24 is formed, a contact hole for the source contact is opened, and the contact hole is filled with the source polysilicon 25. Subsequently, the interlayer insulator film 26 is deposited, contact holes are opened which penetrate through the interlayer insulator film 26 and the mask oxide film 30, and the n⁺-drain regions 29 are formed by ion implantation and diffusion processing. Then, the contact sections 13 and 15, the first electrode (the drain electrode) 14 and the second electrode (the source electrode) 16 are formed to complete the cross sectional arrangements shown in FIG. 18 and FIG. 57.

Figure 72:
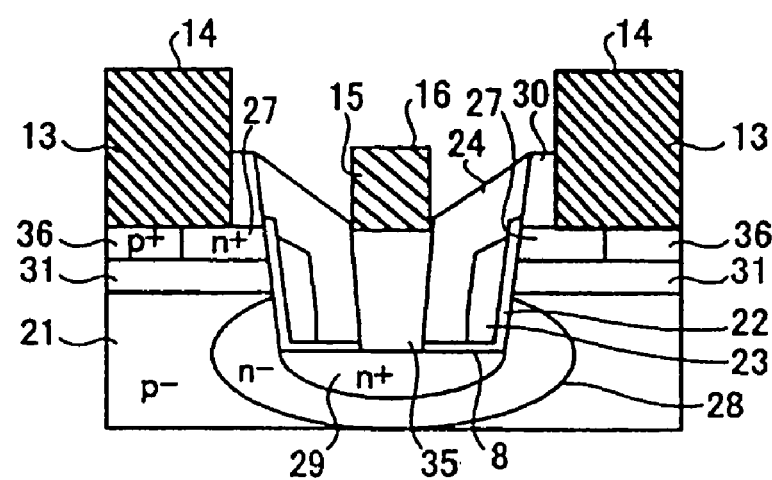
FIG. 72 illustrates a cross sectional structure in an active region of a seventh TLPM applicable to the mesh-shaped trench pattern according to the invention.
Figure 73:
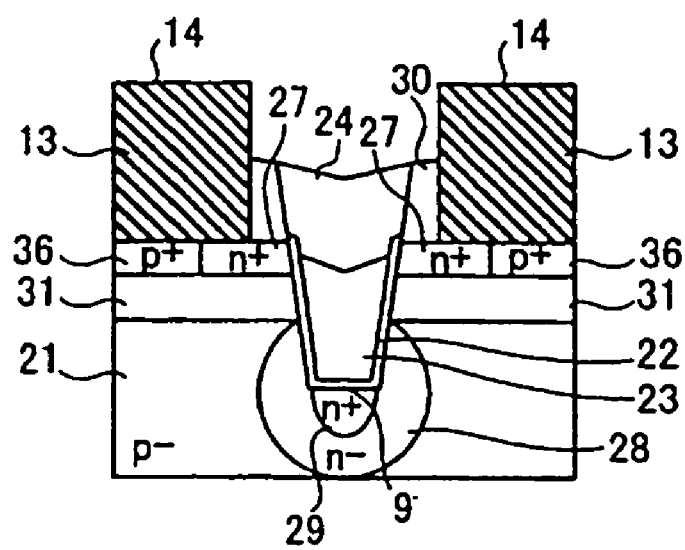
FIG. 73 illustrates a cross sectional structure in a gate region of the seventh TLPM applicable to the mesh-shaped trench pattern according to the invention.

FIGS. 72 and 73 each illustrate a cross sectional structure of a TLPM with a one-step trench structure in which the drain region is presented at the bottom of the trench. FIG. 72 is a cross sectional view in the active region taken along line J–J' of FIG. 24. As shown in FIG. 72, the cross sectional arrangement in the active region in the seventh example is one in which no interlayer insulator film 26 of the uppermost layer is provided in the cross sectional arrangement in the active region in the second example shown in FIG. 15. FIG. 73 is a cross sectional view in the gate region taken along line K–K' of FIG. 24. As shown in FIG. 73, in the gate region, at the bottom of the second trench section 9 formed in the p⁻-semiconductor substrate 21, the n⁺-drain region 29 is provided. Moreover, at the bottom of the second trench section 9, the n⁻-drain region 28 to become an expanded drain region surrounds the n⁺-drain regions 29. The second trench section 9 is filled with the gate polysilicon 23 with the gate insulator film 22 interposed therebetween. On the gate polysilicon 23, there is provided the interlayer insulator film 24.

On the outside of the second trench section 9, there is formed the p-base region 31, on the surface layer of which the n⁺-source region 27 and the p⁺-plug region 36 are formed. On the surfaces of the n⁺-source region 27 and the p⁺-plug region 36, the mask oxide film 30 is provided. The first electrode (the source electrode) 14 is electrically connected to the n⁺-source region 27 and the p⁺-plug region 36 through the contact section 13 penetrating through the mask oxide film 30.

Figure 74:
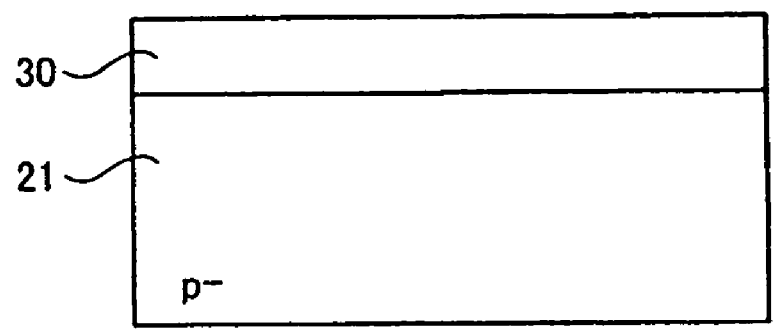
FIG. 74 illustrates a cross sectional structure of the seventh TLPM applicable to the mesh-shaped trench pattern according to the invention in the course of manufacture.
Figure 75:
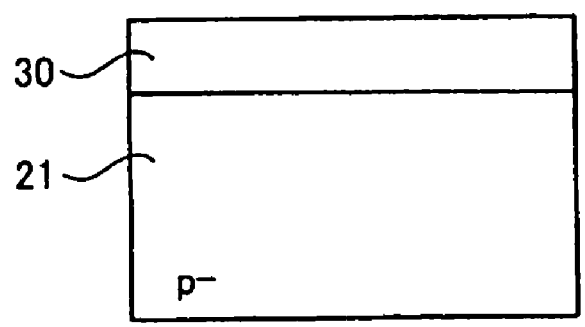
FIG. 75 illustrates a cross sectional structure of the seventh TLPM applicable to the mesh-shaped trench pattern according to the invention in the course of manufacture.
Figure 76:
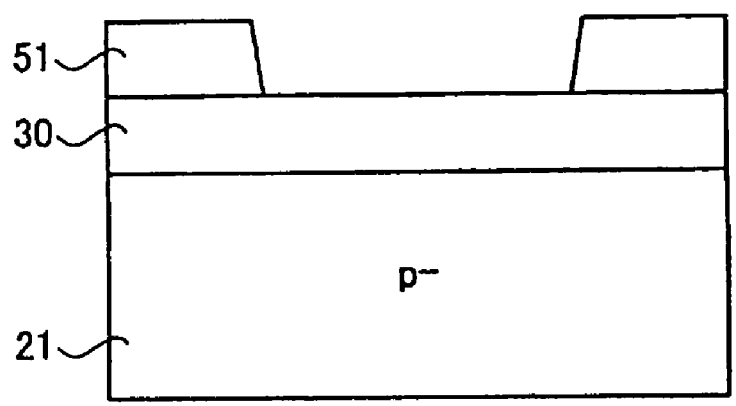
FIG. 76 illustrates a cross sectional structure of the seventh TLPM applicable to the mesh-shaped trench pattern according to the invention in the course of manufacture.
Figure 77:
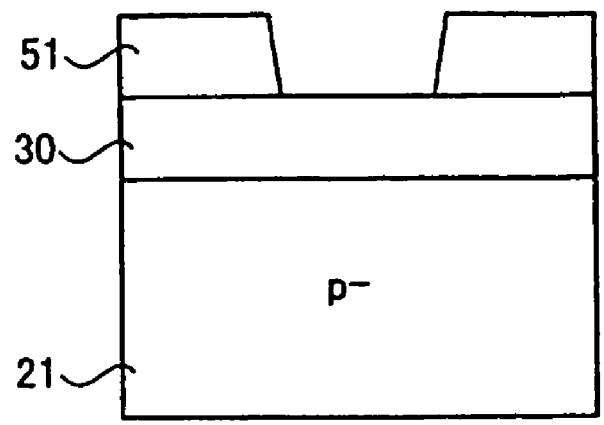
FIG. 77 illustrates a cross sectional structure of the seventh TLPM applicable to the mesh-shaped trench pattern according to the invention in the course of manufacture.
Figure 78:
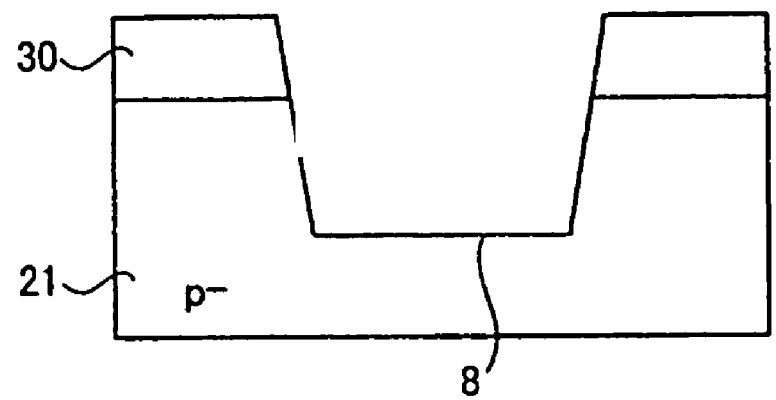
FIG. 78 illustrates a cross sectional structure of the seventh TLPM applicable to the mesh-shaped trench pattern according to the invention in the course of manufacture.
Figure 79:
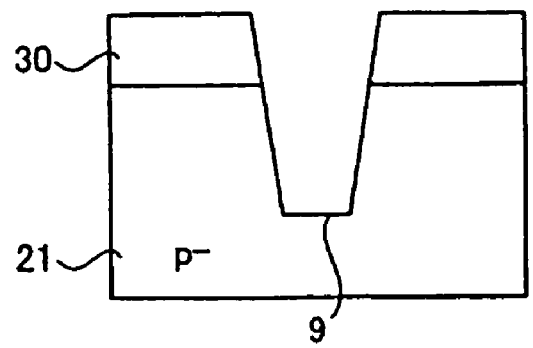
FIG. 79 illustrates a cross sectional structure of the seventh TLPM applicable to the mesh-shaped trench pattern according to the invention in the course of manufacture.
Figure 80:
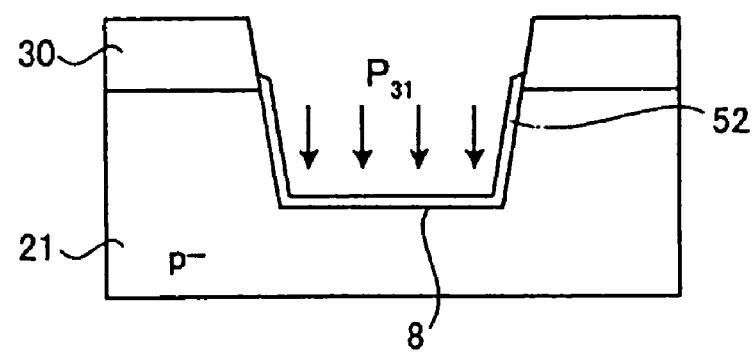
FIG. 80 illustrates a cross sectional structure of the seventh TLPM applicable to the mesh-shaped trench pattern according to the invention in the course of manufacture.
Figure 81:
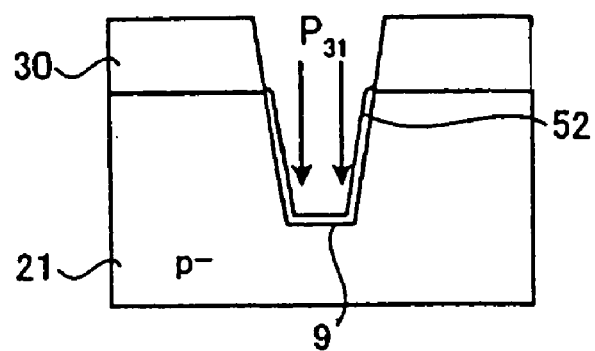
FIG. 81 illustrates a cross sectional structure of the seventh TLPM applicable to the mesh-shaped trench pattern according to the invention in the course of manufacture.

An explanation will be made about a manufacturing process of the TLPM, having cross sectional arrangements shown in FIGS. 72–73, with reference to FIGS. 74–103. First, on the p⁻-semiconductor substrate 21, the mask oxide film 30 is formed (FIG. 74: the active region, FIG. 75: the gate region). Moreover, on the surface of the mask oxide film 30, a resist mask 51 for a mesh pattern is formed (FIG. 76: the active region, FIG. 77: the gate region). Next, in the mask oxide film 30, a mesh-shaped trench pattern shown in FIG. 24, for example, is formed. Using the mask oxide film 30 as a mask, trench etching is carried out to form the first and second trench sections 8 and 9 (FIG. 78: the active region, FIG. 79: the gate region). Then sacrifice oxidation is carried out to form a sacrifice oxide film 52 in the first and second trench sections 8 and 9. After this, onto each bottom surface of the first and second trench sections 8 and 9, ion implantation is carried out with phosphorus ions, for example, as n-type impurities (FIG. 80: the active region, FIG. 81: the gate region).

Figure 82:
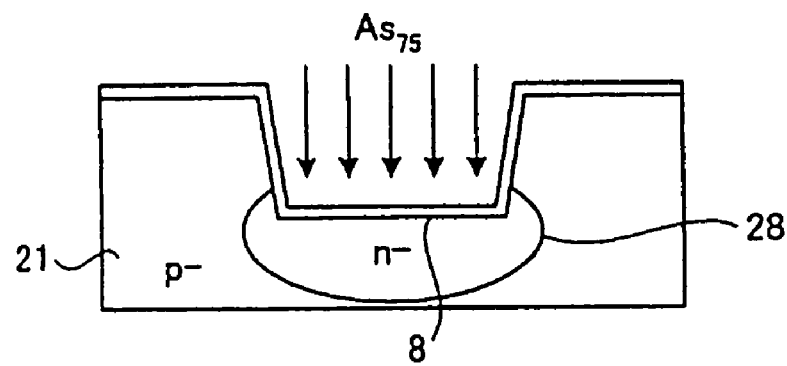
FIG. 82 illustrates a cross sectional structure of the seventh TLPM applicable to the mesh-shaped trench pattern according to the invention in the course of manufacture.
Figure 83:
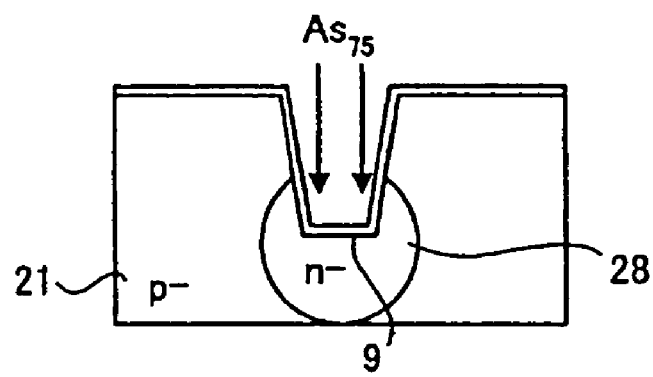
FIG. 83 illustrates a cross sectional structure of the seventh TLPM applicable to the mesh-shaped trench pattern according to the invention in the course of manufacture.
Figure 84:
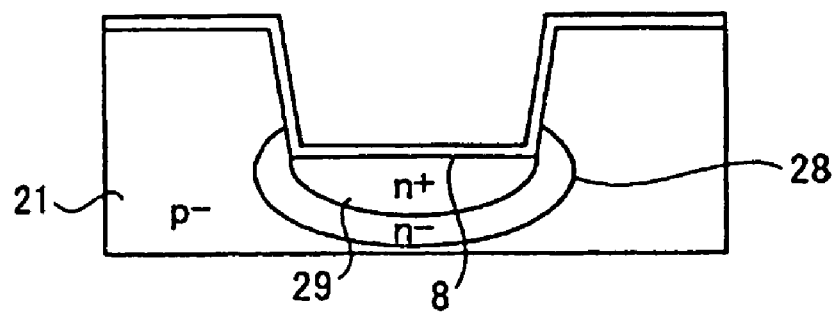
FIG. 84 illustrates a cross sectional structure of the seventh TLPM applicable to the mesh-shaped trench pattern according to the invention in the course of manufacture.
Figure 85:
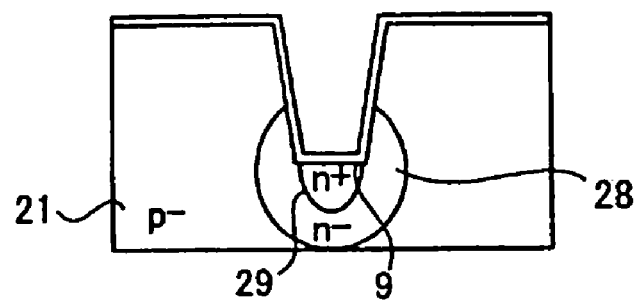
FIG. 85 illustrates a cross sectional structure of the seventh TLPM applicable to the mesh-shaped trench pattern according to the invention in the course of manufacture.
Figure 86:
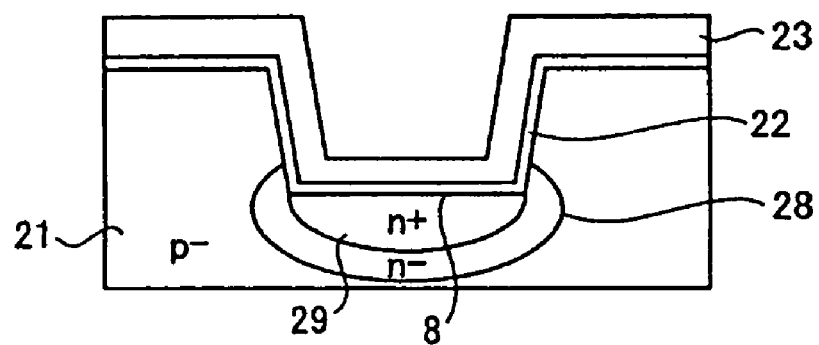
FIG. 86 illustrates a cross sectional structure of the seventh TLPM applicable to the mesh-shaped trench pattern according to the invention in the course of manufacture.
Figure 87:
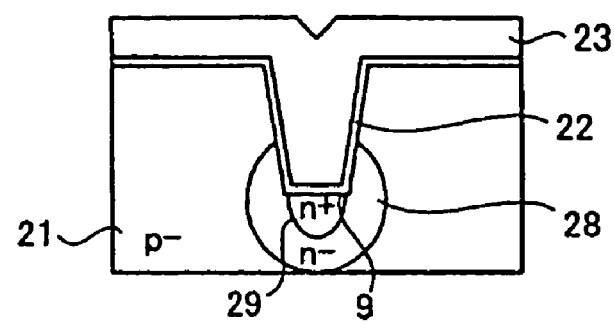
FIG. 87 illustrates a cross sectional structure of the seventh TLPM applicable to the mesh-shaped trench pattern according to the invention in the course of manufacture.
Figure 88:
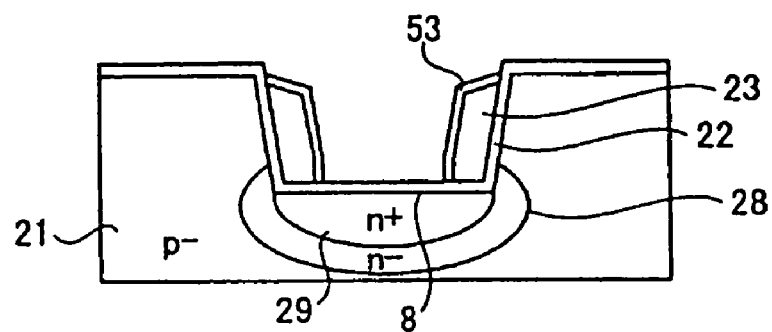
FIG. 88 illustrates a cross sectional structure of the seventh TLPM applicable to the mesh-shaped trench pattern according to the invention in the course of manufacture.
Figure 89:
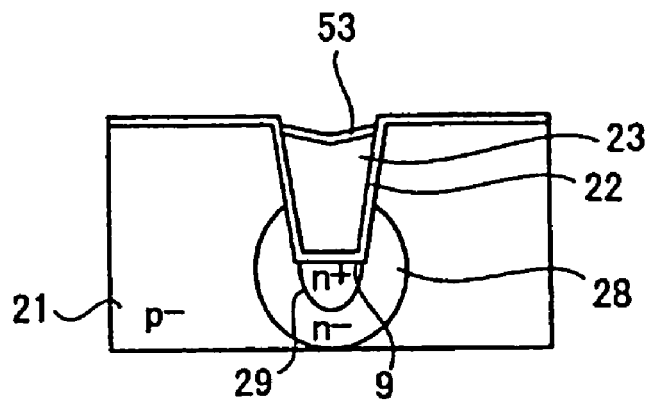
FIG. 89 illustrates a cross sectional structure of the seventh TLPM applicable to the mesh-shaped trench pattern according to the invention in the course of manufacture.

Following the formation of the n-drain region 28, onto each bottom surface of the first and second trench sections 8 and 9, ion implantation is carried out with arsenic ions, for example, as n-type impurities (FIG. 82: the active region, FIG. 83: the gate region). Then, the n⁺-drain region 29 is formed (FIG. 84: the active region, FIG. 85: the gate region). After removal of the sacrifice oxide film 52, the gate insulator film 22 is formed in each of the first and second trench sections 8 and 9, and the gate polysilicon 23 is deposited (FIG. 86: the active region, FIG. 87: the gate region). Then, the gate polysilicon 23 is subjected to etching and then to shadow oxidation to form a shadow oxide film 53 (FIG. 88: the active region, FIG. 89: the gate region). In the active region, the gate polysilicon 23 is left only on the side wall of the first trench section 8. In the gate region, the opening width of the second trench section 9 is narrower than the opening width of the first trench section 8. Thus, the second trench section 9 is completely filled with the gate polysilicon 23.

Figure 90:
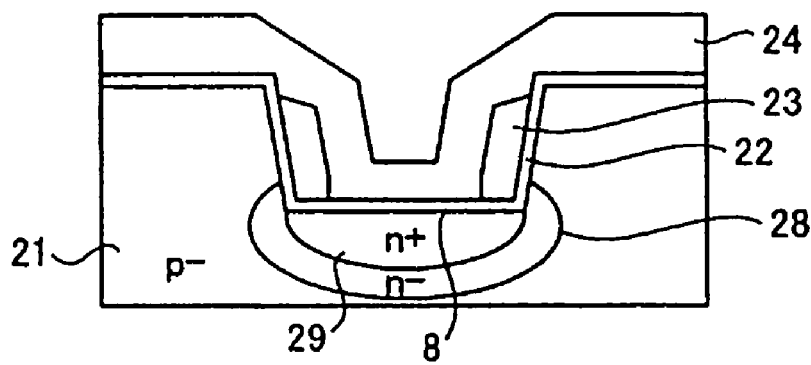
FIG. 90 illustrates a cross sectional structure of the seventh TLPM applicable to the mesh-shaped trench pattern according to the invention in the course of manufacture.
Figure 91:
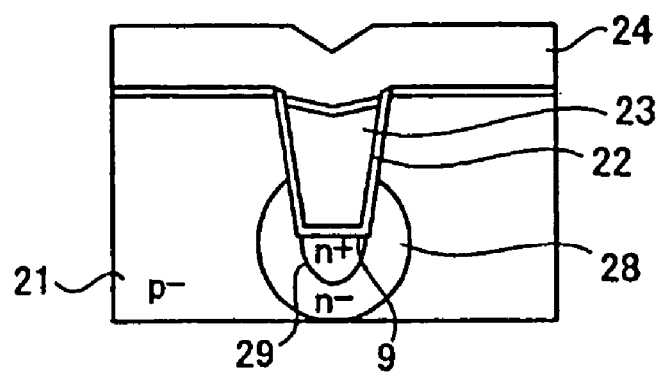
FIG. 91 illustrates a cross sectional structure of the seventh TLPM applicable to the mesh-shaped trench pattern according to the invention in the course of manufacture.
Figure 92:
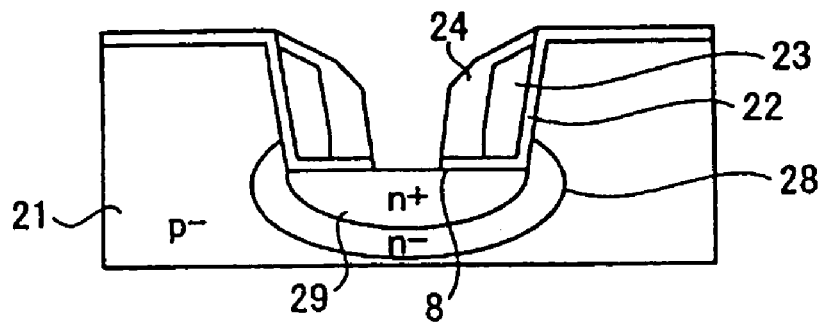
FIG. 92 illustrates a cross sectional structure of the seventh TLPM applicable to the mesh-shaped trench pattern according to the invention in the course of manufacture.
Figure 93:
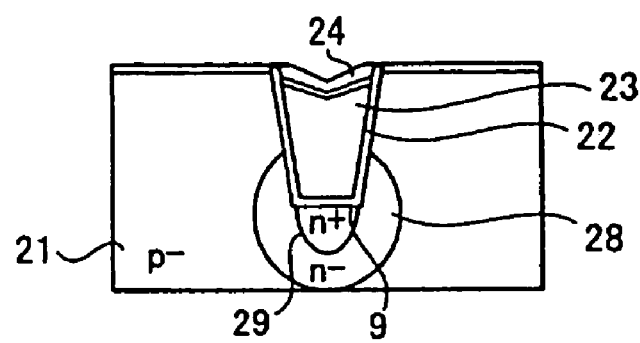
FIG. 93 illustrates a cross sectional structure of the seventh TLPM applicable to the mesh-shaped trench pattern according to the invention in the course of manufacture.
Figure 94:
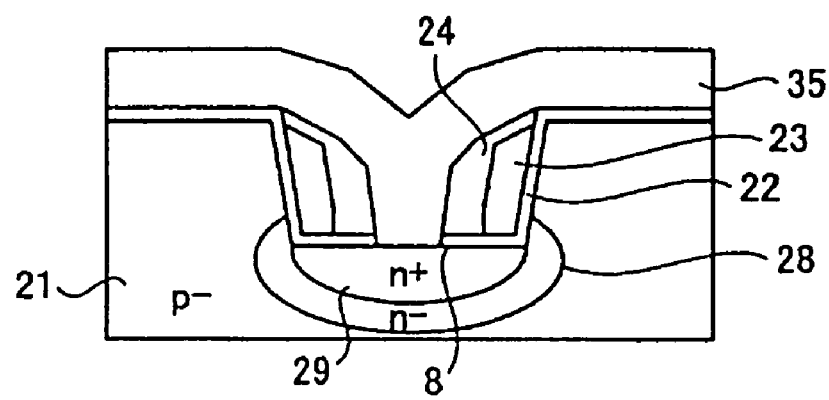
FIG. 94 illustrates a cross sectional structure of the seventh TLPM applicable to the mesh-shaped trench pattern according to the invention in the course of manufacture.
Figure 95:
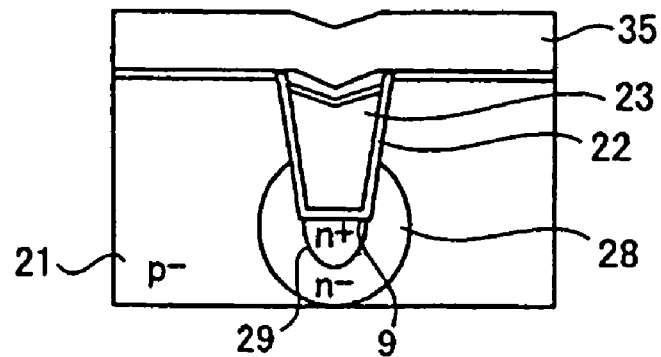
FIG. 95 illustrates a cross sectional structure of the seventh TLPM applicable to the mesh-shaped trench pattern according to the invention in the course of manufacture.
Figure 96:
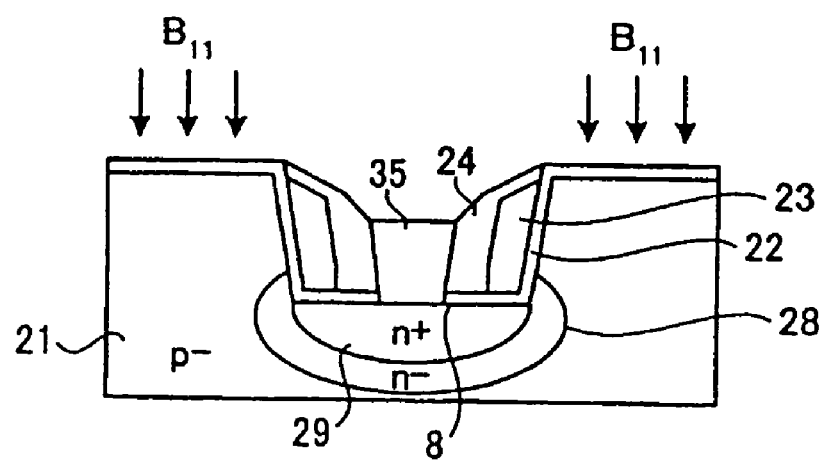
FIG. 96 illustrates a cross sectional structure of the seventh TLPM applicable to the mesh-shaped trench pattern according to the invention in the course of manufacture.
Figure 97:
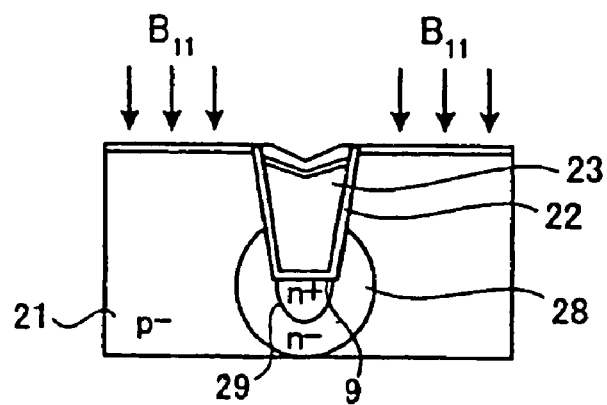
FIG. 97 illustrates a cross sectional structure of the seventh TLPM applicable to the mesh-shaped trench pattern according to the invention in the course of manufacture.

Next, the interlayer insulator film 24 is deposited (FIG. 90: the active region, FIG. 91: the gate region). The interlayer insulator film 24 is then subjected to etching (FIG. 92: the active region, FIG. 93: the gate region). The etching opens a contact hole in the active region at the bottom of the first trench section 8. Moreover, in the gate region, the interlayer insulator film 24 is left on the gate polysilicon 23. Subsequently, a drain polysilicon 35 is deposited (FIG. 94: the active region, FIG. 95: the gate region). The drain polysilicon 35 is subjected to etching. The etching leaves in the active region the drain polysilicon 35 only in the contact hole opened in the first trench section 8. The contact hole is filled with the drain polysilicon 35. In the gate region, no drain polysilicon 35 is left. Subsequently, ion implantation is carried out with boron ions, for example, as p-type impurities (FIG. 96: the active region, FIG. 97: the gate region).

Figure 98:
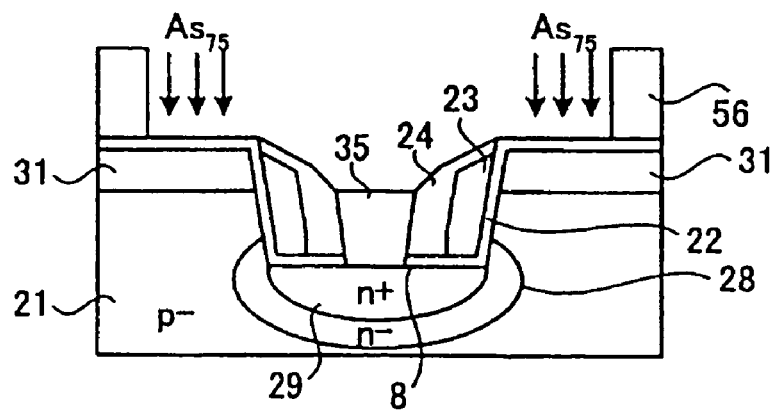
FIG. 98 illustrates a cross sectional structure of the seventh TLPM applicable to the mesh-shaped trench pattern according to the invention in the course of manufacture.
Figure 99:
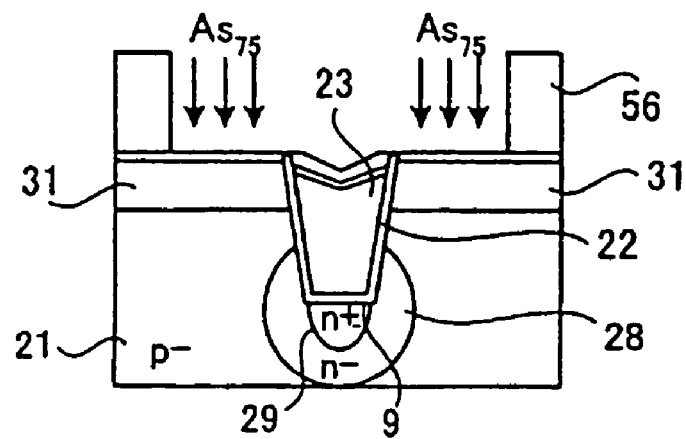
FIG. 99 illustrates a cross sectional structure of the seventh TLPM applicable to the mesh-shaped trench pattern according to the invention in the course of manufacture.
Figure 100:
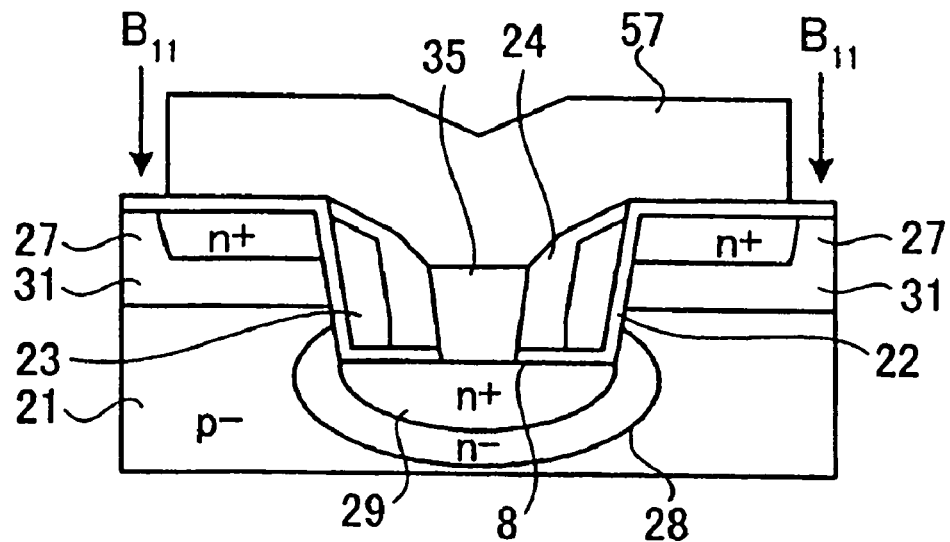
FIG. 100 illustrates a cross sectional structure of the seventh TLPM applicable to the mesh-shaped trench pattern according to the invention in the course of manufacture.
Figure 101:
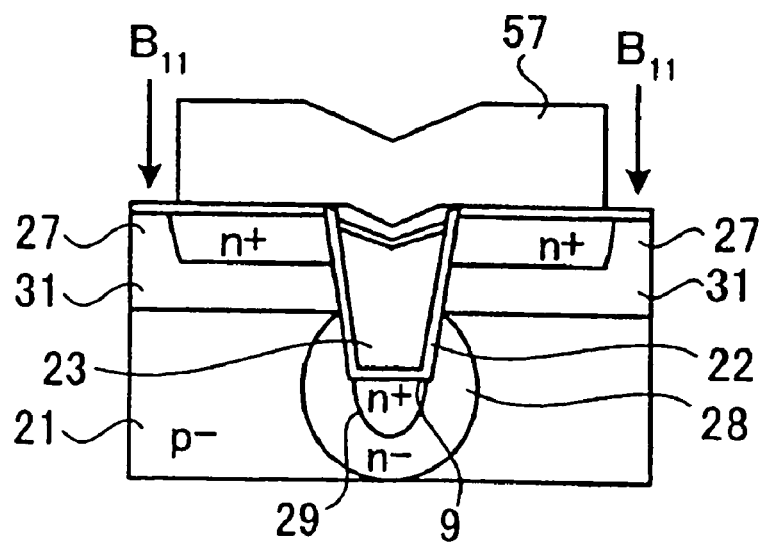
FIG. 101 illustrates a cross sectional structure of the seventh TLPM applicable to the mesh-shaped trench pattern according to the invention in the course of manufacture.

Following the formation of the p-base region 31, a resist mask 56 is formed and, onto the p-base region 31, ion implantation is carried out with arsenic ions, for example, as n-type impurities (FIG. 98: the active region, FIG. 99: the gate region). Then, an $n^+$-source region 27 is formed. Following the formation of the $n^+$-source region 27, a resist mask 57 is formed and ion implantation is carried out with boron ions, for example, as p-type impurities, and thereby $p^+$-plug region 36 is formed (FIG. 100: the active region, FIG. 101: the gate region).

Figure 102:
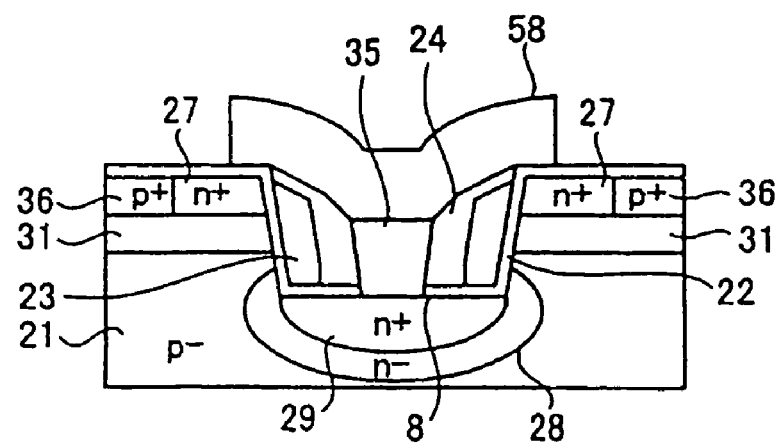
FIG. 102 illustrates a cross sectional structure of the seventh TLPM applicable to the mesh-shaped trench pattern according to the invention in the course of manufacture.
Figure 103:
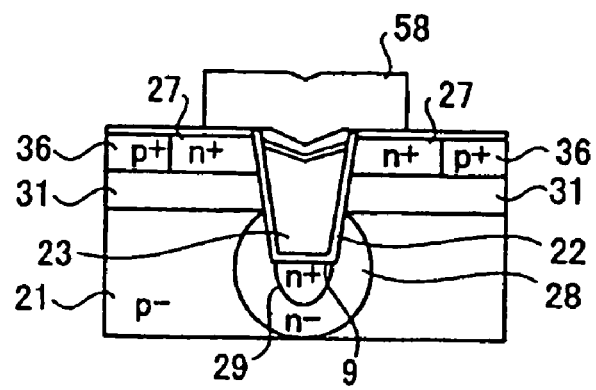
FIG. 103 illustrates a cross sectional structure of the seventh TLPM applicable to the mesh-shaped trench pattern according to the invention in the course of manufacture.

Following the formation of the $p^+$-plug region 36, a resist mask 58 is formed (FIG. 102: the active region, FIG. 103: the gate region). Then, etching is carried out to bring the $n^+$-source region 27 and the $p^+$-plug region 36 to be exposed. After removal of the resist mask 58, by depositing metal interconnection layer and patterning the layer, the contact sections 13 and 15, the first electrode (the source electrode) 14 and the second electrode (the drain electrode) 16 are formed to complete the cross sectional arrangements shown in FIGS. 72 and 73.

Figure 104:
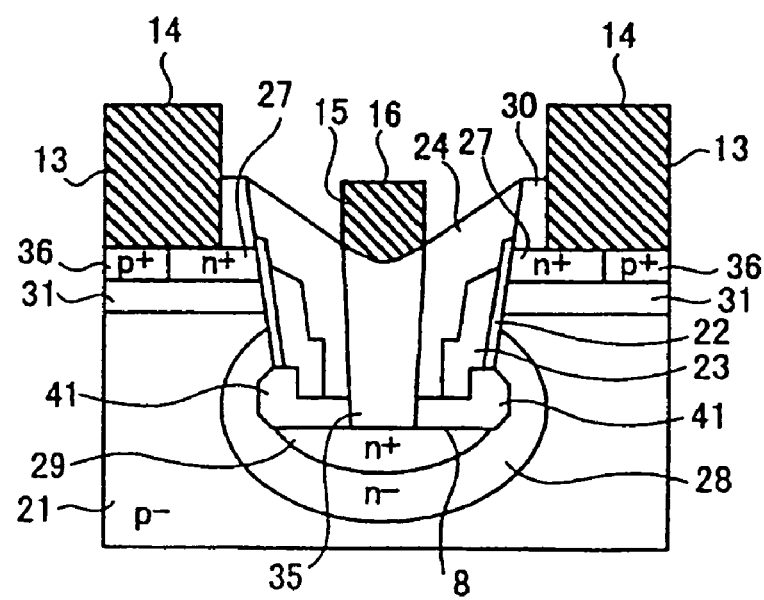
FIG. 104 illustrates a cross sectional structure in an active region of an eighth TLPM applicable to the mesh-shaped trench pattern according to the invention.
Figure 105:
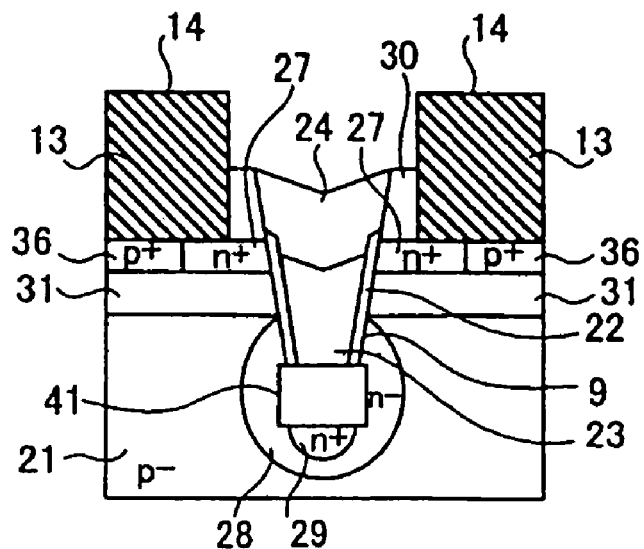
FIG. 105 illustrates a cross sectional structure in a gate region of the eighth TLPM applicable to the mesh-shaped trench pattern according to the invention.

FIGS. 104 and 105 each illustrate a cross sectional structure of a TLPM with a two-step trench structure in which the drain region is presented on the bottom of the trench. The cross sectional arrangement in the active region taken along line J-J' of FIG. 24 is an arrangement in which, in the arrangement shown in FIG. 72, from the lower half section to the bottom of the first trench section 8, an interlayer insulator film 41 thicker than the gate insulator film 22 is provided. Moreover, the cross sectional arrangement in the active region taken along line K–K' of FIG. 24 is an arrangement in which, in the arrangement shown in FIG. 73, at the bottom of the second trench section 9, the interlayer insulator film 41 thicker than the gate insulator film 22 is provided.

Figure 106:
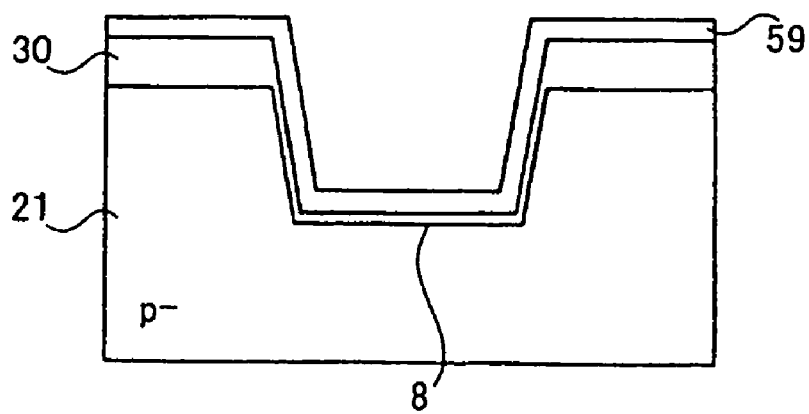
FIG. 106 illustrates a cross sectional structure of the eighth TLPM applicable to the mesh-shaped trench pattern according to the invention in the course of manufacture.
Figure 107:
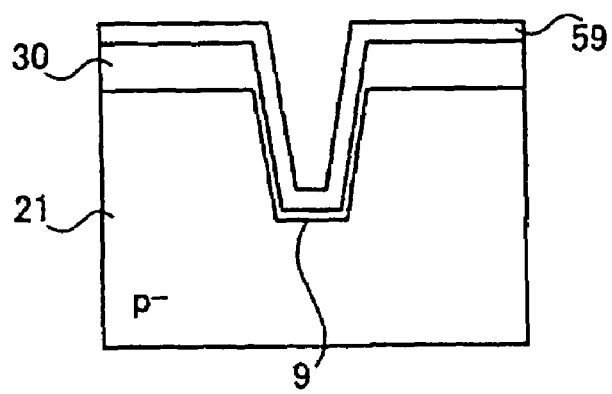
FIG. 107 illustrates a cross sectional structure of the eighth TLPM applicable to the mesh-shaped trench pattern according to the invention in the course of manufacture.
Figure 108:
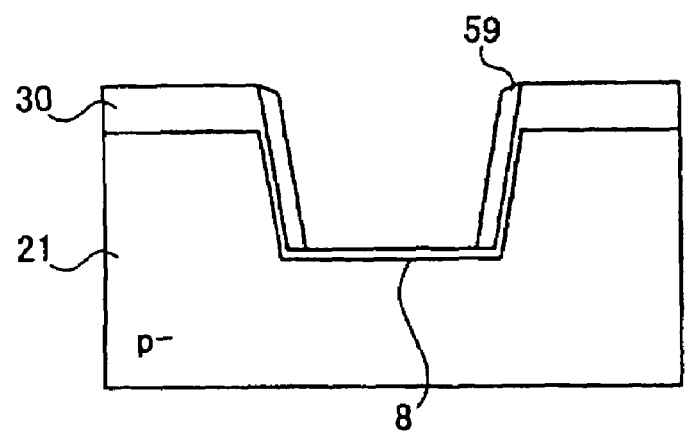
FIG. 108 illustrates a cross sectional structure of the eighth TLPM applicable to the mesh-shaped trench pattern according to the invention in the course of manufacture.
Figure 109:
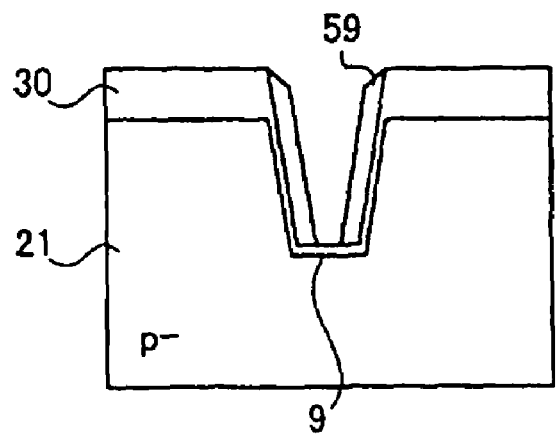
FIG. 109 illustrates a cross sectional structure of the eighth TLPM applicable to the mesh-shaped trench pattern according to the invention in the course of manufacture.
Figure 110:
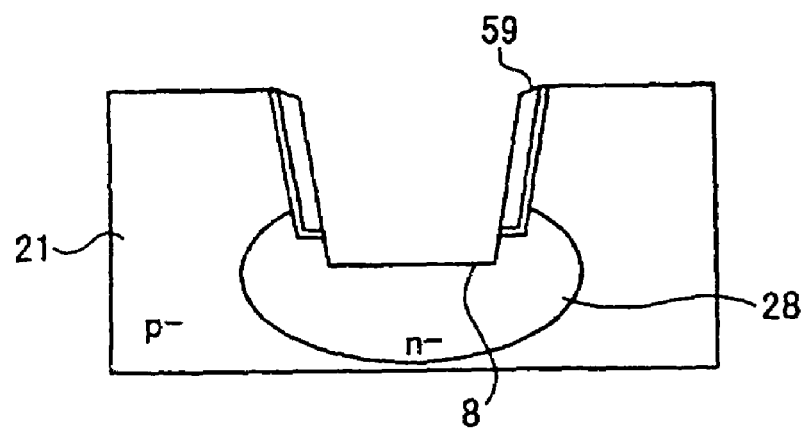
FIG. 110 illustrates a cross sectional structure of the eighth TLPM applicable to the mesh-shaped trench pattern according to the invention in the course of manufacture.
Figure 111:
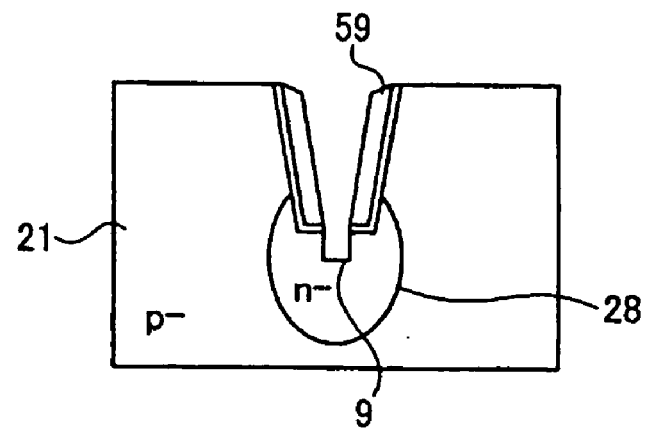
FIG. 111 illustrates a cross sectional structure of the eighth TLPM applicable to the mesh-shaped trench pattern according to the invention in the course of manufacture.

An explanation will be made about a manufacturing process of the TLPM, having cross sectional arrangements shown in FIGS. 104–105, with reference to FIGS. 106–125. First, like in the above-explained seventh example, on the surface of the $p^-$-semiconductor substrate 21, the mask oxide film 30 is formed. Moreover, the first and second trench sections (the first step) 8 and 9 are formed, inside which a sacrifice oxide film 52 is formed. After this, onto each bottom surface of the first and second trench sections 8 and 9 (the first step), ion implantation is carried out with phosphorus ions, for example, as n-type impurities (FIG. 74 to FIG. 81). Subsequently, after carrying out sacrifice oxidation of the inside of each of the first and second trench sections (the first step) 8 and 9, a nitride film 59 is deposited (FIG. 106: the active region, FIG. 107: the gate region). The nitride film 59 is subjected to etching to be left only on each side wall of the first and second trench sections (the first step) 8 and 9 (FIG. 108: the active region, FIG. 109: the gate region). Then, with the left nitride film 59 used as a mask, the trench etching is carried out again to form the second step of each of the first and second trench sections 8 and 9. Moreover, with the previously ion-implanted phosphorus, the $n^-$-drain region 28 is formed (FIG. 110: the active region, FIG. 111: the gate region).

Figure 112:
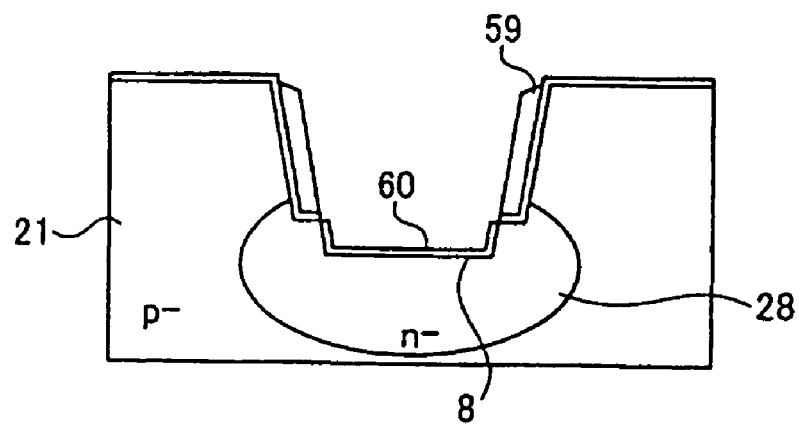
FIG. 112 illustrates a cross sectional structure of the eighth TLPM applicable to the mesh-shaped trench pattern according to the invention in the course of manufacture.
Figure 113:
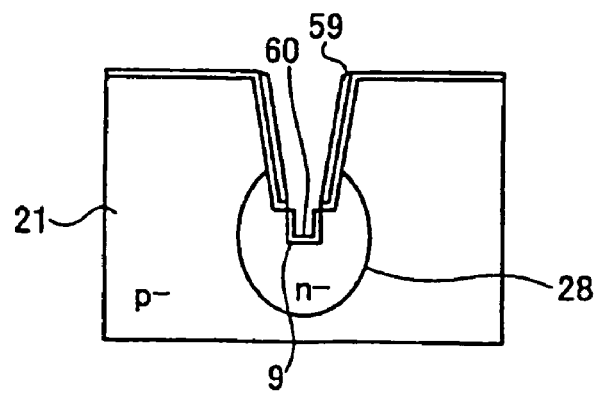
FIG. 113 illustrates a cross sectional structure of the eighth TLPM applicable to the mesh-shaped trench pattern according to the invention in the course of manufacture.
Figure 114:
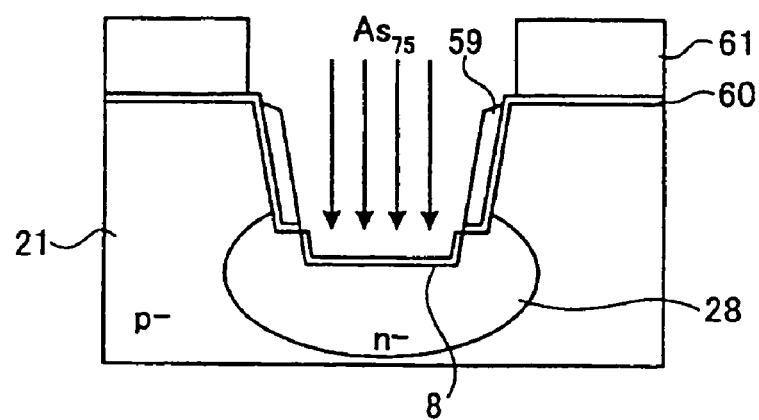
FIG. 114 illustrates a cross sectional structure of the eighth TLPM applicable to the mesh-shaped trench pattern according to the invention in the course of manufacture.
Figure 115:
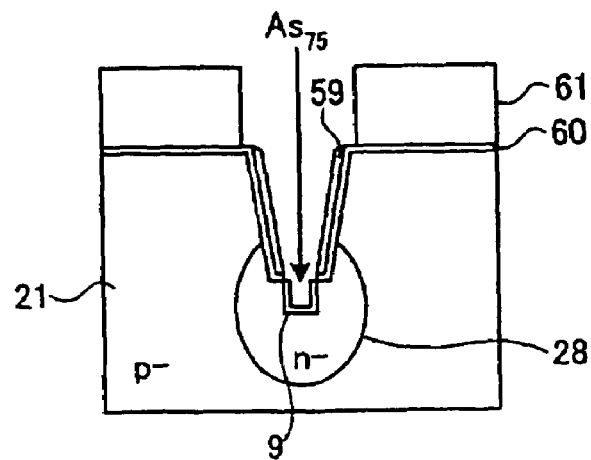
FIG. 115 illustrates a cross sectional structure of the eighth TLPM applicable to the mesh-shaped trench pattern according to the invention in the course of manufacture.
Figure 116:
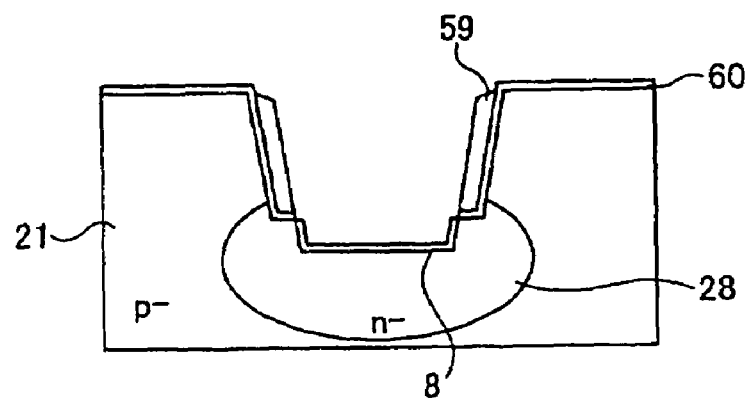
FIG. 116 illustrates a cross sectional structure of the eighth TLPM applicable to the mesh-shaped trench pattern according to the invention in the course of manufacture.
Figure 117:
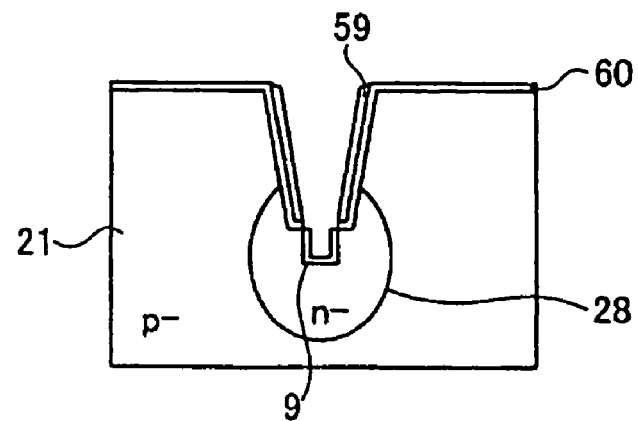
FIG. 117 illustrates a cross sectional structure of the eighth TLPM applicable to the mesh-shaped trench pattern according to the invention in the course of manufacture.

Next, on the bottom surface of the second step of each of the first and second trench sections 8 and 9, and on the surface of the $p^-$-semiconductor substrate 21, a sacrifice oxide film 60 is formed (FIG. 112: the active region, FIG. 113: the gate region). With a resist mask 61 formed which covers the substrate surface, onto each bottom surface of the first and second trench sections 8 and 9, ion implantation is carried out with arsenic ions, for example, as n-type impurities (FIG. 114: the active region, FIG. 115: the gate region).

Figure 118:
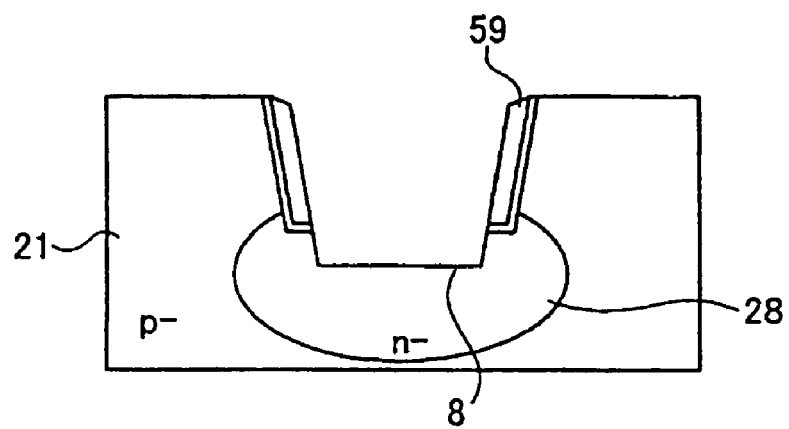
FIG. 118 illustrates a cross sectional structure of the eighth TLPM applicable to the mesh-shaped trench pattern according to the invention in the course of manufacture.
Figure 119:
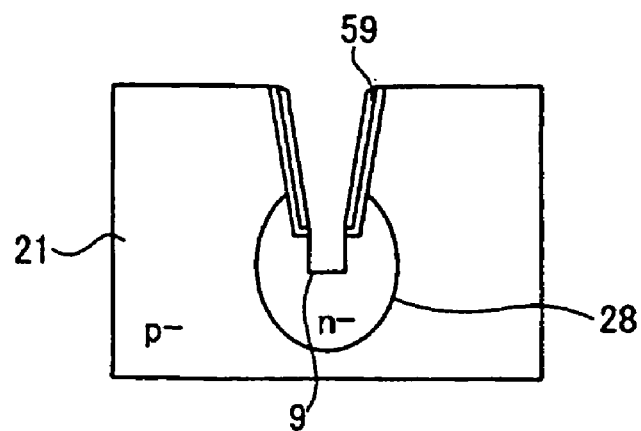
FIG. 119 illustrates a cross sectional structure of the eighth TLPM applicable to the mesh-shaped trench pattern according to the invention in the course of manufacture.
Figure 120:
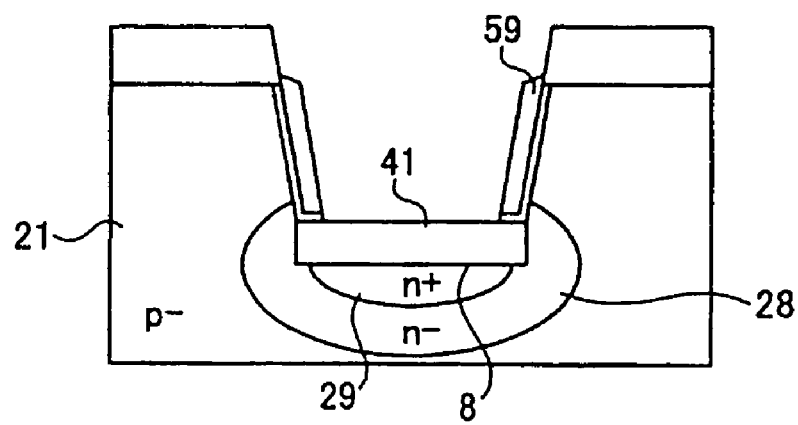
Figure 121:
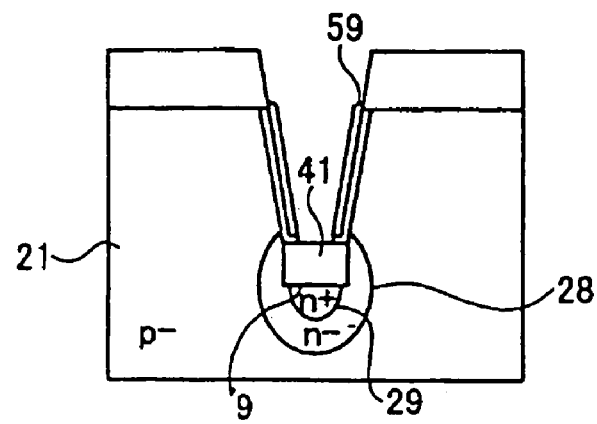
Figure 122:
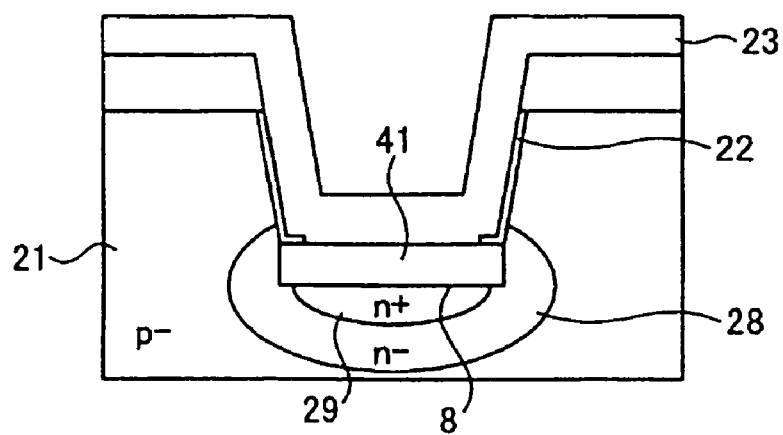
Figure 123:
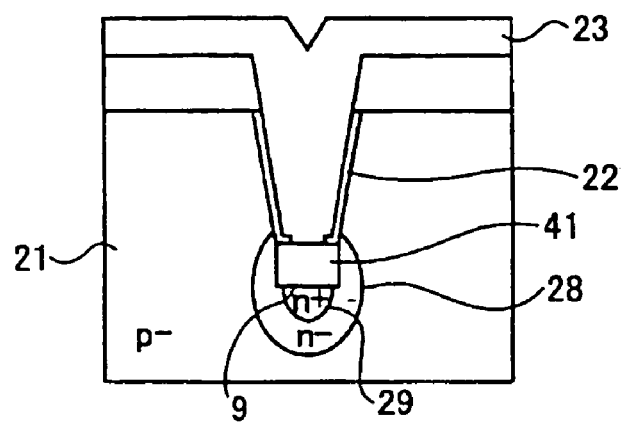

Then, the resist mask 61 is removed (FIG. 116: the active region, FIG. 117: the gate region) and the sacrifice oxide film 60 is removed (FIG. 118: the active region, FIG. 119: the gate region). Subsequently, the interlayer insulator film 41 is formed on the bottom in each of the first and second trench sections 8 and 9. At this time, the previously ion-implanted arsenic diffuses to form the $n^+$-drain region 29 (FIG. 120: the active region, FIG. 121: the gate region). After the nitride film 59 is removed, the gate insulator film 22 is formed on the side wall of each of the first and second trench sections 8 and 9, and the gate polysilicon 23 is deposited (FIG. 122: the active region, FIG. 123: the gate region).

Figure 124:
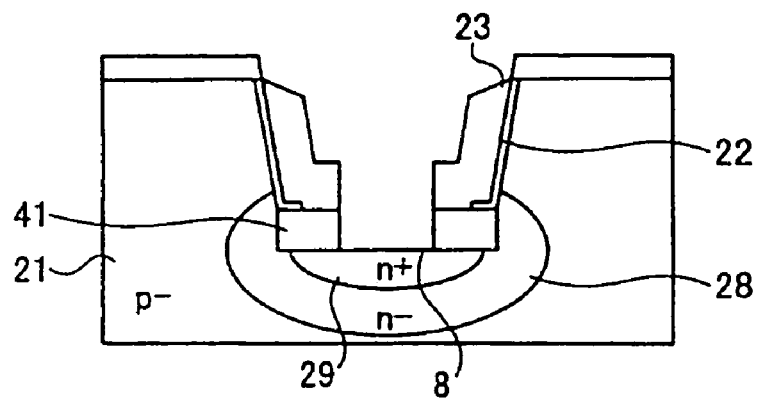
Figure 125:
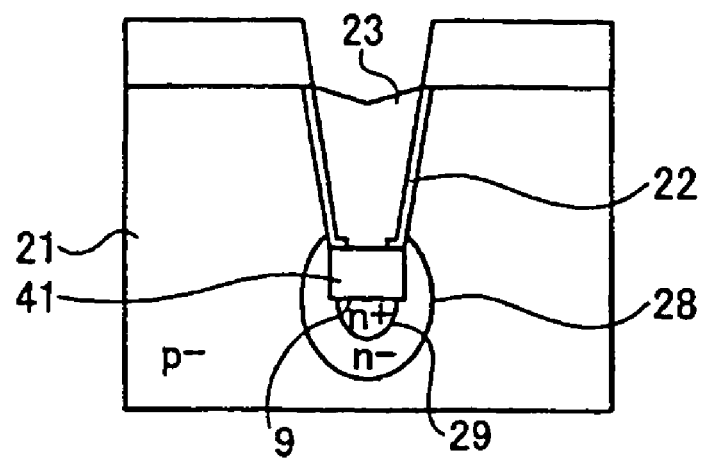

Thereafter, the gate polysilicon 23 is subjected to etching (FIG. 124: the active region, FIG. 125: the gate region). In the active region, the gate polysilicon 23 is left only on the side wall of the first trench 8 on the interlayer insulator film 41. In the gate region, the opening width of the second trench section 9 is narrower than the opening width of the first trench section 8. Thus, the second trench section 9 is completely filled with the gate polysilicon 23.

Then, like in FIGS. 90–103, the interlayer insulator film 24 is formed, a contact hole is opened for the drain contact, and the contact hole is filled with the drain polysilicon 35. Subsequently, the p-base region 31, the $n^+$-source region 27 and the $p^+$-plug region 36 are formed. Furthermore, by depositing metal interconnection layer and patterning the layer, the contact sections 13 and 15, the first electrode (the source electrode) 14 and the second electrode (the drain electrode) 16 are formed to complete the cross sectional arrangements shown in FIGS. 104–105.

As explained above in detail, according to the embodiment of FIG. 12, presence of the source region (or the drain region) as the first diffusion region not only at the bottom of the trench as the active region but also at the bottom of the trench as the gate region increases an amount of a current passing around to the trench side in the gate region. Therefore, sufficiently low on-resistance can be provided.

In the foregoing, the invention can be variously modified without being limited to the above-explained embodiments. For example, the non-trench region 2 can be a quadrilateral other than a rectangle, or a polygon, etc., with the number of sides equal to or more than that of a pentagon. Moreover, the cross sectional structure of the TLPM is not limited to those with arrangements shown in FIGS. 12–23. The arrangement can be provided as one in which, for example, in a TLPM with presence of a source region at the bottom of the trench, the $n^+$-source region 27 and the p-base region 31 are provided at the bottom of each of the trench sections 9 and 7 respectively in the first and second gate regions. Furthermore, an arrangement can be also provided in which, in a TLPM with presence of a drain region at the bottom of the trench, the $n^+$-drain region 29 and the p-base region 31 are provided at the bottom of each of the trench sections 9 and 7 respectively in the first and second gate regions.

In addition, the present invention can be provided with an arrangement in which a p- and n-conductivity types can be reversed. Moreover, the embodiments of FIGS. 1–11, and 24 can be combined to form additional embodiments to further lower the on-resistance. Furthermore, the invention, without being limited to the power MISFET such as the TLPM, can be applied to other power semiconductor devices including insulated gate bipolar transistors (IGBT).

According to the present invention, in the non-trench region, the contact section can be made to have the same size as that of the contact section in the case in which the non-trench region is not divided into smaller regions by the third trench section. This can inhibit an increase in contact resistance and further prevent occurrence of failure in continuity due to failure in contact hole opening. Therefore, low on-resistance due to miniaturization of the trench can be provided while high conductivity of the contact section between the semiconductor and the electrode being secured.

According to the invention, presence of the first diffusion region, not only at the bottom of the first trench section in the active region but also at the bottom of the second trench section intersecting the trench in the active region, increases an amount of a current passing around to the second trench side. Therefore, it is possible to provide sufficiently low on-resistance.

Given the disclosure of the present invention, one versed in the art would appreciate that there may be other embodiments and modifications within the scope and spirit of the present invention. Accordingly, all modifications and equivalents attainable by one versed in the art from the present disclosure within the scope and spirit of the present invention are to be included as further embodiments of the present invention. The scope of the present invention accordingly is to be defined as set forth in the appended claims.

The disclosures of the priority applications JP 2002-340186 and JP 2003-176327 in their entirety, including the drawings, claims, and the specification thereof, are incorporated herein by reference.

What is claimed is:

1. A semiconductor device comprising:
a semiconductor substrate;
a trench formed in the substrate;
at least one non-trench region surrounded by the trench;
a plurality of active regions formed on the substrate over the trench, each for driving current as a semiconductor element;
a first diffusion region formed at a bottom of the trench in the active regions; and
a second diffusion region formed in the non-trench region,
wherein current is flowable between the first diffusion region and the second diffusion region,
wherein the trench comprises a plurality of first trench sections formed in the active regions, and a plurality of second trench sections intersecting the first trench sections to form a mesh pattern surrounding the non-trench region,
wherein the first diffusion region is formed at the bottom of the first trench sections, and
wherein the trench further includes at least one third trench section connected to the first or second trench sections or both the first and second trench sections to divide the non-trench region into a plurality of smaller regions,
wherein a first conductor is formed with an insulator film interposed therebetween in the first, second, and third trench sections, and
wherein the width of each of the second and third trench sections is smaller than the width of each of the first trench sections.

2. The semiconductor device as claimed in claim 1, further including:
an electrode electrically connected to the second diffusion region; and
a contact section electrically connected to the second diffusion region and the electrode,
wherein the contact section is disposed over and contacting all of the smaller regions in the non-trench region.

3. The semiconductor device as claimed in claim 1, wherein the third trench section extends parallel to the first trench sections.

4. The semiconductor device as claimed in claim 1, wherein the third trench section extends parallel to the second trench sections.

5. The semiconductor device as claimed in claim 1, wherein the third trench section extends diagonally to both the first and second trench sections.

6. The semiconductor device as claimed in claim 1, wherein the third trench section comprises a combination of two or three subsections, each of which extends parallel to the first trench sections, parallel to the second trench sections, or diagonally to both the first and second trench sections.

7. A semiconductor device comprising:
a semiconductor substrate;
a trench formed in the substrate;
at least one non-trench region surrounded by the trench;
an active region formed on the substrate over the trench for driving current as a semiconductor element;
a first diffusion region formed at a bottom of the trench in the active region; and
a second diffusion region formed in the non-trench region,
wherein current is flowable between the first diffusion region and the second diffusion region,
wherein the trench composes a first trench section formed in the active region, and a second trench section intersecting the first trench section to form a mesh pattern surrounding the non-trench region,
wherein the first diffusion region is formed at the bottom of the first trench section, and
wherein the semiconductor device is a trench lateral transistor composed of at least the semiconductor substrate, the first and second diffusion regions, the first diffusion region driving current as a transistor, a gate insulator film formed inside the trench, a first conductor formed inside the gate insulator film, a second conductor formed inside the first conductor in the active region with an interlayer insulator film interposed therebetween and electrically connected to the first diffusion region, a first electrode penetrating through tie interlayer insulator film electrically connected to the second diffusion region, and a second electrode penetrating through the interlayer insulator film to electrically connect to the second conductor.

8. The semiconductor device as claimed in claim 1, wherein the second diffusion region is a drain region and the first diffusion region is a source region.

9. The semiconductor device as claimed in claim 1, wherein the second diffusion region is a source region and the first diffusion region as a drain region.

10. The semiconductor device as claimed in claim 1, further including at first electrode electrically connected to the second diffusion region, wherein the inside of the third trench section is filled with the first conductor a with gate insulator film interposed therebetween, and the first conductor in the third trench section and the first electrode are insulated from each other by an interlayer insulator film.

11. The semiconductor device as claimed in claim 1, wherein an interlayer insulator film thicker than the gate insulator film is provided along a part of a side section of the first trench sections.

12. The semiconductor device as claimed in claim 1, further including an interlayer insulator film thicker than the insulator film in each of the first trench sections and the second trench sections on each side section of the first trench sections and on each side section or at a bottom of the second trench sections.

13. A method of manufacturing a semiconductor device comprising a semiconductor substrate, a trench formed in the substrate, plurality of active regions formed on the substrate over the trench, each for driving current as a semiconductor element, at least one non-trench region surrounded by the trench, a first diffusion region formed on the trench, and a second diffusion region formed in the non-trench region, wherein current is flowable between the first diffusion region and the second diffusion region, wherein the trench comprises a plurality of first trench sections formed in the active regions and a plurality of second trench sections intersecting the first trench section to form a mesh pattern surrounding the non-trench region, wherein the trench further includes at least one third trench section connected to the first or second trench sections or both the first and second trench sections to divide the non-trench region into a plurality of smaller regions, wherein a first conductor is formed with an insulator film interposed therebetween in the first, second, and third trench sections, and wherein the width of each of the second and third trench sections is smaller than the width of each of the first trench sections, the method comprising the steps of:

forming the first and second trench sections on the semiconductor substrate;

forming the first diffusion region on each of the bottom of the first trench sections;

filling the first trench and the second trench; and forming the second diffusion region in the non-trench region.

14. A semiconductor device comprising:

a semiconductor substrate;

a trench formed in the substrate;

at least one non-trench region surrounded by the trench;

a plurality of active regions formed on the substrate over the trench, each for driving current as a semiconductor element; and a first diffusion region and a second diffusion formed at a bottom of the trench in the active regions, wherein current is flowable between the first diffusion region and the second diffusion region, wherein the trench comprises a plurality of first trench sections formed in the active regions, and a plurality of second trench sections intersecting the first trench sections to form a mesh pattern surrounding the non-trench region, wherein the first and second diffusion regions are formed at the bottom of the first and second trench sections, respectively, wherein a first conductor is formed with an insulator film interposed therebetween in the first and second trench sections, and wherein the width of each of the second trench sections is smaller than the width of each of the first trench sections.

15. The semiconductor device as claimed in claim 1, further including a second conductor electrically connected to the first diffusion region with an interlayer insulator film interposed therebetween inside the first conductor in the first trench sections.

16. The semiconductor device as claimed in claim 14, further including a second conductor electrically connected to the first diffusion region with an interlayer insulator film interposed therebetween inside the first conductor in the first trench sections.

17. The semiconductor device as claimed in claim 14, wherein the second diffusion region is a drain region and the first diffusion region is a source region.

18. The semiconductor device as claimed in claim 14, wherein the second diffusion region is a source region and the first diffusion region is a drain region.

19. The semiconductor device as claimed in claim 14, further including an interlayer insulator film thicker than the insulator film in each of the first trench sections and the second trench sections on each side section of the first trench sections and on each side section or at a bottom of the second trench sections.

* * * * *